United States Patent
Hamilton et al.

(10) Patent No.: US 10,637,479 B2
(45) Date of Patent: Apr. 28, 2020

(54) SUPERCONDUCTING CIRCUIT DEVICE AND APPLICATIONS OF SAME

(71) Applicant: AUBURN UNIVERSITY, Auburn, AL (US)

(72) Inventors: Michael C. Hamilton, Auburn, AL (US); Uday S. Goteti, Auburn, AL (US)

(73) Assignee: AUBURN UNIVERSITY, Auburn, AL (US)

(*) Notice: Subject to any disclaimer, the term of this patent is extended or adjusted under 35 U.S.C. 154(b) by 0 days.

(21) Appl. No.: 16/000,105

(22) Filed: Jun. 5, 2018

(65) Prior Publication Data
US 2018/0294815 A1 Oct. 11, 2018

Related U.S. Application Data

(63) Continuation of application No. 15/617,727, filed on Jun. 8, 2017, now Pat. No. 9,998,122.

(60) Provisional application No. 62/347,165, filed on Jun. 8, 2016.

(51) Int. Cl.
*H03K 19/195* (2006.01)
*H03K 19/21* (2006.01)
*H03K 3/38* (2006.01)

(52) U.S. Cl.
CPC .............. *H03K 19/195* (2013.01); *H03K 3/38* (2013.01); *H03K 19/21* (2013.01)

(58) Field of Classification Search
CPC ......... H03K 3/38; H03K 19/21; H03K 19/195
See application file for complete search history.

(56) References Cited

U.S. PATENT DOCUMENTS

| | | | |
|---|---|---|---|
| 3,281,609 A | 10/1966 | Rowell | |
| 5,334,884 A * | 8/1994 | Tesche | H03B 15/003 |
| | | | 324/248 |
| 9,390,951 B2* | 7/2016 | Freer | B82Y 10/00 |
| 9,664,751 B1* | 5/2017 | Berggren | G01R 33/0354 |

(Continued)

OTHER PUBLICATIONS

J.E. Mooij and Yu. V. Nazarov, Superconducting Nanowires as Quantum Phase-Slip Junctions, Feb. 12, 2006, https://www.nature.com/articles/nphys234; whole document (Year: 2006).*

(Continued)

*Primary Examiner* — Alexander H Taningco
*Assistant Examiner* — Kurtis R Bahr
(74) *Attorney, Agent, or Firm* — Locke Lord LLP; Tim Tingkang Xia, Esq.

(57) ABSTRACT

A superconducting circuit device includes one or more JJs and one or more QPSJs. The one or more QPSJs are adapted for receiving at least one input and responsively providing at least one output. Each QPSJ is configured such that when an input voltage of an input voltage pulse exceeds a critical value, a quantized charge of a Cooper electron pair tunnels across said QPSJ as an output, when the input voltage is less than the critical value, no quantized charge of the Cooper electron pair tunnels across said QPSJ as the output, wherein the presence and absence of the quantized charge that is realizable as a constant area of current pulses in the output form two logic states, and wherein the at least one QPSJ is biased with a bias voltage. The superconducting circuit device may include one or more JJs.

26 Claims, 31 Drawing Sheets

(56) References Cited

U.S. PATENT DOCUMENTS

| | | | |
|---|---|---|---|
| 9,998,122 B2 | 6/2018 | Hamilton et al. | |
| 2008/0048902 A1* | 2/2008 | Rylov | H03M 1/1215 341/155 |
| 2015/0111754 A1* | 4/2015 | Harris | G06N 10/00 505/170 |
| 2017/0201224 A1* | 7/2017 | Strong | H01P 1/18 |

OTHER PUBLICATIONS

Ergul, et. al.; Quantum Phase Slips in one-dimensional Josephson Junction Chains, May 30, 2013; Cornell University;pp. 1 thru 12 arXiv.org (Year: 2013).*

Josephson, Brian David. "Possible new effects in superconductive tunnelling." Physics letters 1.7 (1962): 251-253.

Anderson, Philip W., and John M. Rowell. "Probable observation of the Josephson superconducting tunneling effect." Physical Review Letters 10.6 (1963): 230.

Hamilton, Clark A., Charles J. Burroughs, and Samuel P. Benz. "Josephson voltage standard-a review." IEEE transactions on applied superconductivity 7.2 (1997): 3756-3761.

Anacker, Wilhelm. "Potential of superconductive Josephson tunneling technology for ultrahigh performance memories and processors." IEEE Transactions on Magnetics 5.4 (1969): 968-975.

Anacker, Wilhelm. "Josephson computer technology: an IBM research project." IBM Journal of Research and Development 24.2 (1980): 107-112.

Likharev, Konstantin K., and Vasilii K. Semenov. "RSFQ logic/memory family: A new Josephson-junction technology for sub-terahertz-clock-frequency digital systems." IEEE Transactions on Applied Superconductivity 1.1 (1991): 3-28.

Holmes, D. Scott, Andrew L. Ripple, and Marc A. Manheimer. "Energy-efficient superconducting computing—Power budgets and requirements." IEEE Transactions on Applied Superconductivity 23.3 (2013): 1701610-1701610.

Tolpygo, Sergey K. "Superconductor digital electronics: Scalability and energy efficiency issues." Low Temperature Physics 42.5 (2016): 361-379.

Langer, J. S. "JS Langer and V. Ambegaokar, Phys. Rev. 164, 498 (1967)." Phys. Rev. 164 (1967): 498.

Skocpol, W. J., M. R. Beasley, and M. Tinkham. "Phase-slip centers and nonequilibrium processes in superconducting tin microbridges." Journal of Low Temperature Physics 16.1-2 (1974): 145-167.

Giordano, N. "Evidence for macroscopic quantum tunneling in one-dimensional superconductors." Physical review letters 61.18 (1988): 2137.

Mooij, J. E., and Yu V. Nazarov. "Superconducting nanowires as quantum phase-slip junctions." Nature Physics 2.3 (2006): 169.

Mooij, J. E., and C. J. P. M. Harmans. "Phase-slip flux qubits." New Journal of Physics 7.1 (2005): 219.

Webster, C. H., et al. "Nbsi nanowire quantum phase-slip circuits: dc supercurrent blockade, microwave measurements, and thermal analysis." Physical Review B 87.14 (2013): 144510.

Hriscu, Alina Marina. "Theoretical proposals of quantum phase-slip devices." (2012).

Goteti, Uday S., and Michael C. Hamilton. "Charge-based superconducting digital logic family using quantum phase-slip junctions." IEEE Transactions on Applied Superconductivity 28.4 (2018): 1-4.

Goteti, Uday Sravan, and Michael C. Hamilton. "SPICE model implementation of quantum phase-slip junctions." Electronics Letters 51.13 (2015): 979-981.

Murphy, Andrew, Dmitri V. Averin, and Alexey Bezryadin. "Nanoscale superconducting memory based on the kinetic inductance of asymmetric nanowire loops." New Journal of Physics 19.6 (2017): 063015.

* cited by examiner

SUPERCONDUCTING CIRCUIT DEVICE AND APPLICATIONS OF SAME

CROSS-REFERENCE TO RELATED PATENT APPLICATIONS

This application is a continuation application of U.S. patent application Ser. No. 15/617,727, filed Jun. 8, 2017, now allowed, which itself claims priority to and the benefit of, pursuant to 35 U.S.C. § 119(e), U.S. Provisional Patent Application Ser. No. 62/347,165, filed Jun. 8, 2016, which are incorporated herein in their entireties by reference.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [30] represents the 30th reference cited in the reference list, namely, Uday S Goteti and Michael C Hamilton, Spice model implementation of quantum phase-slip junctions, *Electronics Letters*, 51(13):979-981, 2015.

FIELD OF THE INVENTION

The present invention relates generally to superconducting quantum logic, and more particularly, to a superconducting circuit device comprising at least one of one or more Josephson junctions (JJs) and one or more quantum phase slip junctions (QPSJs), and applications of the same.

BACKGROUND OF THE INVENTION

The background description provided herein is for the purpose of generally presenting the context of the present invention. The subject matter discussed in the background of the invention section should not be assumed to be prior art merely as a result of its mention in the background of the invention section. Similarly, a problem mentioned in the background of the invention section or associated with the subject matter of the background of the invention section should not be assumed to have been previously recognized in the prior art. The subject matter in the background of the invention section merely represents different approaches, which in and of themselves may also be inventions. Work of the presently named inventors, to the extent it is described in the background of the invention section, as well as aspects of the description that may not otherwise qualify as prior art at the time of filing, are neither expressly nor impliedly admitted as prior art against the present invention.

Superconducting electronics, primarily involving Josephson junctions and related devices have been crucial in several analog and digital electronic applications, as well as in quantum computing. With the report of Josephson junctions (JJ), it was quickly realized that these devices can be used advantageously as significantly fast switches and logic devices compared to conventional CMOS based logic [1-3]. A voltage-state type logic was pursued in earlier developments at IBM, for example, which used zero-voltage of JJs during its superconducting state as logical '0' and corresponding non-zero voltage of its normal state as logical '1' [4]. This logic family found difficulty competing with CMOS logic due to several disadvantages including poor choice of superconducting materials, and mainly, the use of under-damped Josephson junctions that latch into the voltage state, once switched [5], although several improvements were suggested [6, 7]. Some of the drawbacks of a voltage-state logic family were addressed using single flux quantum (SFQ) logic, which employs over-damped JJs, was introduced in 1985 [8] and was experimentally demonstrated in 1987 [9]. Later, several improvements were suggested for circuits in this logic family [10-12].

Rapid single-flux-quantum (RSFQ) logic family is known to perform arithmetic and logic operations at compellingly high clock speeds (a few hundred GHz) [13, 14] using significantly lower energy compared to existing CMOS technologies [15-17]. The basic logic elements of this technology employ superconducting loops, broken with JJs, that store flux quanta as its basic logic element. The state of the element can be measured as voltage pulses with quantized area [5]. However, RSFQ logic has disadvantages in having static power dissipation and in requiring relatively large DC current biases to supply current to all the junctions, which, in-turn, introduce difficulties in design. These two disadvantages were overcome by other related technologies that use the same quantized flux logic but with improved biasing techniques such as low voltage RSFQ [17, 18], energy-efficient RSFQ (ERSFQ/eSFQ) [15, 16, 19], reciprocal quantum logic (RQL) [20, 21] and adiabatic quantum flux parametron (AQFP) [22, 23].

Quantum phase-slip is a phenomenon in superconducting systems where the phase difference between two connected superconducting regions changes by $2\pi$ with the suppression of the superconducting order parameter to zero. This occurs with quantum tunneling of vortices or fluxons across a narrow superconducting line, which is a dual to macroscopic quantum tunneling of charges across the insulating barrier in Josephson junction structures [25]. These effects have been studied extensively for quasi-one-dimensional nanowires, with thermally induced phase slips observed near the superconducting transition temperatures of the nano-wire and quantum phase-slips at significantly lower temperatures [37-44]. Qubits based on coherent quantum phase-slips were proposed [43] and coherent phase-slip events were observed [42].

QPSJ-based structures may serve as a potential circuit element in applications in superconducting electronics, quantum information processing and as a current standard. However, demonstrating a QPSJ with proper DC and RF operation has been relatively challenging to implement practically [44]. There has been no platform to identify potential applications of a QPSJ in electronic circuits.

Therefore, a heretofore unaddressed need exists in the art to address the aforementioned deficiencies and inadequacies.

SUMMARY OF THE INVENTION

In one aspect, the present invention relates to a superconducting circuit device comprising one or more JJs and one or more QPSJs.

In one embodiment, the one or more QPSJs are adapted for receiving at least one input and responsively providing at least one output, each QPSJ being configured such that when an input voltage of an input voltage pulse exceeds a critical value, a quantized charge of a Cooper electron pair tunnels across said QPSJ as an output, when the input voltage is less than the critical value, no quantized charge of the Cooper electron pair tunnels across said QPSJ as the output, wherein the presence and absence of the quantized charge that is realizable as a constant area of current pulses in the output form two logic states, and wherein the at least one QPSJ is biased with a bias voltage.

In one embodiment, the bias voltage is about 50-95% of the critical voltage, the input voltage is at least about 110% of the critical voltage for quantized charge tunneling.

In one embodiment, each QPSJ is characterizable as a compact circuit model, wherein the compact circuit model comprises a voltage source, a phase-slip junction, an inductor representing an inductance of a nano-wire of the phase-slip junction, and a non-linear resistor having different values of resistance in different phases of operation and showing normal to superconductor transition as a function of the voltage across the phase-slip junction, coupling to each other in series.

In one embodiment, the critical voltage, the inductance, and the resistance are determined by material properties and physical dimensions of the QPSJ.

In one embodiment, the one or more QPSJs comprise two QPSJs, wherein a node connecting two QPSJs and a capacitor defines a charge island.

In one embodiment, when the quantized charge of the Cooper electron pair tunnels across one of the two QPSJs, the quantized charge of the Cooper electron pair is stored in the charge island, otherwise no quantized charge of the Cooper electron pair is stored in the charge island, thereby forming a basic logic element having the two logic states.

In one embodiment, the one or more QPSJs forms a QPSJ transmission line, wherein the one or more QPSJs comprise a plurality of QPSJs connected to one another in series, wherein each node connecting two adjacent QPSJs and a capacitor defines a charge island.

In one embodiment, the quantized charge of the Cooper electron pair is stored in a charge island or forced to hop to its immediately next charge island, by design of or tuning a capacitance of the charge island, along with the junction parameters, thereby transferring the quantized charge of the Cooper electron pair along the QPSJ transmission line.

In one embodiment, amplification or attenuation of the current pulse amplitude is obtained by using the QPSJs of different critical voltages and different capacitor values.

In one embodiment, the one or more QPSJs forms a QPSJ pulse splitter, wherein the one or more QPSJs comprise three QPSJs, where the first QPSJ has a first terminal connected to an input voltage source defining an input node, and a second terminal connected to a first capacitor; the second QPSJ has a first terminal connected to the second terminal of the first QPSJ, and a second terminal connected to a second capacitor and a first bias voltage source defining a first output node; and the third QPSJ has a first terminal connected to the second terminal of the first QPSJ, and a second terminal connected to a third capacitor and a second bias voltage source defining a second output node. In operation, an input pulse at the input node is split into two pulses output from the first and second output nodes respectively.

In one embodiment, the one or more QPSJs forms a QPSJ buffer, wherein the one or more QPSJs comprise three QPSJs, wherein the first QPSJ has a first terminal connected to an input voltage source or a first bias voltage source defining a first node, and a second terminal connected to a first capacitor defining a second node; the second QPSJ has a first terminal connected to the second terminal of the first QPSJ defining a third node, and a second terminal connected to a second capacitor and the first bias voltage source or the input voltage source defining a fourth node; and the third QPSJ has a first terminal connected to the third node, and a second terminal connected to a second bias voltage source. In operation, an input pulse from the first node through the first QPSJ switches to the third QPSJ, before it switches to the second QPSJ so as to prevent a signal flow in a direction from the first node to the fourth node, or when current arrives from an opposite direction, the first QPSJ switches before the third QPSJ, allowing the signal through.

In one embodiment, the one or more QPSJs forms a QPSJ confluence buffer, wherein the one or more QPSJs comprise four QPSJs, wherein the first QPSJ has a first terminal connected to a first input voltage source, and a second terminal connected to a first capacitor defining node 3; the second QPSJ has a first terminal connected to a second input voltage source, and a second terminal connected to a second capacitor defining node 6, wherein both nodes 3 and 6 are connected to node 7; the third QPSJ has a first terminal connected to node 7, and a second terminal connected to a first bias voltage source; and the fourth QPSJ has a first terminal connected to node 7, and a second terminal connected to a third capacitor and the second bias voltage source at node 8, wherein in operation, input pulses from either the first or second input voltage sources result in an output pulse from node 8, but do not result in output from the other input.

In one embodiment, the one or more QPSJs forms a QPSJ based OR gate, wherein the one or more QPSJs comprise six QPSJs, wherein the first to fourth QPSJs define the confluence buffer and the fifth and sixth QPSJs define an island, wherein the confluence buffer is connected to the island in series such that a first terminal of the fifth QPSJ is connected to the output terminal of the confluence buffer and a second terminal of the sixth QPSJ is connected to a clock signal of a third input voltage source that is connected to a second bias voltage source.

In one embodiment, the one or more QPSJs forms a QPSJ based AND gate, wherein the one or more QPSJs comprise five QPSJs, wherein the first to fourth QPSJs define the confluence buffer and the fifth QPSJ has a first terminal connected to the output terminal of the confluence buffer and a second terminal connected to a second bias voltage source, and the output terminal of the confluence buffer is connected to a clock signal of a third input voltage source that is connected to a second bias voltage source.

In one embodiment, the one or more QPSJs forms a QPSJ based XOR gate, wherein the one or more QPSJs comprise four QPSJs, wherein the first to fourth QPSJs define the confluence buffer and the output terminal of the confluence buffer is connected to a clock signal of a third input voltage source that is connected to a second bias voltage source.

In one embodiment, the one or more QPSJs forms an RS flip-flop or a D flip-flop, wherein the one or more QPSJs comprise two QPSJs, wherein the first QPSJ has a first terminal connected to a bias voltage source at node 2 that in turn is connected to a first input voltage source connected to node 1, a second terminal connected node 3 that in turn is connected to a capacitor; and the second QPSJ has a first terminal connected to node 3, and a second terminal connected to node 4 that is in turn connected to the second input voltage source.

In one embodiment, the one or more QPSJs forms the RS flip-flop, wherein in operation, a SET input signal at node 1 induces a quantized charge of the Cooper electron pair to the island of node 3, and a RESET input signal at node 4 induces a current pulse opposite to that induced by the SET input signal so as to reset the charge on the island.

In one embodiment, the one or more QPSJs forms the D flip-flop, wherein in operation, a SET input signal at node 1 induces a quantized charge of the Cooper electron pair to the island of node 3, and a RESET input signal at node 4 is a clock signal that switches the first QPSJ and induces a quantized charge of the Cooper electron pair on the island, and with the next clock pulse, the charge flows through an output terminal to perform a function of the D flip-flop.

In one embodiment, the one or more QPSJs forms a T flip-flop, wherein the one or more QPSJs comprise two QPSJs, wherein the first QPSJ has a first terminal connected to a bias voltage source at node 3 that in turn is connected to an input voltage source at node 2, the input voltage source connected to node 1, a second terminal connected node 4 that in turn is connected to a capacitor; and the second QPSJ has a first terminal connected to node 4, and a second terminal connected to node 2. In operation, a single clock signal of the input voltage source is input at node 1, and at each clock pulse, the current pulse toggles from ON to OFF and vice versa, indicating the presence and absence of a quantized charge of the Cooper electron pair on the island with each clock pulse.

In one embodiment, each of the one or more JJs is configured such that when an input current through said JJ exceeds a critical value, a single flux quantum pulse tunnels across said JJ as an output, when the input current is less than the critical value, no single flux quantum pulse tunnels across said JJ as the output, wherein the presence and absence of the single flux quantum pulse in the output form two logic states.

In one embodiment, the one or more QPSJs comprise two QPSJs defining a QPSJ island with a capacitor, and the one or more JJs comprises two JJs defining a JJ loop with a inductor, and the QPSJ island and the JJ loop is connected in series to perform a bridge operation between flux and charge.

In one embodiment, the one or more QPSJs further comprises a third QPSJ having a first terminal connected to a node between the QPSJ island and the JJ loop, and a second terminal connected to a bias voltage source, wherein in operation, a voltage pulse is induced through the third QPSJ that enables or disables the output pulse.

In one embodiment, the superconducting circuit device further comprises at least one complementary quantum logic (CQL) cell, each CQL cell comprising at least one QPSJ, and at least one JJ coupled with the at least one QPSJ to perform one or more logic operations.

In one embodiment, the CQL cell comprises two QPSJs defining a QPSJ island with a capacitor, and two JJs defining a JJ loop with a inductor, and the QPSJ island and the JJ loop is connected in series to perform a bridge operation between flux and charge.

In one embodiment, the CQL cell further comprises a third QPSJ having a first terminal connected to a node between the QPSJ island and the JJ loop, and a second terminal connected to a bias voltage source, wherein in operation, a voltage pulse is induced through the third QPSJ that enables or disables the output pulse.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the present invention and, together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
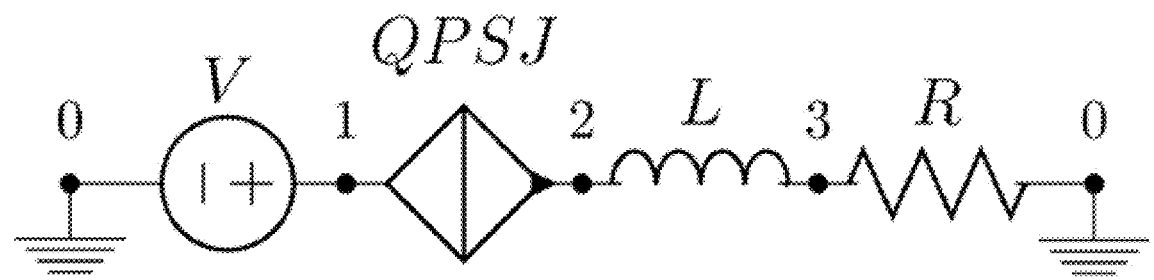
FIG. 1 shows a compact circuit model for a QPSJ implemented in a SPICE model.

The present invention will now be described more fully hereinafter with reference to the accompanying drawings, in which exemplary embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting and/or capital letters has no influence on the scope and meaning of a term; the scope and meaning of a term are the same, in the same context, whether or not it is highlighted and/or in capital letters. It will be appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only and in no way limits the scope and meaning of the invention or of any exemplified term. Likewise, the invention is not limited to various embodiments given in this specification.

The terminology used herein is for the purpose of describing particular embodiments only and is not intended to be limiting of the invention. As used herein, the singular forms "a," "an," and "the" are intended to include the plural forms as well, unless the context clearly indicates otherwise.

It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "adjacent" to another feature may have portions that overlap or underlie the adjacent feature.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below can be termed a second element, component, region, layer or section without departing from the teachings of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation shown in the figures. For example, if the device in one of the figures is turned over, elements described as being on the "lower" side of other elements would then be oriented on the "upper" sides of the other elements. The exemplary term "lower" can, therefore, encompass both an orientation of lower and upper, depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be further understood that the terms "comprise(s)" and/or "comprising," or "include(s)" and/or "including" or "has (have)" and/or "having" or "contain(s)" and/or "containing" when used in this specification specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around," "about," "substantially" or "approximately" shall generally mean within 20 percent, preferably within 10 percent, and more preferably within 5 percent of a given value or range. Numerical quantities given herein are approximate, meaning that the terms "around," "about," "substantially" or "approximately" can be inferred if not expressly stated.

As used herein, the terms "capacitor" and "capacitance" are interchangeable in the disclosure, and may refer to a real, pysical component, a parasitic capacitor, or just a property of the lines connecting the QPSJs.

As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure. As used herein, the term "and/or" includes any and all combinations of one or more of the associated listed items.

The description is now made as to the embodiments of the invention in conjunction with the accompanying drawings. Although various exemplary embodiments of the present invention disclosed herein may be described in the context of superconducting quantum logic that have significant advantages primarily in energy consumption and ease of fabrication/design, it should be appreciated that aspects of the present invention disclosed herein are not limited to being used in connection with one particular type of charged-based logic using quantum phase-slip junctions (QPSJs) and complementary quantum logic (CQL) using QPSJs and Josephson junctions (JJs) and may be practiced in connection with other types of charged-based logic and CQL or other types of logic devices using charged-based logic and CQL without departing from the scope of the present invention disclosed herein.

In one aspect of the invention, the superconducting logic cell includes at least one QPSJ for receiving at least one input and responsively providing at least one output, each QPSJ being configured such that when an input voltage of an input voltage pulse exceeds a critical value, a quantized charge of a Cooper electron pair tunnels across said QPSJ as an output, when the input voltage is less than the critical value, no quantized charge of the Cooper electron pair tunnels across said QPSJ as the output, where the presence and absence of the quantized charge in the output form two logic states, and the at least one QPSJ is biased with a bias voltage. In one embodiment, the bias voltage is about 70-80% of the critical voltage, the input voltage is at least about 150% of the critical voltage for quantized charge tunneling. It should be appreciated by those having ordinary skill in the art that other ranges of the bias voltage and the input voltage can also be utilized to practice the invention.

Referring to FIG. 1, each QPSJ is characterizable as a compact circuit model for SPICE implementation. The compact circuit model comprises a voltage source V, a QPSJ element, an inductor L representing an inductance of a nano-wire of the QPSJ, and a non-linear resistor R having different values of resistance in different phases of operation and showing normal to superconductor transition as a function of the voltage across the QPSJ, coupling to each other in series.

As discussed below, the critical voltage, the inductance, and the resistance are determined by material properties and physical dimensions of the QPSJ.

In one embodiment, the at least one QPSJ comprises two QPSJs, where a node connecting two QPSJs and a capacitor defines a charge island, as shown in FIGS. 11(b) and 11(c). In one embodiment the capacitor may be a real, pysical component. In another embodiment, the capacitor may be a parasitic capacitor, or just a property of the lines connecting the QPSJs. When the quantized charge of the Cooper electron pair tunnels across one of the two QPSJs, the quantized charge of the Cooper electron pair is stored in the charge island, otherwise no quantized charge of the Cooper electron pair is stored in the charge island, thereby forming a basic logic element having the two logic states.

Figure 12:
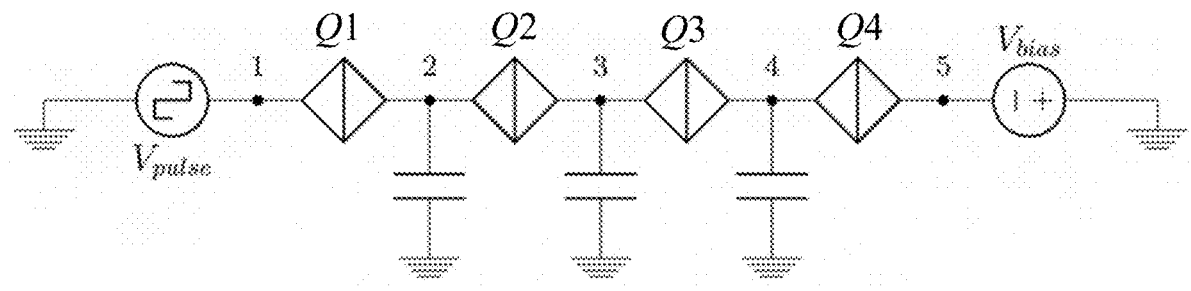
FIG. 12 shows a QPSJ transmission line comprising a pluarity of QPSJs with a DC voltage bias of 4×0.7$V_C$ and pulse input signal according to one embodiment of the present invention, where $V_C$ is the critical voltage of each of the junctions. Hereinafter, a QPSJ may be denoted by a capital letter "Q" in the disclosure.

As shown in FIG. 12, in this exemplary embodiment, the superconducting logic cell is a QPSJ transmission line, where the at least one QPSJ comprises four QPSJs connected to one another in series, where each node connecting two adjacent QPSJs and a capacitor defines a charge island. According to the invention, the quantized charge of the Cooper electron pair is stored in a change island or forced to hop to its immediately next charge island, by proper design or tuning of a capacitance of the charge island, along with the junction parameters, thereby transferring the quantized charge of the Cooper electron pair along the QPSJ transmission line. In certain embodiments, amplification or attenuation of the current pulse amplitude is obtained by using the QPSJs of different critical voltages and different capacitor values.

Figure 15:
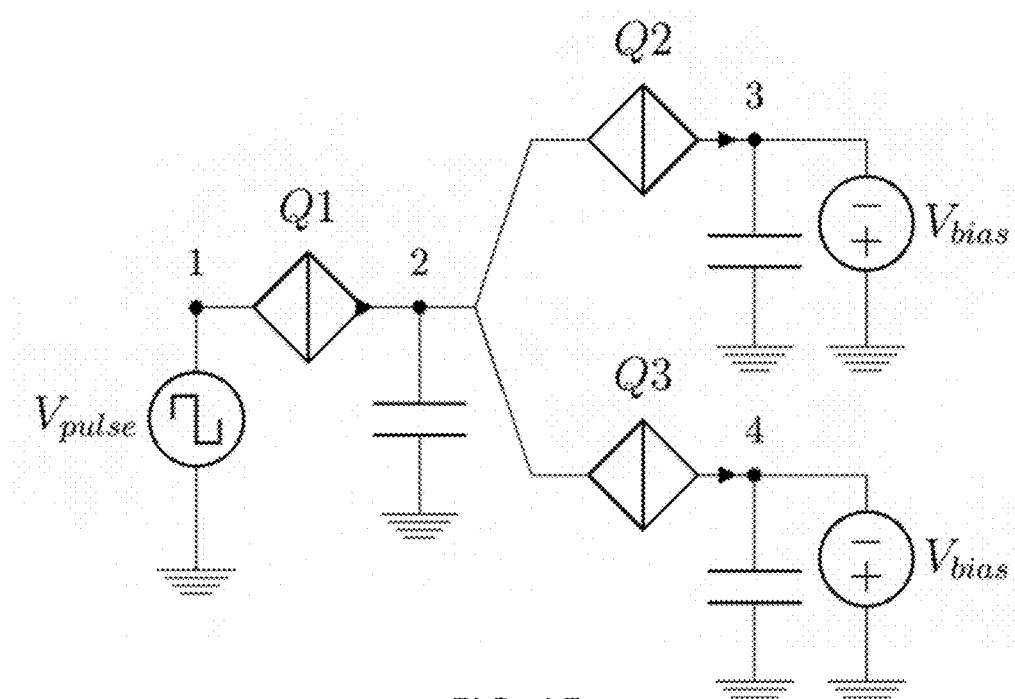
FIG. 15 shows a pulse splitter according to one embodiment of the present invention, where the critical voltage of Q1 is 0.7 Vc, and the critical voltages of Q2 and Q3 are Vc.

In one embodiment, as shown in FIG. 15, the superconducting logic cell is a QPSJ pulse splitter that comprises three QPSJs, where the first QPSJ has a first terminal connected to an input voltage source defining an input node, and a second terminal connected to a first capacitor; the second QPSJ has a first terminal connected to the second terminal of the first QPSJ, and a second terminal connected to a second capacitor and a first bias voltage source defining a first output node; and the third QPSJ has a first terminal connected to the second terminal of the first QPSJ, and a second terminal connected to a third capacitor and a second bias voltage source defining a second output node. In operation, an input pulse at the input node is split into two pulses output from the first and second output nodes respectively.

In one embodiment, as shown in FIG. 15, the superconducting logic cell is a QPSJ buffer including three QPSJs, where the first QPSJ has a first terminal connected to an input voltage source or a first bias voltage source defining a first node, and a second terminal connected to a first capacitor defining a second node; the second QPSJ has a first terminal connected to the second terminal of the first QPSJ defining a third node, and a second terminal connected to a second capacitor and the first bias voltage source or the input voltage source defining a fourth node; and the third QPSJ has a first terminal connected to the third node, and a second terminal connected to a second bias voltage source. In operation, an input pulse from the first node through the first QPSJ switches to the third QPSJ, before it switches to the second QPSJ so as to prevent a signal flow in a direction from the first node to the fourth node, or when current arrives from an opposite direction, the first QPSJ switches before the third QPSJ, allowing the signal through.

Figure 20:
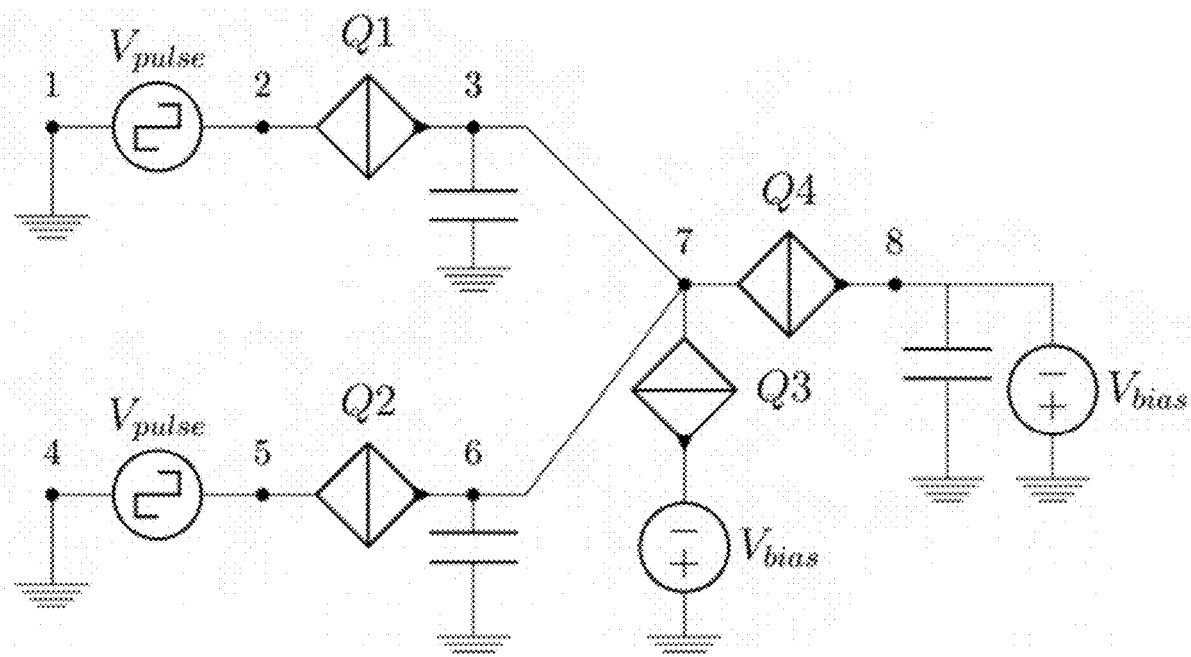
FIG. 20 shows a QPSJ merger according to one embodiment of the present invention, where the critical voltages of Q1 and Q2 are 1.4 Vc, the critical voltages of Q3 is Vc, and the critical voltages of Q4 is 0.7 Vc.

In one embodiment, as shown in FIG. 20, the superconducting logic cell is a QPSJ confluence buffer having four QPSJs, where the first QPSJ has a first terminal connected to a first input voltage source, and a second terminal connected to a first capacitor defining node 3; the second QPSJ has a first terminal connected to a second input voltage source, and a second terminal connected to a second capacitor defining node 6, where both nodes 3 and 6 are connected to node 7; the third QPSJ has a first terminal connected to node 7, and a second terminal connected to a first bias voltage source; and the fourth QPSJ has a first terminal connected to node 7, and a second terminal connected to a third capacitor and the second bias voltage source at node 8. In operation, input pulses from either the first or second input voltage sources result in an output pulse from node 8, but do not result in output from the other input.

Figure 22:
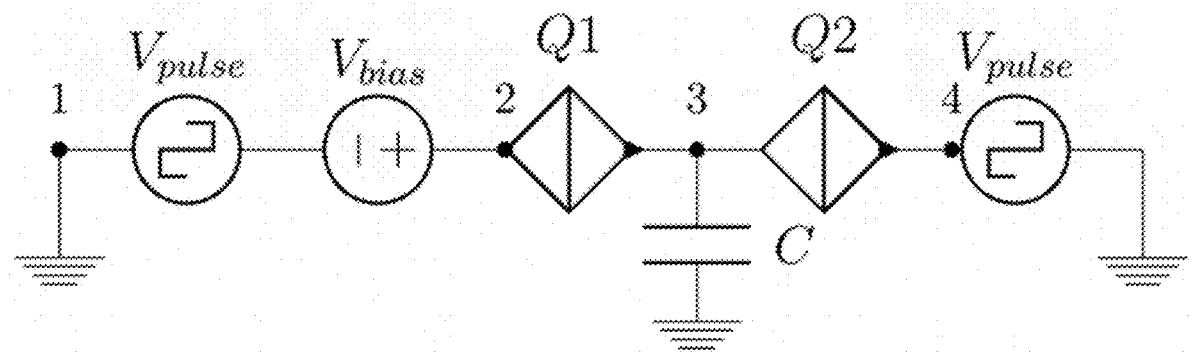
FIG. 22 shows an RS flip-flop using QPSJs forming an island with a capacitor according to one embodiment of the present invention, where the critical voltages of Q1 and Q2 are $V_C$, and $C=1.5V_C/2e$.

In one embodiment, as shown in FIG. 22, the superconducting logic cell is an RS flip-flop or a D flip-flop comprising two QPSJs, where the first QPSJ has a first terminal connected to a bias voltage source at node 2 that in turn is connected to a first input voltage source connected to node 1, a second terminal connected to node 3 that in turn is connected to a capacitor; and the second QPSJ has a first terminal connected to node 3, and a second terminal connected to node 4 that is in turn connected to the second input voltage source.

In one embodiment, the superconducting logic cell is the RS flip-flop. In operation, a SET input signal at node 1 induces a quantized charge of the Cooper electron pair to the island of node 3, and a RESET input signal at node 4 induces a current pulse opposite to that induced by the SET input signal so as to reset the charge on the island.

In one embodiment, the superconducting logic cell is the D flip-flop. In operation, a SET input signal at node 1 induces a quantized charge of the Cooper electron pair to the island of node 3, and a RESET input signal at node 4 is a clock signal that switches the first QPSJ and induces a quantized charge of the Cooper electron pair on the island, and with the next clock pulse, the charge flows through an output terminal to perform a function of the D flip-flop.

Figure 24:
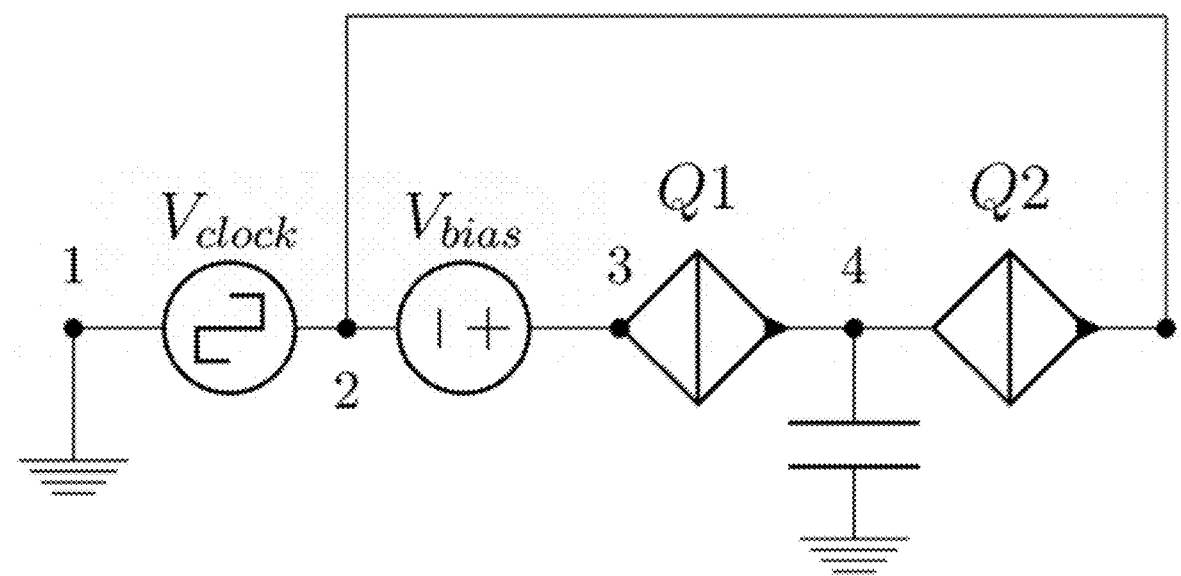
FIG. 24 shows a T flip-flop circuit obtained from QPSJ island and clock input according to one embodiment of the present invention, where the critical voltages of Q1 and Q2 is $V_C$, and $C=1.5V_C/2e$.

In one embodiment, as shown in FIG. 24, the superconducting logic cell is a T flip-flop comprising two QPSJs, where the first QPSJ has a first terminal connected to a bias voltage source at node 3 that in turn is connected to an input voltage source at node 2, the input voltage source connected to node 1, a second terminal connected node 4 that in turn is connected to a capacitor; and the second QPSJ has a first terminal connected to node 4, and a second terminal connected to node 2. In operation, a single clock signal of the input voltage source is input at node 1, and at each clock pulse, the current pulse toggles from ON to OFF and vice versa, indicating the presence and absence of a quantized charge of the Cooper electron pair on the island with each clock pulse.

Figure 26:
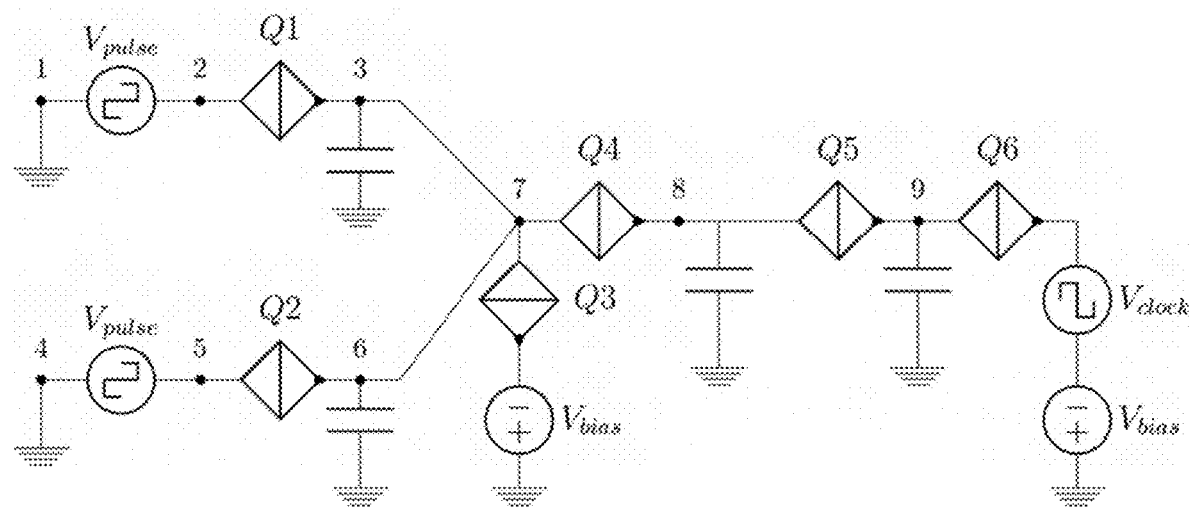
FIG. 26 shows a QPSJ based OR gate formed by combining a confluence buffer and an RS flip-flop according to one embodiment of the present invention.

In one embodiment, as shown in FIG. 26, the superconducting logic cell is a QPSJ based OR gate comprising six QPSJs, where the first to fourth QPSJs define a confluence buffer and the fifth and sixth QPSJs define an island, where the confluence buffer is connected to the island in series such that a first terminal of the fifth QPSJ is connected to the output terminal of the confluence buffer and a second terminal of the sixth QPSJ is connected to a clock signal of a third input voltage source that is connected to a second bias voltage source.

Figure 28:
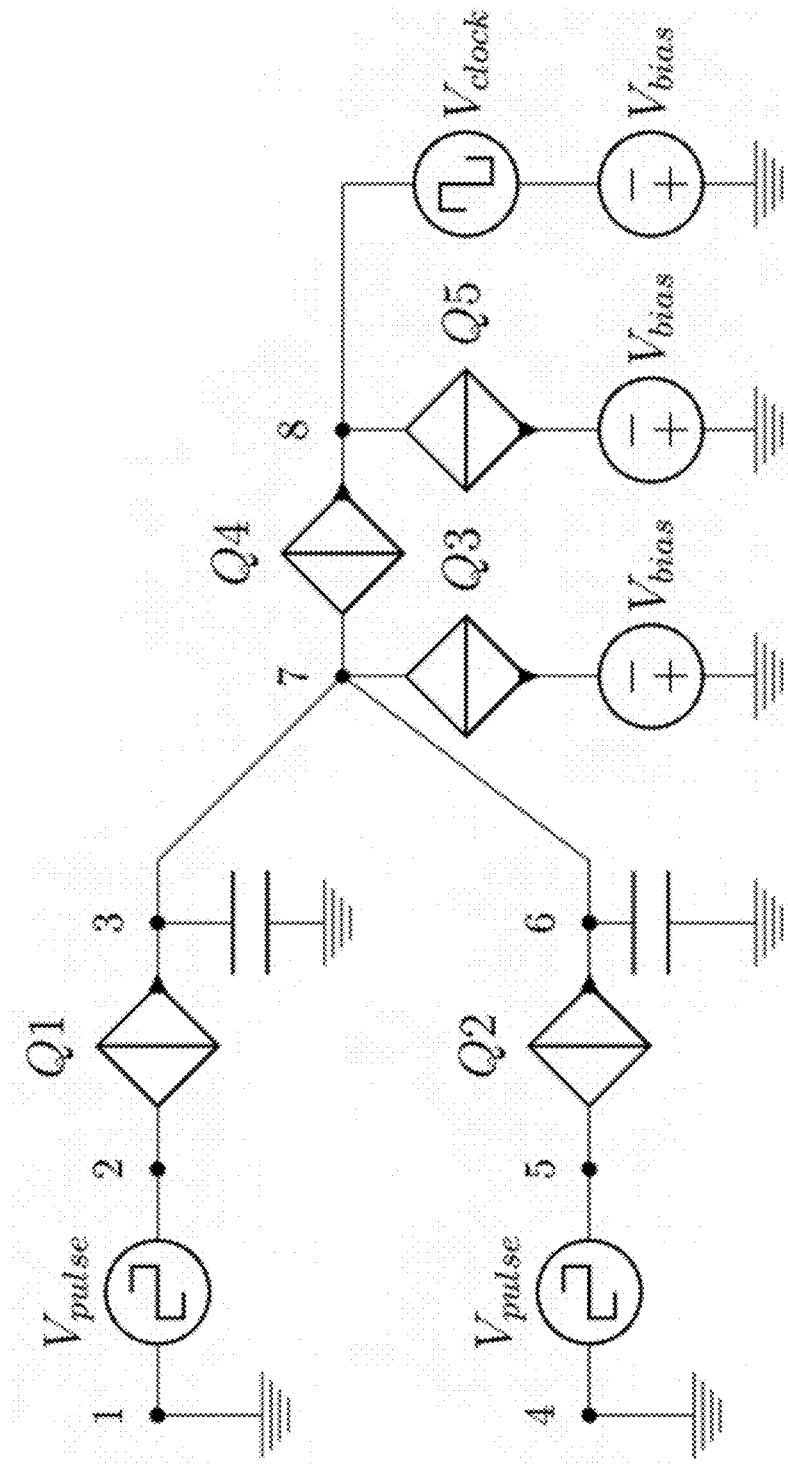
FIG. 28 shows an AND gate circuit implemented by replacing the RS flip-flop in the OR gate with a buffer circuit according to one embodiment of the present invention.

In one embodiment, as shown in FIG. 28, the superconducting logic cell is a QPSJ based AND gate comprising five QPSJs, where the first to fourth QPSJs define the confluence buffer and the fifth QPSJ has a first terminal connected to the output terminal of the confluence buffer and a second terminal connected to a second bias voltage source, and the output terminal of the confluence buffer is connected to a clock signal of a third input voltage source that is connected to a second bias voltage source.

Figure 30:
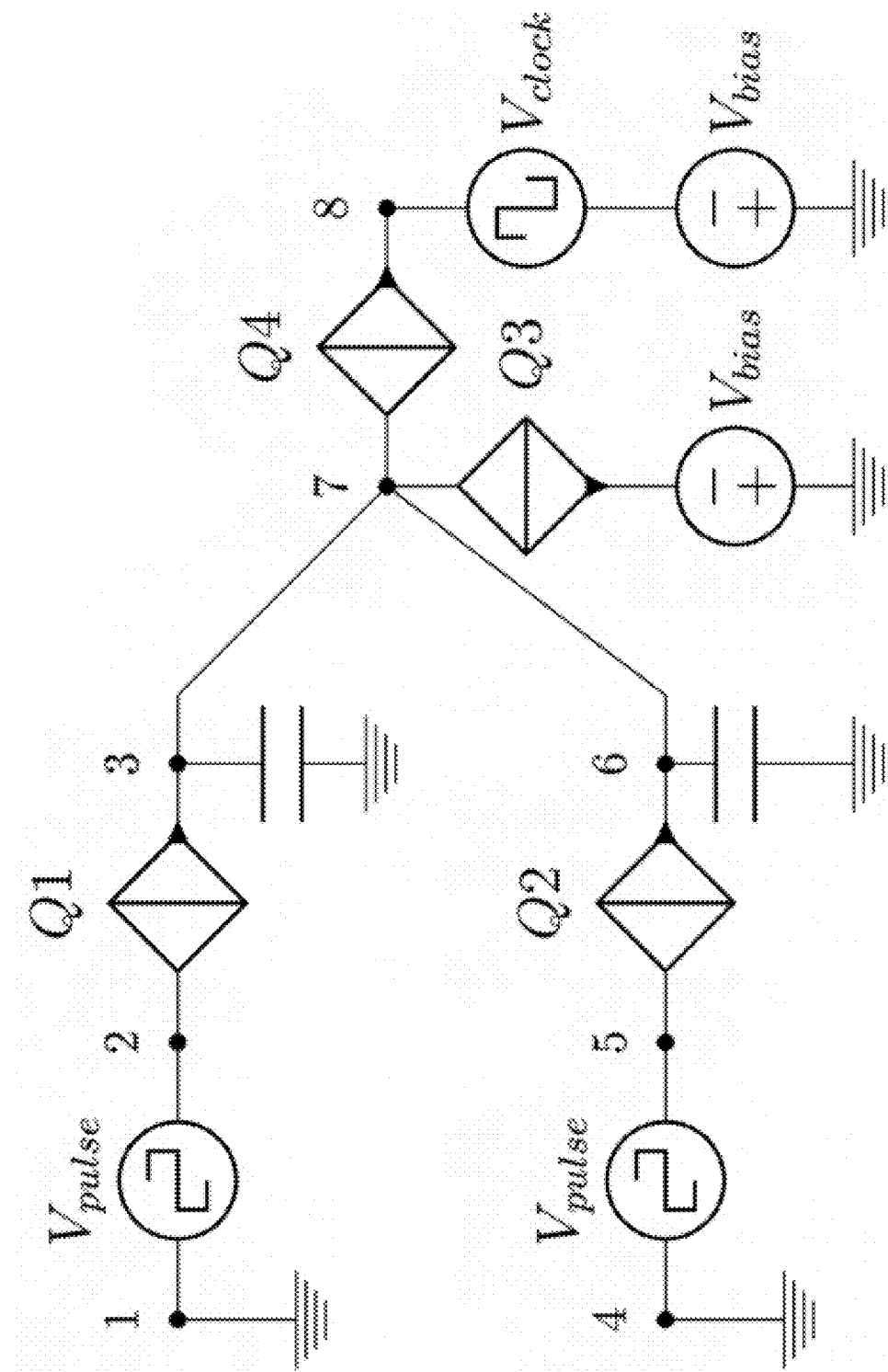
FIG. 30 shows an XOR gate circuit implemented by removing the buffer circuit in the AND gate according to one embodiment of the present invention.

In one embodiment, as shown in FIG. 30, the superconducting logic cell is a QPSJ based XOR gate comprising four QPSJs, where the first to fourth QPSJs define the confluence buffer and the output terminal of the confluence buffer is connected to a clock signal of a third input voltage source that is connected to a second bias voltage source.

In one embodiment, the superconducting logic cell further includes at least one JJ coupled with the at least one QPSJ to perform one or more logic operations, where each JJ is configured such that when an input current through said JJ exceeds a critical value, a single flux quantum pulse tunnels across said JJ as an output, when the input current is less than the critical value, no single flux quantum pulse tunnels across said JJ as the output, where the presence and absence of the single flux quantum pulse in the output form two logic states.

Figure 45:
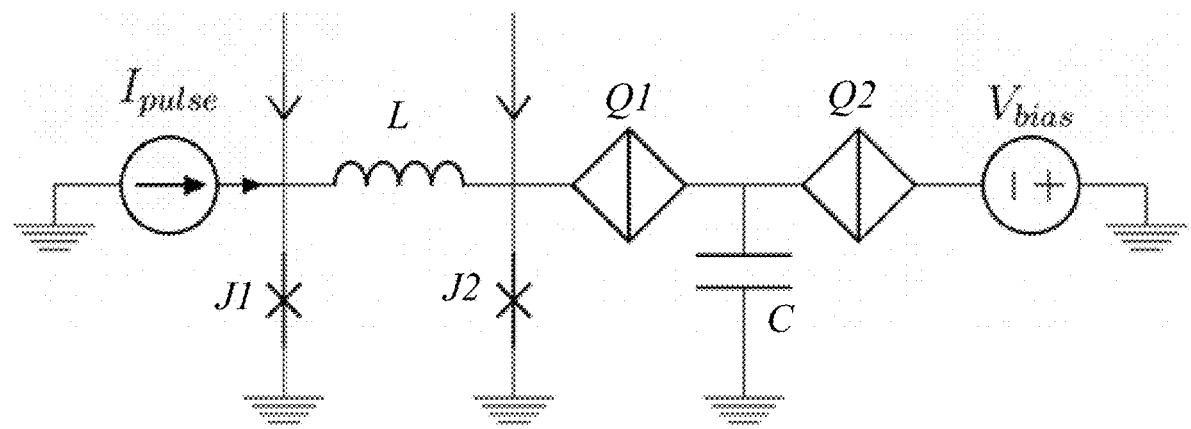
FIG. 45 shows a circuit of single-flux-quantum loop and quantized charge island in series facilitating flux-charge conversion according to one embodiment of the present invention.

In one embodiment, as shown in FIG. 45, the at least one QPSJ comprises two QPSJs defining a QPSJ island with a capacitor, and the at least one JJ comprises two JJs defining a JJ loop with a inductor, and the QPSJ island and the JJ loop is connected in series to perform a bridge operation between flux and charge.

Figure 47:
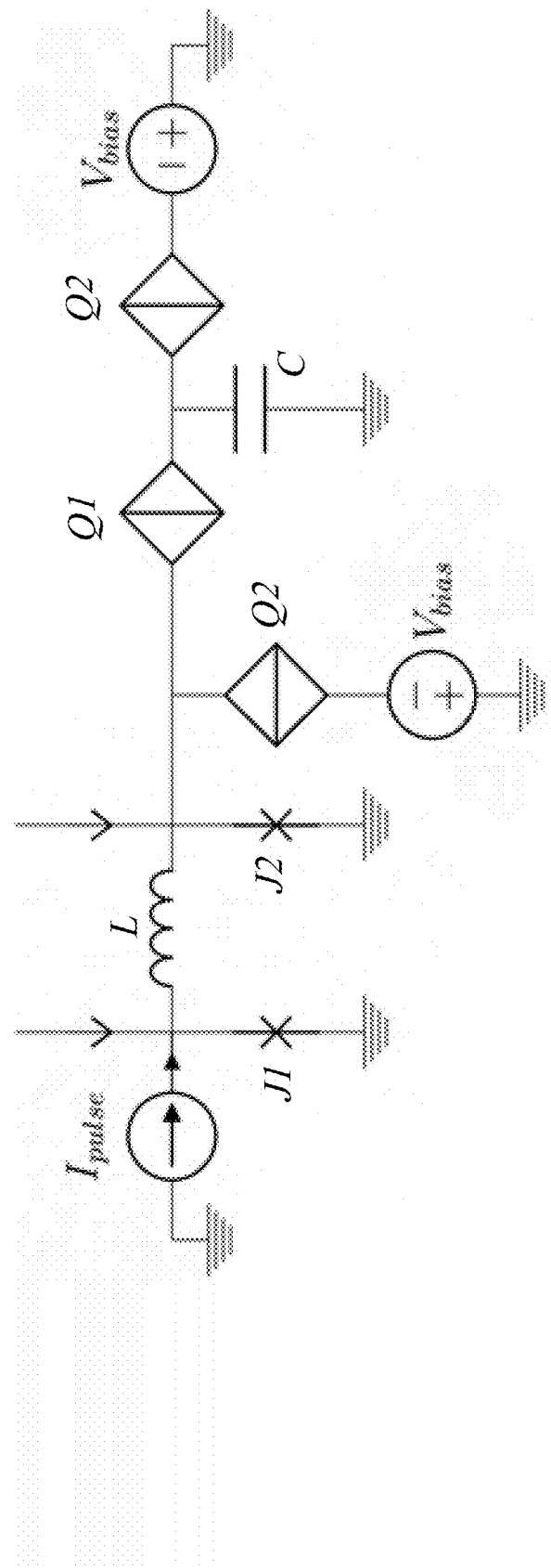
FIG. 47 shows a control/buffer circuit using flux-charge elements enabling logic operation in complementary quantum logic (CQL) according to one embodiment of the present invention.

In one embodiment, as shown in FIG. 47, the at least one QPSJ further comprises a third QPSJ having a first terminal connected to a node between the QPSJ island and the JJ loop, and a second terminal connected to a bias voltage source, where in operation, a voltage pulse is induced through the third QPSJ that enables or disables the output pulse.

In another aspect, the present invention relates to a superconducting circuit device. In one embodiment, superconducting circuit device includes at least one superconducting logic cell, each superconducting logic cell comprising at least one QPSJ for receiving at least one input and responsively providing at least one output, each QPSJ being configured such that when an input voltage of an input voltage pulse exceeds a critical value, a quantized charge of a Cooper electron pair tunnels across said QPSJ as an output, when the input voltage is less than the critical value, no quantized charge of the Cooper electron pair tunnels across said QPSJ as the output, where the presence and absence of the quantized charge in the output form two logic states, and the at least one QPSJ is biased with a bias voltage.

In some embodiments, the at least one superconducting logic cell comprises a charge island, a QPSJ transmission line, a QPSJ pulse splitter, a QPSJ buffer, a QPSJ confluence buffer, a QPSJ based OR gate, a QPSJ based AND gate, a QPSJ based XOR gate, an RS flip-flop, a D flip-flop, a T flip-flop, NOR, NAND, etc., or any combination thereof. It should be appreciated by those having ordinary skill in the art that the gates/circuits can also be extended to perform logic with greater than two inputs, and to more complex processes according to embodiments of the invention.

Figure 11:
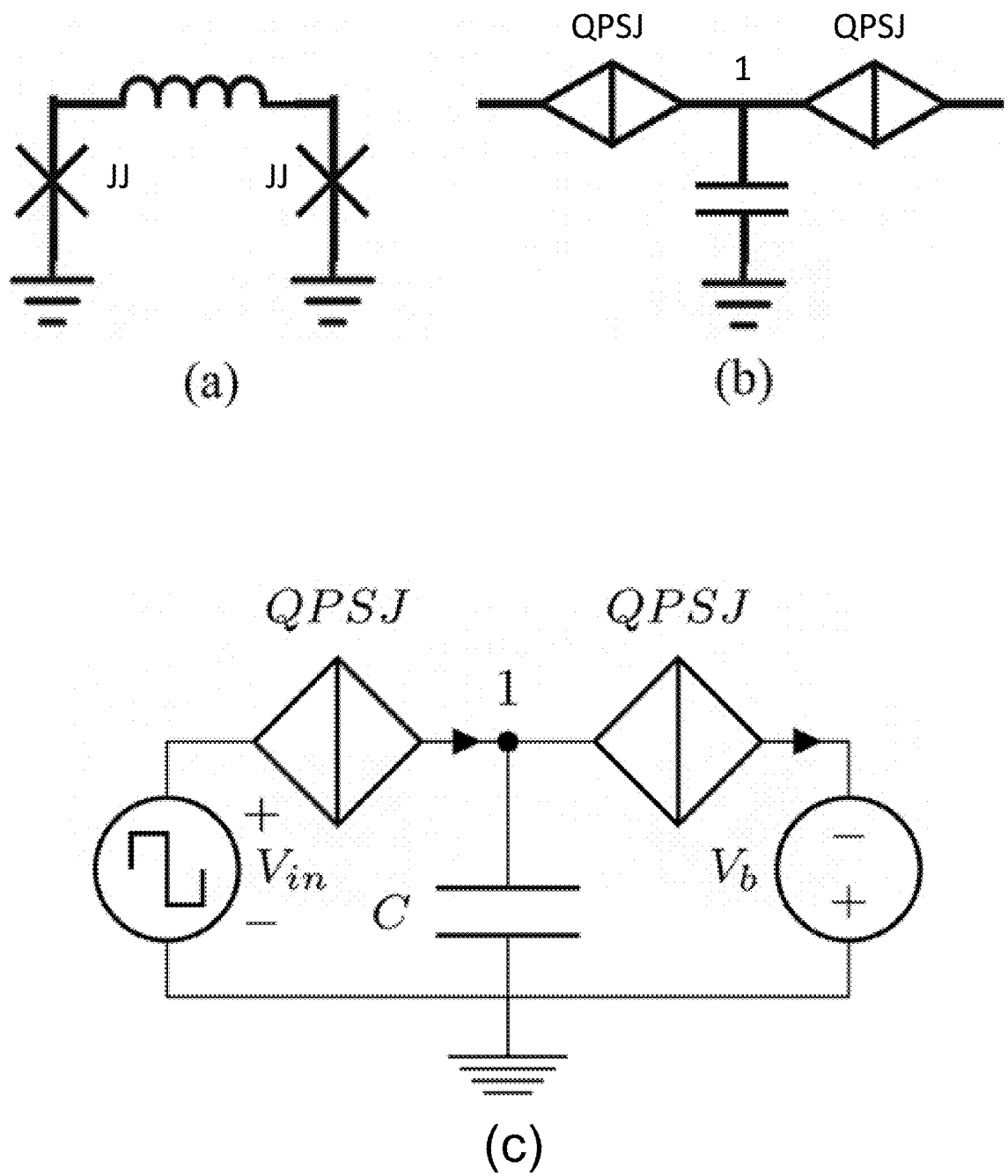
FIG. 11 shows rapid single-flux-quantum (RSFQ) and QPSJ based logic: (a) loop storing flux $\Phi_0$ in RSFQ based logic, (b) and (c) island storing charge 2e in QPSJ based logic according to one embodiment of the present invention.

As shown in FIGS. 11(*b*) and 11(*c*), the charge island is defined by a node connecting two QPSJs and a capacitor.

In one embodiment, the QPSJ transmission line comprises a plurality of QPSJs, e.g., 4 QPSJs shown in FIG. 12, connected to one another in series, where each node connecting two adjacent QPSJs and a capacitor defines the charge island. In one embodiment the capacitor may be a real, pysical component. In another embodiment, the capacitor may be a parasitic capacitor, or just a property of the lines connecting the QPSJs.

In one embodiment, as shown in FIG. 15, the QPSJ pulse splitter comprises three QPSJs, where the first QPSJ has a first terminal connected to an input voltage source defining an input node, and a second terminal connected to a first capacitor; the second QPSJ has a first terminal connected to the second terminal of the first QPSJ, and a second terminal connected to a second capacitor and a first bias voltage source defining a first output node; and the third QPSJ has a first terminal connected to the second terminal of the first QPSJ, and a second terminal connected to a third capacitor and a second bias voltage source defining a second output node. In operation, an input pulse at the input node is split into two pulses output from the first and second output nodes respectively.

Figure 17:
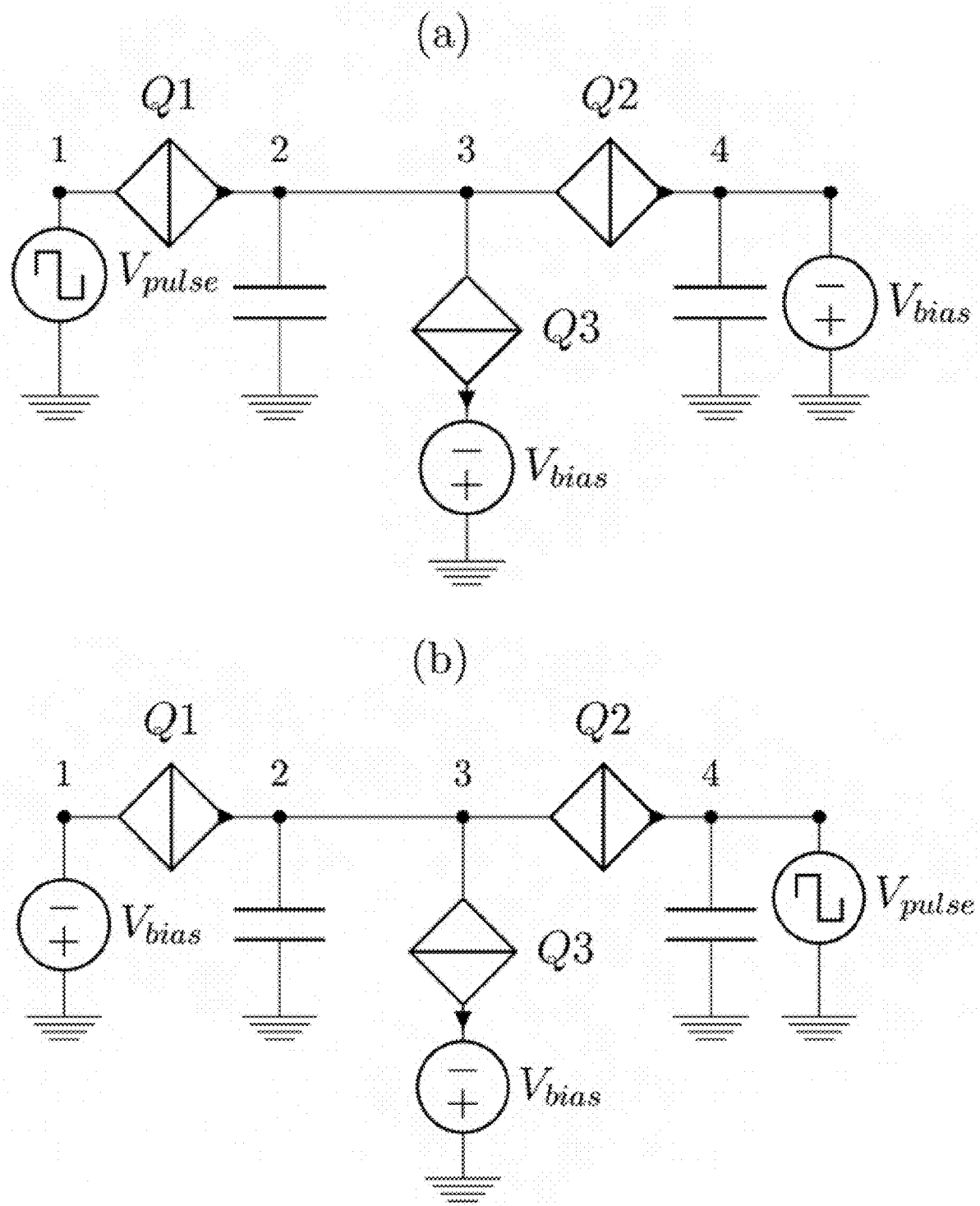
FIG. 17 shows two buffer circuits (a) and (b) showing current flow situations in both directions according to embodiments of the present invention, where the critical voltage of Q1=0.7 Vc, the critical voltage of Q2 is Vc, and the critical voltage of Q3 is 1.4 Vc.

In one embodiment, as shown in FIGS. 17 (*a*) and (*b*), the QPSJ buffer comprises three QPSJs, where the first QPSJ has a first terminal connected to an input voltage source or a first bias voltage source defining a first node, and a second terminal connected to a first capacitor defining a second node; the second QPSJ has a first terminal connected to the second terminal of the first QPSJ defining a third node, and a second terminal connected to a second capacitor and the first bias voltage source or the input voltage source defining a fourth node; and the third QPSJ has a first terminal connected to the third node, and a second terminal connected to a second bias voltage source. In operation, an input pulse from the first node through the first QPSJ switches to the third QPSJ, before it switches to the second QPSJ so as to prevent a signal flow in a direction from the first node to the fourth node, or when current arrives from an opposite direction, the first QPSJ switches before the third QPSJ, allowing the signal through.

In one embodiment, as shown in FIG. 20, the QPSJ confluence buffer comprises four QPSJs, where the first QPSJ has a first terminal connected to a first input voltage source, and a second terminal connected to a first capacitor defining node 3; the second QPSJ has a first terminal connected to a second input voltage source, and a second terminal connected to a second capacitor defining node 6, where both nodes 3 and 6 are connected to node 7; the third QPSJ has a first terminal connected to node 7, and a second terminal connected to a first bias voltage source; and the fourth QPSJ has a first terminal connected to node 7, and a second terminal connected to a third capacitor and the second bias voltage source at node 8. In operation, input pulses from either the first or second input voltage sources result in an output pulse from node 8, but do not result in output from the other input.

In one embodiment, as shown in FIG. 26, the QPSJ based OR gate comprises six QPSJs, where the first to fourth QPSJs define the confluence buffer and the fifth and sixth QPSJs define an island, where the confluence buffer is connected to the island in series such that a first terminal of the fifth QPSJ is connected to the output terminal of the confluence buffer and a second terminal of the sixth QPSJ is connected to a clock signal of a third input voltage source that is connected to a second bias voltage source.

In one embodiment, as shown in FIG. 28, the QPSJ based AND gate comprises five QPSJs, where the first to fourth QPSJs define the confluence buffer and the fifth QPSJ has a first terminal connected to the output terminal of the confluence buffer and a second terminal connected to a second bias voltage source, and the output terminal of the confluence buffer is connected to a clock signal of a third input voltage source that is connected to a second bias voltage source.

In one embodiment, as shown in FIG. 30, the QPSJ based XOR gate comprises four QPSJs, where the first to fourth QPSJs define the confluence buffer and the output terminal of the confluence buffer is connected to a clock signal of a third input voltage source that is connected to a second bias voltage source.

In one embodiment, as shown in FIG. 22, the RS flip-flop or the D flip-flop comprises two QPSJs, where the first QPSJ has a first terminal connected to a bias voltage source at node 2 that in turn is connected to a first input voltage source connected to node 1, a second terminal connected node 3 that in turn is connected to a capacitor; and the second QPSJ has a first terminal connected to node 3, and a second terminal connected to node 4 that is in turn connected to the second input voltage source.

In one embodiment, in operation, a SET input signal at node 1 induces a quantized charge of the Cooper electron pair to the island of node 3, and a RESET input signal at node 4 induces a charge opposite to that induced by the SET input signal so as to reset the charge on the island.

In one embodiment, in operation, a SET input signal at node 1 induces a quantized charge of the Cooper electron pair to the island of node 3, and a RESET input signal at node 4 is a clock signal that switches the first QPSJ and induces a quantized charge of the Cooper electron pair on the island, and with the next clock pulse, the charge flows through an output terminal to perform a function of the D flip-flop.

In one embodiment, as shown in FIG. 24, the T flip-flop comprises two QPSJs, where the first QPSJ has a first terminal connected to a bias voltage source at node 3 that in turn is connected to an input voltage source at node 2, the input voltage source connected to node 1, a second terminal connected node 4 that in turn is connected to a capacitor; and the second QPSJ has a first terminal connected to node 4, and a second terminal connected to node 2. In operation, a single clock signal of the input voltage source is input at node 1, and at each clock pulse, the current pulse toggles from ON to OFF and vice versa, indicating the presence and absence of a quantized charge of the Cooper electron pair on the island with each clock pulse.

Figure 32:
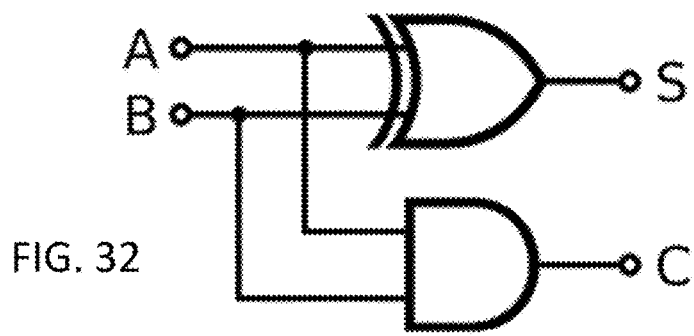
FIG. 32 shows a half-adder circuit according to one embodiment of the present invention.

In one embodiment, as shown in FIG. 32, the superconducting circuit device is a QPSJ based half-adder comprising the AND and XOR gates along with splitters to split the input pulses to both the XOR and AND gates.

Figure 34:
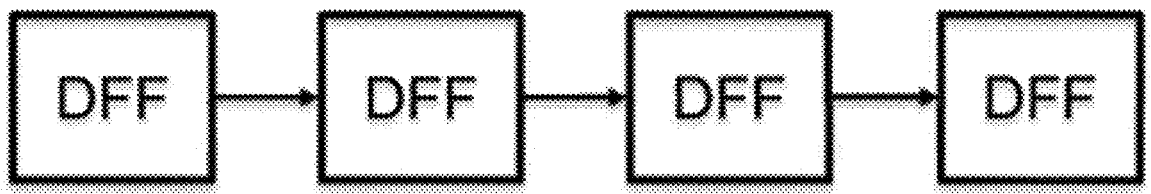
FIG. 34 shows a 4-stage shift register using the D flip-flops according to one embodiment of the present invention.

In one embodiment, as shown in FIG. 34, the superconducting circuit device is a QPSJ based shift register comprising a plurality of stages connected in series, each stage comprising the D flip-flop and having a different but identical clock input.

Figure 36:
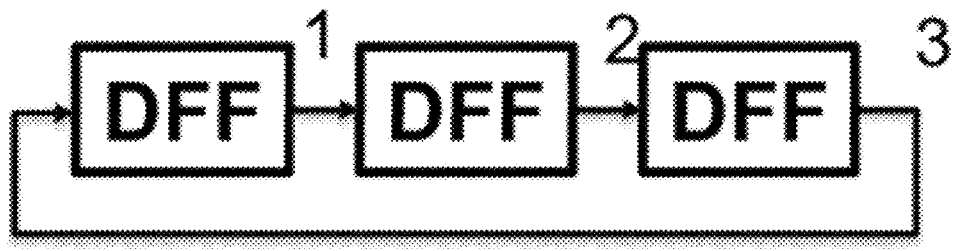
FIG. 36 shows a ring counter using D flip-flops according to one embodiment of the present invention.

In one embodiment, as shown in FIG. 36, the superconducting circuit device is a QPSJ based ring counter comprising a plurality of stages connected to one another in a ring.

Figure 38:
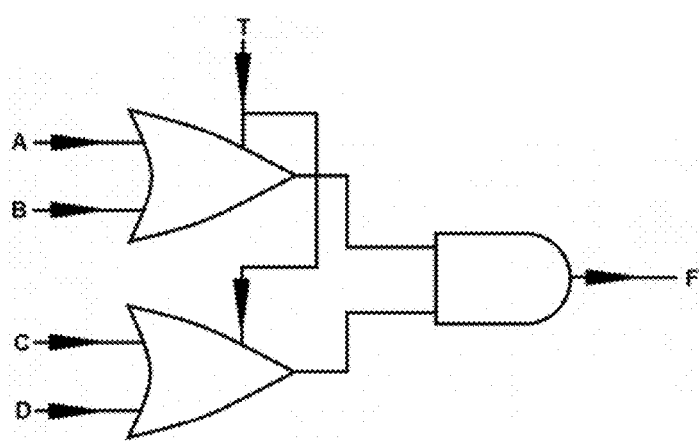
FIG. 38 shows an OR-AND logic circuit according to one embodiment of the present invention.

In one embodiment, as shown in FIG. 38, the superconducting circuit device is a QPSJ based OR-AND circuit.

Figure 40:
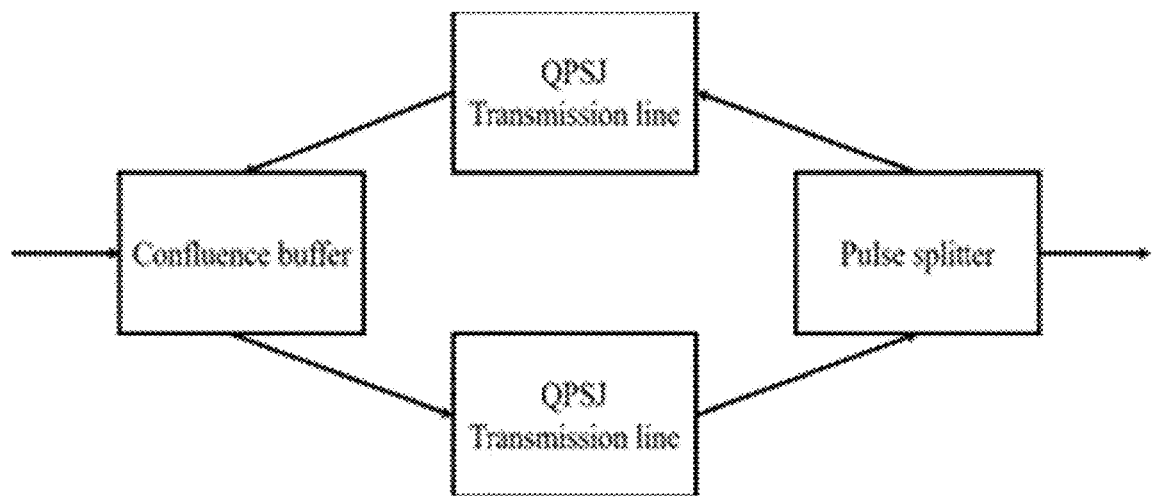
FIG. 40 shows a block diagram of a QPSJ based ring oscillator according to one embodiment of the present invention.

In one embodiment, as shown in FIG. 40, the superconducting circuit device is a QPSJ based ring oscillator comprising two QPSJ transmission lines, a confluence buffer and a pulse splitter, where the confluence buffer is connected to the first QPSJ transmission lines that in turn is connected to the pulse splitter, the pulse splitter is connected to the second QPSJ transmission lines that in turn is connected to the confluence buffer.

In one embodiment, the superconducting circuit device further includes at least one CQL cell, each CQL cell comprising at least one QPSJ, and at least one JJ coupled with the at least one QPSJ to perform one or more logic operations, where each JJ is configured such that when an input current through said JJ exceeds a critical value, a single flux quantum pulse tunnels across said JJ as an output, when the input current is less than the critical value, no single flux quantum pulse tunnels across said JJ as the output, where the presence and absence of the single flux quantum pulse in the output form two logic states.

In one embodiment, as shown in FIG. 45, the CQL cell comprises two QPSJs defining a QPSJ island with a capacitor, and two JJs defining a JJ loop with a inductor, and the QPSJ island and the JJ loop is connected in series to perform a bridge operation between flux and charge.

In one embodiment, as shown in FIG. 47, the CQL cell further comprises a third QPSJ having a first terminal connected to a node between the QPSJ island and the JJ loop, and a second terminal connected to a bias voltage source, where in operation, a voltage pulse is induced through the third QPSJ that enables or disables the output pulse.

In yet another aspect, the invention relates to a superconducting circuit device comprising at least one of one or more JJs and one or more QPSJs.

In one embodiment, the one or more QPSJs are adapted for receiving at least one input and responsively providing at least one output, each QPSJ being configured such that when an input voltage of an input voltage pulse exceeds a critical value, a quantized charge of a Cooper electron pair tunnels across said QPSJ as an output, when the input voltage is less than the critical value, no quantized charge of the Cooper electron pair tunnels across said QPSJ as the output, wherein the presence and absence of the quantized charge that is realizable as a constant area of current pulses in the output form two logic states, and wherein the at least one QPSJ is biased with a bias voltage.

In one embodiment, the bias voltage is about 50-95% of the critical voltage, the input voltage is at least about 110% of the critical voltage for quantized charge tunneling.

In one embodiment, each QPSJ is characterizable as a compact circuit model, wherein the compact circuit model comprises a voltage source, a phase-slip junction, an inductor representing an inductance of a nano-wire of the phase-slip junction, and a non-linear resistor having different values of resistance in different phases of operation and showing normal to superconductor transition as a function of the voltage across the phase-slip junction, coupling to each other in series.

In one embodiment, the critical voltage, the inductance, and the resistance are determined by material properties and physical dimensions of the QPSJ.

In one embodiment, the one or more QPSJs comprise two QPSJs, wherein a node connecting two QPSJs and a capacitor defines a charge island.

In one embodiment, when the quantized charge of the Cooper electron pair tunnels across one of the two QPSJs, the quantized charge of the Cooper electron pair is stored in the charge island, otherwise no quantized charge of the Cooper electron pair is stored in the charge island, thereby forming a basic logic element having the two logic states.

In one embodiment, the one or more QPSJs forms a QPSJ transmission line, wherein the one or more QPSJs comprise a plurality of QPSJs connected to one another in series, wherein each node connecting two adjacent QPSJs and a capacitor defines a charge island.

In one embodiment, the quantized charge of the Cooper electron pair is stored in a charge island or forced to hop to its immediately next charge island, by design of or tuning a capacitance of the charge island, along with the junction parameters, thereby transferring the quantized charge of the Cooper electron pair along the QPSJ transmission line.

In one embodiment, amplification or attenuation of the current pulse amplitude is obtained by using the QPSJs of different critical voltages and different capacitor values.

In one embodiment, the one or more QPSJs forms a QPSJ pulse splitter, wherein the one or more QPSJs comprise three QPSJs, where the first QPSJ has a first terminal connected to an input voltage source defining an input node, and a second terminal connected to a first capacitor; the second QPSJ has a first terminal connected to the second terminal of the first QPSJ, and a second terminal connected to a second capacitor and a first bias voltage source defining a first output node; and the third QPSJ has a first terminal connected to the second terminal of the first QPSJ, and a second terminal connected to a third capacitor and a second bias voltage source defining a second output node. In operation, an input pulse at the input node is split into two pulses output from the first and second output nodes respectively.

In one embodiment, the one or more QPSJs forms a QPSJ buffer, wherein the one or more QPSJs comprise three QPSJs, wherein the first QPSJ has a first terminal connected to an input voltage source or a first bias voltage source defining a first node, and a second terminal connected to a first capacitor defining a second node; the second QPSJ has a first terminal connected to the second terminal of the first QPSJ defining a third node, and a second terminal connected to a second capacitor and the first bias voltage source or the input voltage source defining a fourth node; and the third QPSJ has a first terminal connected to the third node, and a second terminal connected to a second bias voltage source. In operation, an input pulse from the first node through the first QPSJ switches to the third QPSJ, before it switches to the second QPSJ so as to prevent a signal flow in a direction from the first node to the fourth node, or when current arrives from an opposite direction, the first QPSJ switches before the third QPSJ, allowing the signal through.

In one embodiment, the one or more QPSJs forms a QPSJ confluence buffer, wherein the one or more QPSJs comprise four QPSJs, wherein the first QPSJ has a first terminal connected to a first input voltage source, and a second terminal connected to a first capacitor defining node 3; the second QPSJ has a first terminal connected to a second input voltage source, and a second terminal connected to a second capacitor defining node 6, wherein both nodes 3 and 6 are connected to node 7; the third QPSJ has a first terminal connected to node 7, and a second terminal connected to a first bias voltage source; and the fourth QPSJ has a first terminal connected to node 7, and a second terminal connected to a third capacitor and the second bias voltage source at node 8, wherein in operation, input pulses from either the first or second input voltage sources result in an output pulse from node 8, but do not result in output from the other input.

In one embodiment, the one or more QPSJs forms a QPSJ based OR gate, wherein the one or more QPSJs comprise six QPSJs, wherein the first to fourth QPSJs define the confluence buffer and the fifth and sixth QPSJs define an island, wherein the confluence buffer is connected to the island in series such that a first terminal of the fifth QPSJ is connected to the output terminal of the confluence buffer and a second terminal of the sixth QPSJ is connected to a clock signal of a third input voltage source that is connected to a second bias voltage source.

In one embodiment, the one or more QPSJs forms a QPSJ based AND gate, wherein the one or more QPSJs comprise five QPSJs, wherein the first to fourth QPSJs define the confluence buffer and the fifth QPSJ has a first terminal connected to the output terminal of the confluence buffer and a second terminal connected to a second bias voltage source, and the output terminal of the confluence buffer is connected to a clock signal of a third input voltage source that is connected to a second bias voltage source.

In one embodiment, the one or more QPSJs forms a QPSJ based XOR gate, wherein the one or more QPSJs comprise four QPSJs, wherein the first to fourth QPSJs define the confluence buffer and the output terminal of the confluence buffer is connected to a clock signal of a third input voltage source that is connected to a second bias voltage source.

In one embodiment, the one or more QPSJs forms an RS flip-flop or a D flip-flop, wherein the one or more QPSJs comprise two QPSJs, wherein the first QPSJ has a first terminal connected to a bias voltage source at node 2 that in turn is connected to a first input voltage source connected to node 1, a second terminal connected node 3 that in turn is connected to a capacitor; and the second QPSJ has a first terminal connected to node 3, and a second terminal connected to node 4 that is in turn connected to the second input voltage source.

In one embodiment, the one or more QPSJs forms the RS flip-flop, wherein in operation, a SET input signal at node 1 induces a quantized charge of the Cooper electron pair to the island of node 3, and a RESET input signal at node 4 induces a current pulse opposite to that induced by the SET input signal so as to reset the charge on the island.

In one embodiment, the one or more QPSJs forms the D flip-flop, wherein in operation, a SET input signal at node 1 induces a quantized charge of the Cooper electron pair to the island of node 3, and a RESET input signal at node 4 is a clock signal that switches the first QPSJ and induces a quantized charge of the Cooper electron pair on the island, and with the next clock pulse, the charge flows through an output terminal to perform a function of the D flip-flop.

In one embodiment, the one or more QPSJs forms a T flip-flop, wherein the one or more QPSJs comprise two QPSJs, wherein the first QPSJ has a first terminal connected to a bias voltage source at node 3 that in turn is connected to an input voltage source at node 2, the input voltage source connected to node 1, a second terminal connected node 4 that in turn is connected to a capacitor; and the second QPSJ has a first terminal connected to node 4, and a second terminal connected to node 2. In operation, a single clock signal of the input voltage source is input at node 1, and at each clock pulse, the current pulse toggles from ON to OFF and vice versa, indicating the presence and absence of a quantized charge of the Cooper electron pair on the island with each clock pulse.

In one embodiment, each of the one or more JJs is configured such that when an input current through said JJ exceeds a critical value, a single flux quantum pulse tunnels across said JJ as an output, when the input current is less than the critical value, no single flux quantum pulse tunnels across said JJ as the output, wherein the presence and absence of the single flux quantum pulse in the output form two logic states.

In one embodiment, the one or more QPSJs comprise two QPSJs defining a QPSJ island with a capacitor, and the one or more JJs comprises two JJs defining a JJ loop with a inductor, and the QPSJ island and the JJ loop is connected in series to perform a bridge operation between flux and charge.

In one embodiment, the one or more QPSJs further comprises a third QPSJ having a first terminal connected to a node between the QPSJ island and the JJ loop, and a second terminal connected to a bias voltage source, wherein in operation, a voltage pulse is induced through the third QPSJ that enables or disables the output pulse.

In one embodiment, the superconducting circuit device further comprises at least one complementary quantum logic (CQL) cell, each CQL cell comprising at least one QPSJ, and at least one JJ coupled with the at least one QPSJ to perform one or more logic operations.

In one embodiment, the CQL cell comprises two QPSJs defining a QPSJ island with a capacitor, and two JJs defining a JJ loop with a inductor, and the QPSJ island and the JJ loop is connected in series to perform a bridge operation between flux and charge.

In one embodiment, the CQL cell further comprises a third QPSJ having a first terminal connected to a node between the QPSJ island and the JJ loop, and a second terminal connected to a bias voltage source, wherein in operation, a voltage pulse is induced through the third QPSJ that enables or disables the output pulse.

Without intent to limit the scope of the invention, exemplary methods and their related results according to the embodiments of the present invention are given below. Note that titles or subtitles may be used in the examples for convenience of a reader, which in no way should limit the scope of the invention. Moreover, certain theories are proposed and disclosed herein; however, in no way they, whether they are right or wrong, should limit the scope of the invention so long as the invention is practiced according to the invention without regard for any particular theory or scheme of action.

Spice Model Implementation of QPSJ

In one aspect, the present invention relates to implementations of a dual to a resistively and capacitively shunted junction (RCSJ) based JJ SPICE model to model a QPSJ in JSPICE for exploration and demonstration of circuit operations of QPSJ devices. By means of a SPICE model developed for quantum phase-slip junctions, switching of the island to produce quantized-charge pulses with quantized area of 2e as that of the charge of a Cooper pair in a superconductor is demonstrated. The mode of operation of a QPSJ is established, based on a range of device parameters.
Compact Model of QPSJ Quantum phase-slip is a superconducting phenomenon where the phase difference across a nano-wire changes by $2\pi$ with the suppression of superconducting order parameter to zero, that is, a temporary decay of superconductivity in a continuous superconducting nanowire. This event occurring at a point in the nano-wire introduces a Coulomb blockade, i.e., blockade of current/electric charge through the wire essentially behaving like an insulator. The phase-slip event is caused by a quantum unit of magnetic flux tunneling across the nanowire through the insulating substrate/layer on which the device is fabricated. This was observed as a resistance tail below superconducting transition in experiments [24, 27, 45]. This phenomenon has been identified as a dual process to Josephson tunneling. While a charge tunnels between two superconducting regions across an insulating barrier in a Josephson junction (JJ), inducing a flux quantum in the corresponding loop, a QPSJ can be viewed as flux tunneling across a superconducting nano-wire (barrier for flux) creating a voltage drop at the ends of the wire. The duality between Josephson tunneling and quantum phase-slip can be characterized by the charge-flux relationship in Maxwell's equations. Therefore, a dual-device to a JJ, called a QPSJ, can be established. Accordingly, an I-V relationship of a QPSJ can be obtained by replacing phase by charge, current term by voltage term and capacitance term by inductance term [25]. The two equations that describe a QPSJ are therefore given by:

$$V = V_C \sin(q) + L\frac{dI}{dt} + RI \quad (1)$$

where $$I = \frac{2e}{2\pi}\frac{dq}{dt} \quad (2)$$

Here, V is the voltage across the junction, $V_C$ is the critical voltage of the QPSJ, L is the geometric inductance of the QPSJ, I is the current through the junction, R is the normal resistance of the QPSJ, and q is the charge equivalent in the QPSJ normalized to the charge of a Cooper pair (2e) and the term $$\frac{1}{2\pi}$$

to represent q as a phase corresponding to charge. Therefore, the relation of q to charge 2e is equivalent to relation of superconducting phase $\phi$ and flux quantum $\Phi_0$, with e being charge of an electron. In practical implementation, the various parameters of the junction can be varied by varying the physical dimensions and material of the junction.

The mathematical description above can be described in a circuit model as shown in FIG. 1. The first term in Eqn. (1), which represents voltage across a quantum phase-slip event, can be re-written to describe the device as a capacitor with kinetic capacitance $C_k$, given by:

$$C_k = \frac{2e}{2\pi V_C \cos(q)} \quad (3)$$

Hence, the circuit shown in FIG. 1 can be treated as a series RLC circuit. An over-damped QPSJ for the charge-based logic family is thus analogous to the JJ in RSFQ logic. From the circuit and the description given by Eqns. (1) and (2), a damping parameter for a QPSJ is given by:

$$\beta_L = \frac{2\pi V_C L}{2eR^2} \quad (4)$$

$\beta_L \ll 1$ indicates an over-damped junction and $\beta_L \gg 1$ represents an under-damped junction. With $\beta_L \approx 1$, the junction is critically damped.

As shown in FIG. 1, the compact model for the QPSJ used for SPICE implementation has a voltage source, a non-linear resistor that has different values of resistance in different phases of operation and also shows normal to superconductor transition as a function of the voltage across the device, an inductor that represents the inductance of the nano-wire and the ideal QPSJ device in series.

The SPICE model described by the Eqns. (1) and (2) cannot sufficiently calculate quantum behavior by itself, which is the key to the generation of digital logic bits based on quantized charge trapping between QPSJs as explained in detail below. To simulate the quantum behavior of the device, the time-steps for numerical calculations of differential equations above must be limited to quantized values that are smaller than the time scale corresponding to plasma frequency of the junction. The time-step limit $\Delta t$ applied to the simulations of the SPICE model is given by.

$$\Delta t = \frac{0.1}{\left(\frac{2\pi}{2e}\frac{V_C}{L}\right)^{1/2}} \quad (5)$$

This model is generic and is valid to simulate any device similar to a QPSJ with inductance and resistance values not necessarily corresponding to a valid set to experimentally increase the probability of high quantum phase-slip rate.

MNA Stamp and RHS Vector of QPSJ

In certain embodiments, modified nodal analysis (MNA) [46] is used in the SPICE to solve the circuits to calculate nodal voltages as well as branch currents of linear or non-linear devices for all types of analysis in the SPICE. All the devices are represented in the form given by Eqn. (6). The MNA stamp and RHS vector valid for transient analysis of a QPSJ are thus obtained and are suitable for implementation in the SPICE. The inductor portion of the model is solved using a trapezoidal method and the non-linear resistor along with the ideal QPSJ equation is solved using a Newton-Raphson method. Convergence of the model is verified under different simulation conditions. The MNA stamp which is a 3×3 matrix and an RHS vector of the device is given by Eqn. (7). The third row and third column of the matrix give the numerical solution for the combination of inductor and an ideal QPSJ, while the other 2×2 section of the equation represents the non-linear resistor.

$$[I] = [Y][V] + [RHS] \quad (6)$$

$$\begin{bmatrix} I_3 \\ I_0 \\ V \end{bmatrix} = \begin{bmatrix} g & -g & 1 \\ -g & g & -1 \\ 1 & -1 & \frac{-2L}{\Delta} + V_C\left(\frac{2\pi}{2e}\right)\left(\frac{\Delta}{2}\right)\cos\left(\frac{2\pi q_L}{2e}\right) \end{bmatrix} \begin{bmatrix} V_3 \\ V_0 \\ I \end{bmatrix} + \begin{bmatrix} -G(I) + gI \\ g(I) - gI \\ -L\left(I' + \frac{-2I_L}{\Delta}\right) + V_C\left[\left(\frac{2\pi}{2e}\right)\left(\frac{\Delta L}{2}\right)\cos\left(\frac{2\pi q_L}{2e}\right) + \sin\left(\frac{2\pi q_L}{2e}\right)\right] \end{bmatrix} \quad (7)$$

In this equation (7), G is the conductance of the junction corresponding to the resistance term in Eqn. (1). g is the first derivative of G with respect to current I through the device. $q_L$ is the charge in the device in previous iteration. $I_L$ is the current through the device in previous iteration. $\Delta$ is the time step, which is usually assigned by the SPICE programs but can be changed manually if required. $V_3$, $V_0$ and $I_3$, $I_0$ are the voltages and currents at nodes 3 and 0 of the circuit shown in FIG. 1, and V, I are the voltage across and the current through the junction, respectively. The above equation (7) is therefore valid for time domain calculations with each calculation representing an instant of the operation of the device.

SPICE Simulations of I-V Characteristics of QPSJ

Programs for the QPSJ model were developed in a programming language C that is compatible with JSPICE3 by using the above MNA stamp and RHS vector along with additional initial condition checks, voltage limits for operation of the device, calculation of required model parameters from user input parameters and convergence flags. These programs were integrated with JSPICE3 for application in circuit simulations with other electronic components, including JJs. QPSJ model parameters including length, critical voltage, inductance, and resistances (phase-slip and normal) are assigned as user changeable parameters.

In certain embodiments, the input parameters that can be controlled by the user while performing QPSJ simulations are discussed, along with the default values that are assigned to these parameters when the user does not provide values for them.

Critical voltage: the default value for $V_C$ is 700 μV. The range of the values that can be assigned to $V_C$ is from 10 μV to 0.1V. The range cannot be changed by the user. But it can be modified in the Verilog-A program. Below the critical voltage, the device has ideal quantum phase-slip characteristics, along with geometric inductance of the device and a sub-gap resistance that might be caused due to quasi-particles. These parameters can however be set to zero and are discussed later.

Initiall charge: the charge q is calculated from the current through the device from previous instant of time in transient analysis and is the total charge that has passed through the junction in time t till that instant. It is given by Eqn. (8) below:

$$q = q_{ic} + \int eI(t)dt \quad (8)$$

where I(t) is the current through the junction which is a function of time and e is the charge of an electron, $e=1.9625\times 10^{-19}$ Coulombs. A function exists in the WRSPICE, which performs numerical integration when Eqn. (4) is presented. This is also valid for Verilog-A models. The In JSPICE however, a numerical analysis for the integration must be performed manually by defining a time-step and multiplying current at each instant by the time-step to calculate the total charge. $q_{ic}$ is the initial condition charge, that can be assigned by the user to represent a charged device which can aid in convergence. It has a default value of 0 and can take any value.

Inductance: this is the total inductance of the device as seen in second term of Eqn. (1). It can include both the geometrical and kinetic inductance of the device and has a default value of 890 nH

TABLE 1

Default parameters assigned for QPSJ in JSPICE

| Parameter | Units | Default value |
| --- | --- | --- |
| Junction critical voltage | Volts (V) | $700 \times 10^{-6}$ |
| Junction inductance | Henry (H) | $890 \times 10^{-9}$ |
| Normal state resistance | Ohms (Ω) | $1.6 \times 10^{6}$ |

Table 1 provides the user parameters with their default values. These values are chosen to match measurements and simulation results from reference [44]. A representative circuit with a voltage source, series resistor and a QPSJ in series shown in FIG. 2 has been simulated with a piece-wise linear function for voltage source of −1.2 mV to 1.2 mV in 4 ns. The resultant I-V characteristics are shown in FIG. 3.

Figure 2:
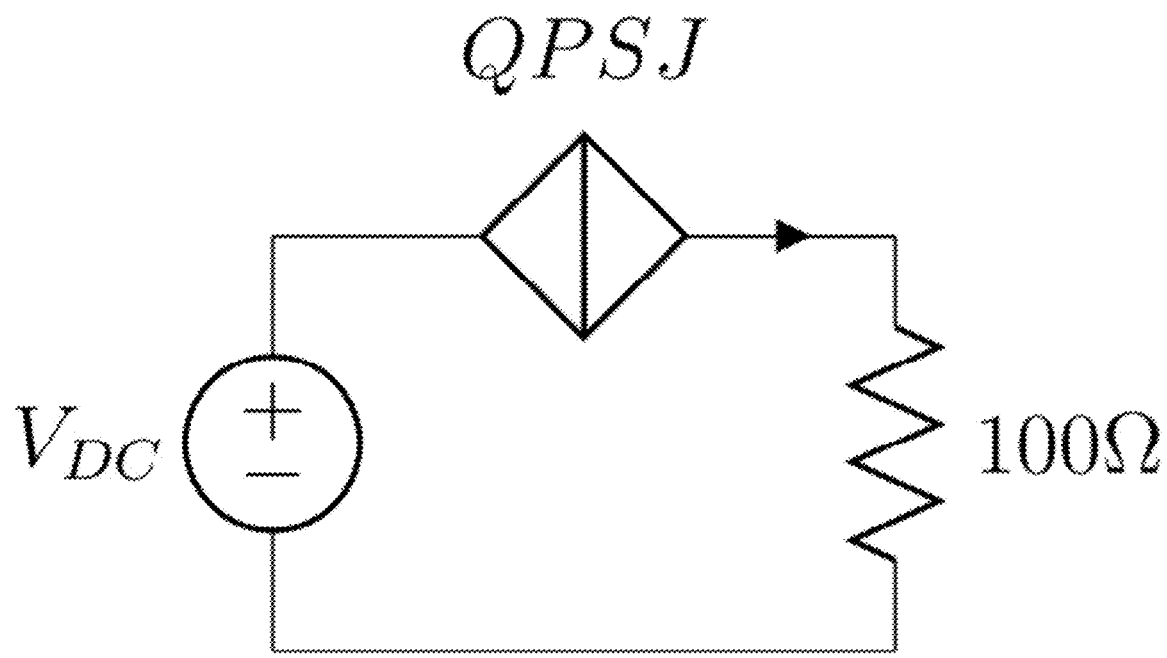
FIG. 2 shows a QPSJ circuit for simulation with piecewise linear function for voltage V from −1.2 mV to 1.2 mV in 4 ns and series resistor R=100Ω, according to one embodiment of the present invention.
Figure 3:
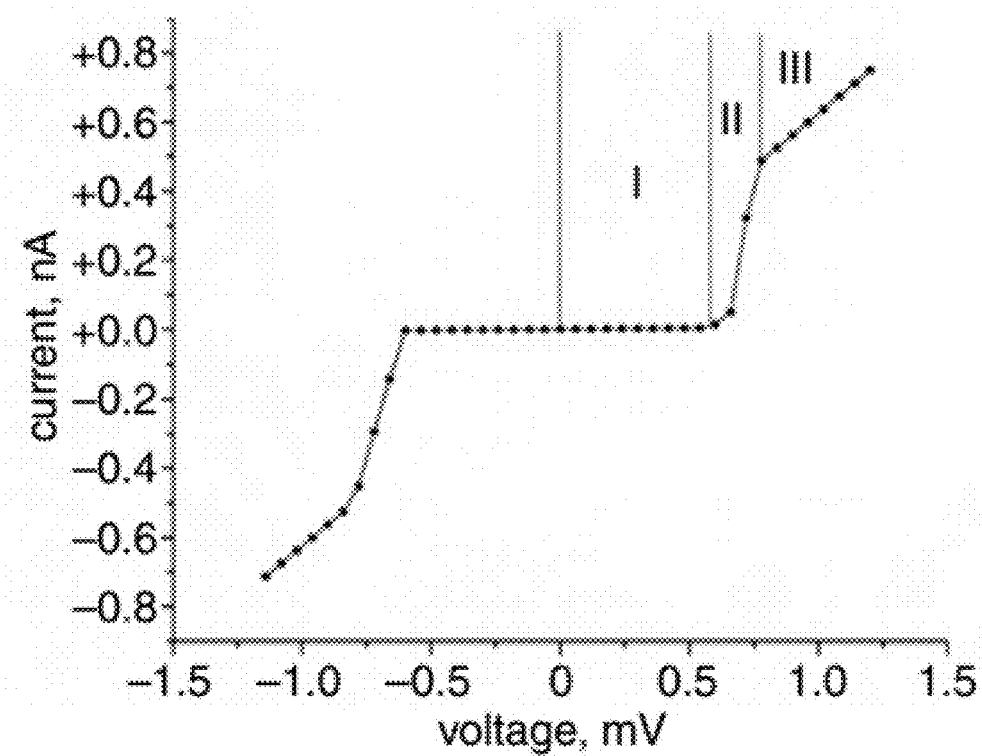
FIG. 3 shows current-voltage (I-V) characteristics of the QPSJ circuit shown in FIG. 2, according to one embodiment of the present invention, which is simulated in JSPICE using relevant model parameters.

The transient I-V characteristics shown in FIG. 3 represent voltage at node 1 and current through the QPSJ in FIG. 2. The device therefore exhibits a phase-slip event with a quantum phase-slip voltage below the critical voltage of 0.7 mV. This is denoted as region I in FIG. 3.

In this region, there is a very small current (about 10 pA) with a voltage pulse observed across the device below the superconducting transition. In region II of the I-V characteristics shown in FIG. 3, a supercurrent is observed below the critical voltage with a small sub-gap resistance and increasing current until the current reaches the critical current density of the device.

When the current is above the critical current of the device (region III of the I-V characteristics shown in in FIG. 3), the I-V curve representing a resistor is observed with corresponding normal resistance value. Similar behavior is observed with a negative voltage across the device as the device model is designed to be insensitive to the voltage polarity. The obtained I-V characteristics are similar to the calculations performed and measurements made for the parameters in Table 1 and in reference [44]. This verifies that the SPICE model is accurate under these conditions and can perform transient analyses of QPSJs to enable studies of advanced circuit configurations.

Figure 4:
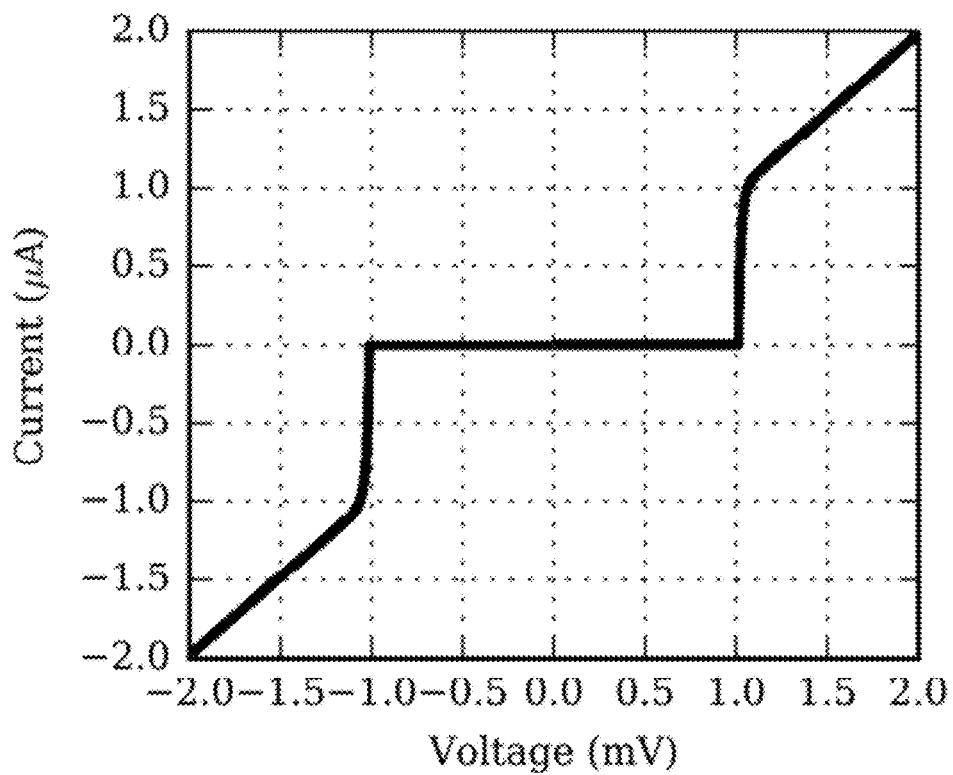
FIG. 4 shows I-V characteristics of the compact circuit model of the QPSJ shown in FIG. 1 with $V_C$=1 mV, L=20 nH and R=1 kΩ, according to one embodiment of the present invention.

Silimiar I-V characteristics of the compact circuit model of QPSJ shown in FIG. 1 are obtained in the SPICE simulation and illustrated in FIG. 4, where $V_C$=1 mV, L=20 nH and R=1 kΩ. Note that a linear resistance function with a resistance value equal to the normal resistance of the QPSJ is used here.

These results clearly show that the QPSJ at at low voltages is a perfect insulator.

Device Parameter Evaluation

The junction parameters used to obtain the I-V characteristics shown in FIG. 4 are somewhat arbitrary and, therefore, they may or may not be applicable for a practical junction. These parameters depend on the material properties and physical dimensions of the device and have constraints depending on parameter values that can produce quantum-phase slips. These constraints are detailed in [24, 47] in the form of models associating various material and design parameters to characteristic energies corresponding to quantum phase-slip processes.

The critical voltage $V_C$ is related to the phase-slip energy by:

$$V_C = \frac{2\pi E_s}{2e} \quad (9)$$

where $E_s$ is the phase-slip energy, which can be calculated using the model by Mooij et al. [9]. The normal resistance R is calculated from normal-state resistivity of the given material and physical dimensions of the nano-wire that forms the QPSJ. The inductance L of the junction is related to inductive energy $E_L$, which is a function of normal resistance R and critical temperature of the material [49]. As explained in [47], the parameters satisfying the condition $0.1 \le \alpha \le 1$, where $$\alpha = \frac{E_s}{E_L}$$

are expected to be suitable for quantum phase-slip junctions.

Figure 5:
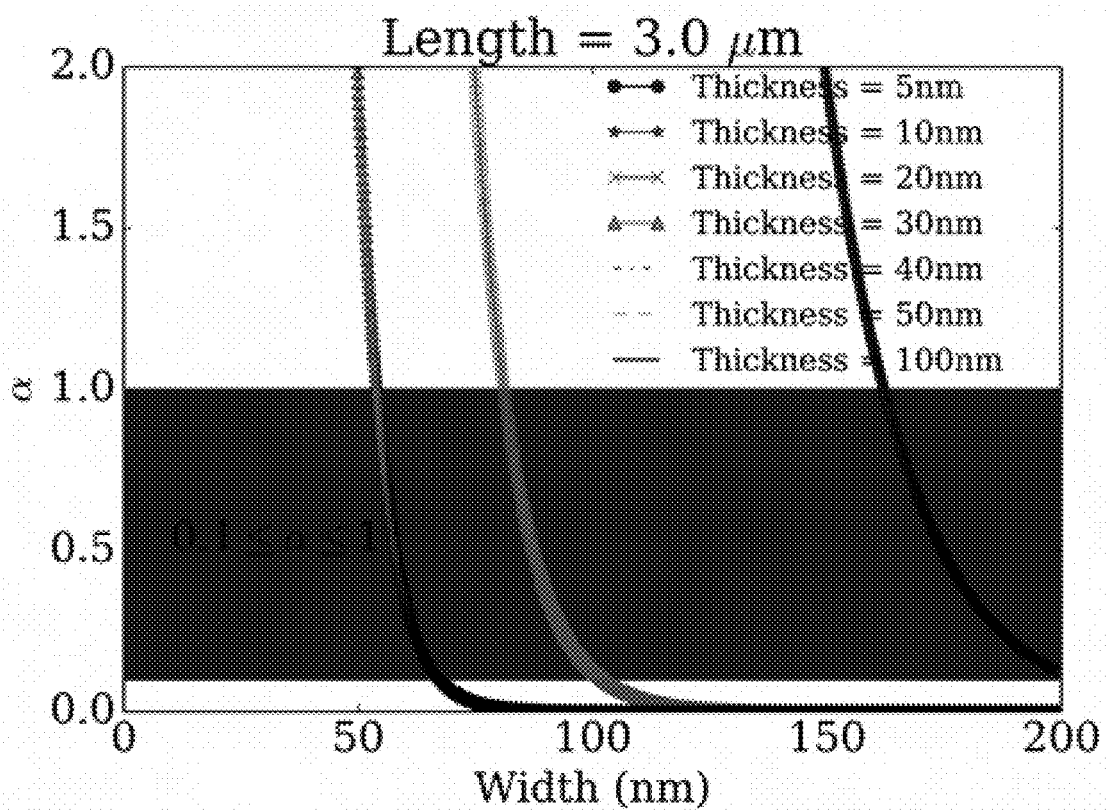
FIG. 5 shows design parameter evaluation for InOx, where the shaded region shows design parameter combinations satisfying conditions for forming a QPSJ, according to one embodiment of the present invention.
Figure 6:
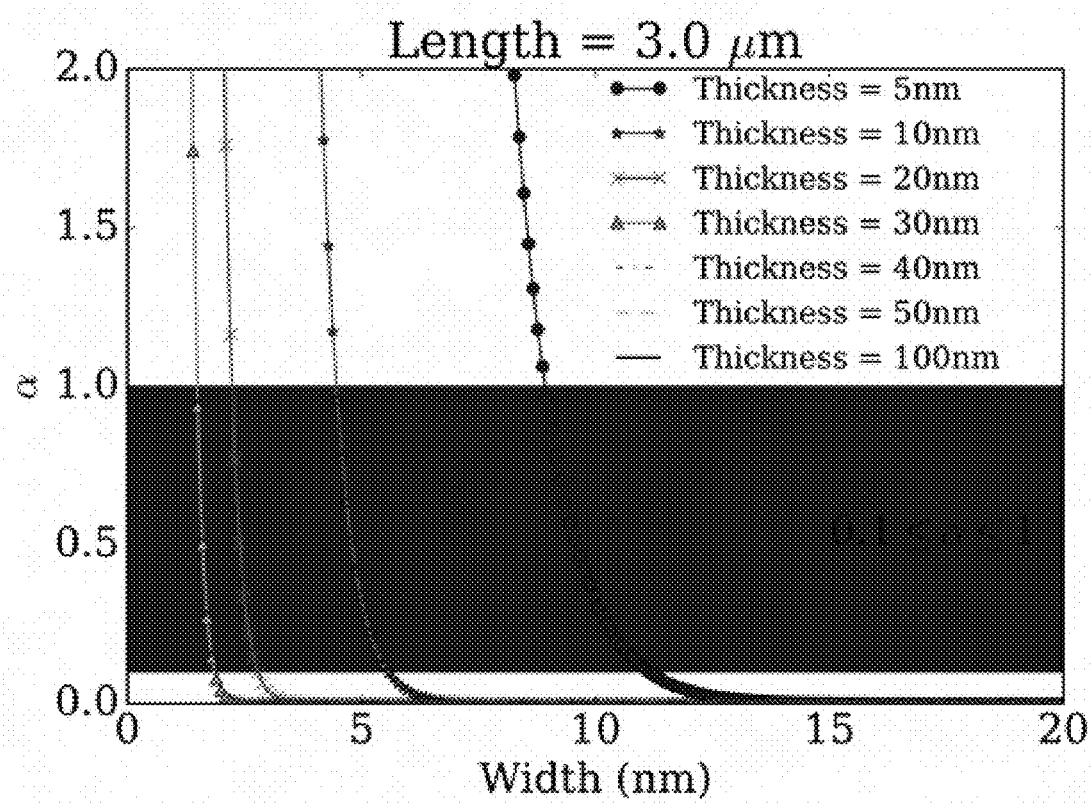
FIG. 6 shows design parameter evaluation for NbN, where the shaded region shows design parameter combinations satisfying conditions for forming a QPSJ, according to one embodiment of the present invention.

Two different materials, among others hypothesized as suitable for QPSJs [42, 44, 47, 48], InOx and NbN, are considered for parameter evaluation. Values of a subset of design parameters satisfying the $0.1 \le \alpha \le 1$ condition for both materials are represented in FIGS. 5 and 6, respectively. Note that there is a range of combinations of design parameters satisfying the conditions for the same materials.

By considering an InOx junction of length=3 µm, width=70 nm and thickness=20 nm from shaded region of FIG. 5, it is obtained that the device parameters of the critical voltage $V_C$=14.7 mV, normal resistance R=300 kΩ and inductance L=2.8 nH. Similarly, when considering an NbN junction of length=3 µm, width=10 nm and thickness=5 nm, it is obtained that the device parameters of the critical voltage $V_C$=2.94 mV, normal resistance R=37.2 kΩ and inductance L=14.24 nH. These parameters can be directly used with the QPSJ SPICE model in the WRSPICE to obtain I-V characteristics. These values are also used to compute circuit and bias parameters suitable for the junction to exhibit quantized switching characteristics, for use in logic operations, when appropriate circuits are designed using these junctions.

Switching Characteristics and Current Pulses with Quantized Area of QPSJ

Figure 7:
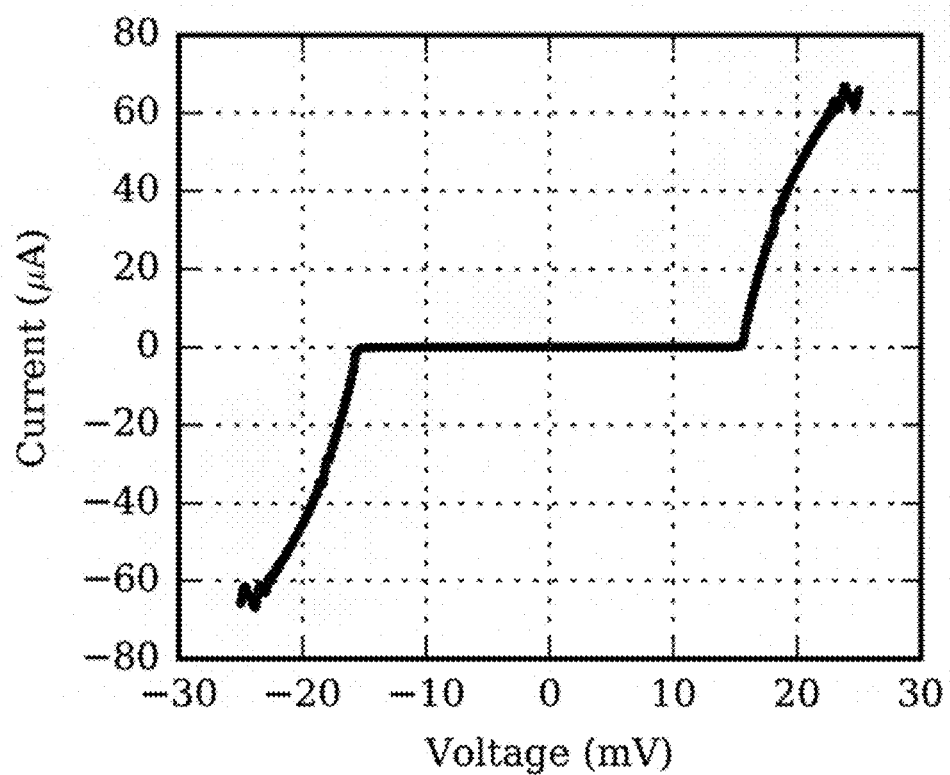
FIG. 7 shows I-V characteristics of InOx based QPSJ simulated in WRSPICE with $V_C$=14.7 mV, R=300 kΩ, L=2.8 nH, according to one embodiment of the present invention.
Figure 8:
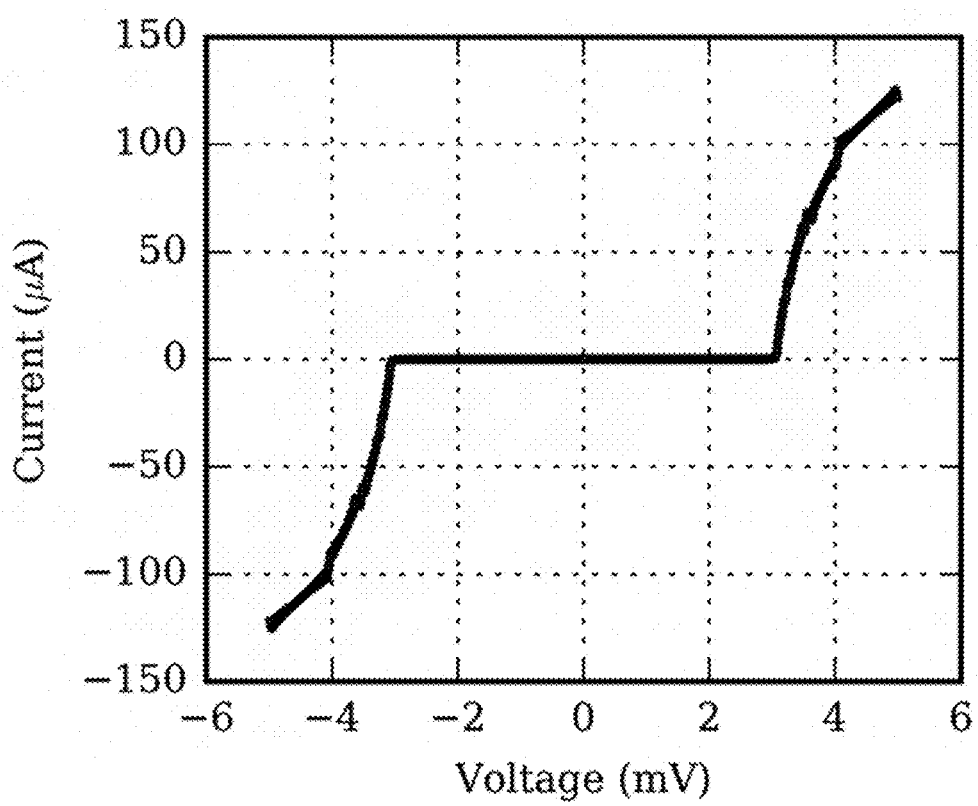
FIG. 8 shows I-V characteristics of NbN based QPSJ simulated in WRSPICE with $V_C$=2.94 mV, R=37.2 kΩ, L=14.24 nH, according to one embodiment of the present invention.

The QPSJ parameters computed in the previous section are used to obtain I-V characteristics of the corresponding junctions. FIG. 7 shows the characteristics of an InOx junction where $V_C$=14.7 mV, R=300 kΩ, L=2.8 nH while FIG. 8 shows the characteristics of an NbN junction where $V_C$=2.94 mV, R=37.2 kΩ, L=14.24 nH. The I-V characteristics are obtained by sweeping voltage across the junctions and measuring currents in the WRSPICE. The Coulomb blockade characteristic of QPSJs [44, 47] are clearly shown at low voltages. Since the SPICE model is valid only for transient analysis [21], the curves demonstrate oscillatory characteristics in some regions.

Since the QPSJ can be described as a dual to the Josephson junction based on flux-charge duality of Maxwell's equations, a quantized charge operation of the QPSJ can be predicted that can lead to practically-implementable logic device dual to the single-flux-quantum (SFQ) logic. When the QPSJ is in an appropriate operating region, a switching event produces a current pulse with a quantized area corresponding to a charge of a Cooper pair (2e) described by:

$$\int I dt = \int_0^{2\pi} \frac{2e}{2\pi} dq = 2e = 3.204 \ldots \times 10^{-19} \text{ C} \quad (10)$$

Based on the device model shown in FIG. 1 and described by Eqns. (1) and (2), the QPSJ is equivalent to a series RLC oscillator. This oscillator must be over-damped in order to produce quantized-area switching characteristics similar to a Josephson junction in SFQ logic [5].

Figure 9:
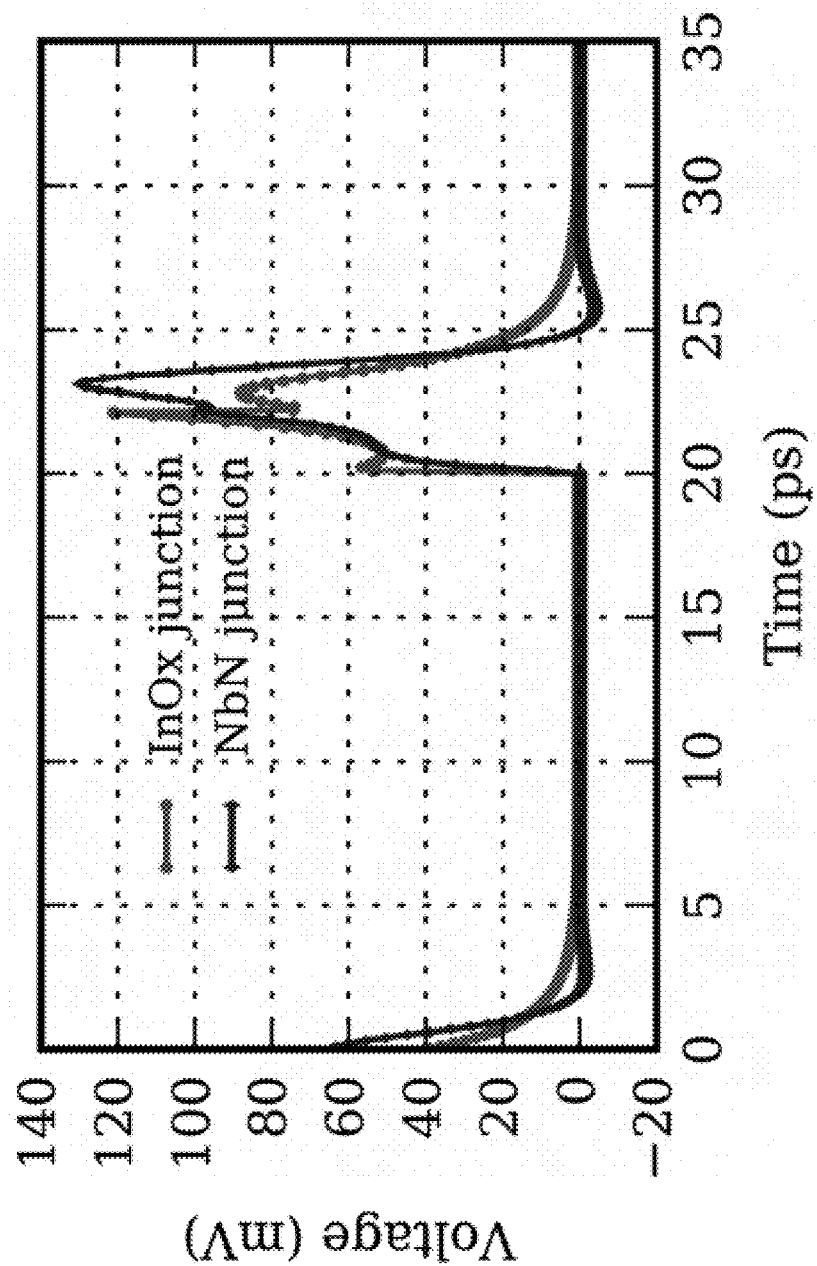
FIG. 9 shows switching characteristics of a QPSJ according to one embodiment of the present invention, which demonstrates a quantized-area current pulse (with a value=2e) for charge-based logic for two material systems.

Switching characteristics with a quantized-area current pulse are demonstrated by exciting a circuit having a QPSJ below its critical voltage, using a short voltage pulse that drives the junction above its critical voltage. Plots demonstrating quantized-area current pulses with quantized area equal to 2e, for both InOx and NbN junctions with parameters taken from FIGS. 7 and 8, are shown in FIG. 9. These junctions are over-damped by default and do not require additional damping resistors in series. The integrated area under these curves is equal to 2e, demonstrating the proper charge pulse.

The single quantized charge-based logic uses short, picosecond, current pulses as the basic logic signals. These current pulses have a quantized area under the curve, which represent the total charge traveled along the nano-wire. Therefore, the presence and absence of the current pulse form the two logic states, similar to the voltage pulse in RSFQ logic [5]. The quantized area under the current pulse curve is given by Eqn. (10).

From Eqn. (1), the charge of 2e corresponds to the immediate excited energy state of a fluxon tunneling across the nano-wire which is a QPSJ [26]. If the junction is over-damped (or critically damped), the total charge through the junction with a bias voltage slightly over $V_C$ is restricted to charge 2e through it, with further oscillations damped, without further excitations.

The treatment of charge variable q of a QPSJ is analogous to the treatment of Josephson junction phase ϕ.

$$\frac{2e}{2\pi} \leftrightarrow \frac{\Phi_0}{2\pi} \text{ or } q \leftrightarrow \phi$$

Figure 10:
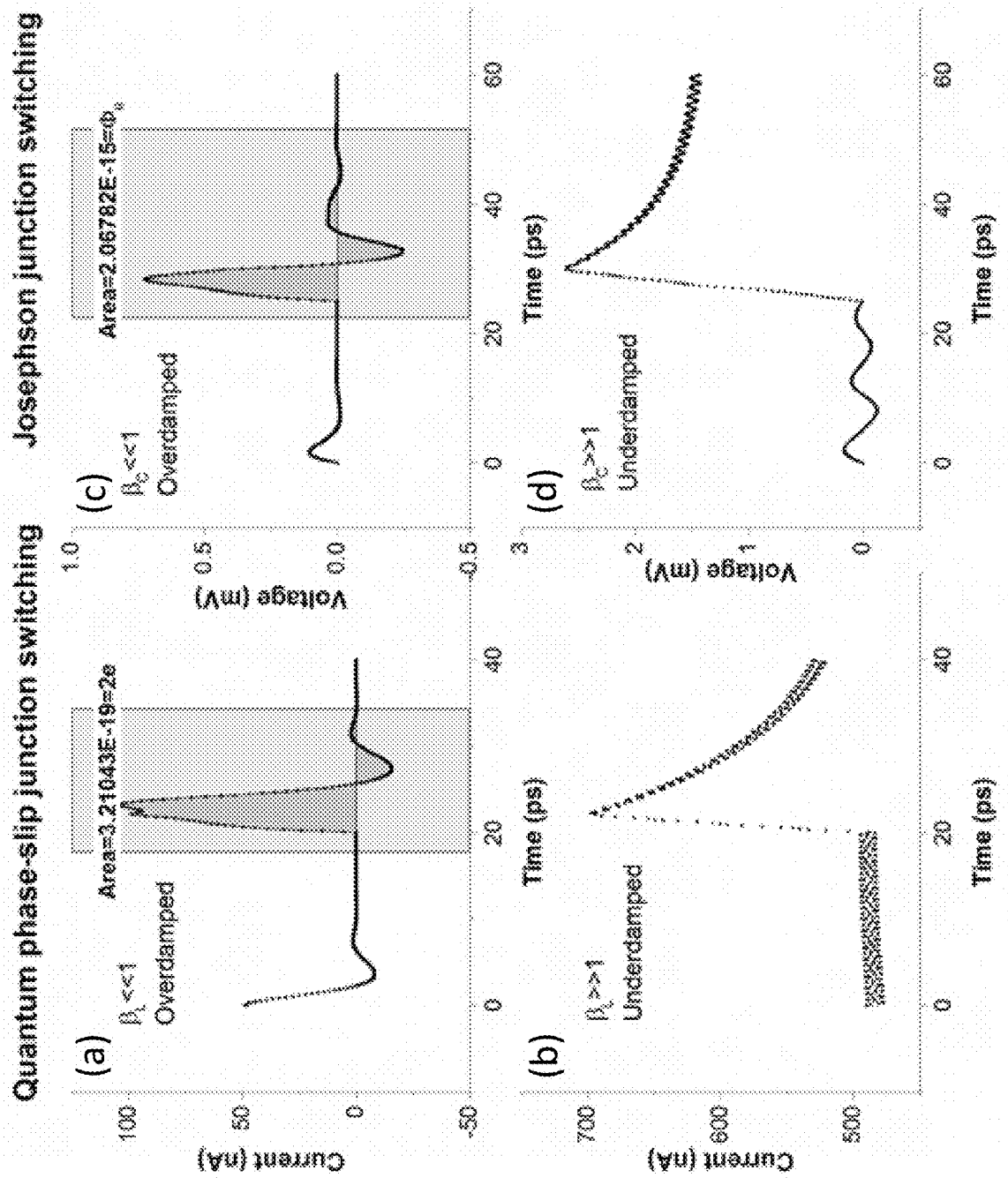
FIG. 10 shows switching dynamics of QPSJ (a) and (b), and of JJ (c) and (d).

In certain embodiments, numerical simulation results of a single current pulse with area of 2e under the curve are shown in FIG. 10. Simulation of an RSFQ pulse is also presented for comparison. Both the junctions are also simulated in under-damped (without a damping resistor) and over-damped (with a damping resistor) configurations. The circuit setup for both under-damped and over-damped QPSJs include a voltage bias of $0.7V_C$ and a pulse voltage input in series with a QPSJ. Addition of a series resistor makes it over-damped. A similar setup has been used for a JJ, where a current bias of $0.7I_C$ and a current pulse driving it. Addition of a parallel resistor makes the junction over-damped. Simulation results for all the cases (over-damped and under-damped JJ and QPS) are shown in FIG. 10.

FIG. 10 shows the quantized area current pulse of a QPSJ very similar to the quantized area voltage pulse of a JJ, when both the junctions are over-damped. In under-damped state, both the junctions switch when the input current or voltage goes above the critical current or the critical voltage values and are then latched in that state. This is characteristic of the hysteresis behavior of both the junctions, where, once switched to a resistive state above their respective critical voltages or currents, the junctions do not revert back to their superconducting states until the bias across them is completely zero. In the under-damped switching behavior of a QPSJ shown in in FIG. 10, the current across the junction is non-zero even after its switching state due to the presence of a voltage bias and a quasi-particle resistance across the device.

With over-damped QPSJs, a quantized charge of 2e flows through the junction, similar to the flux developed across a JJ. Therefore, as in RSFQ, where a loop made of JJs and an inductor stores one quantum of flux $\Phi_0$, an island formed by two QPSJs and a capacitor can store quantum of charge 2e. An ideal QPSJ is similar to a tunnel barrier, and therefore the node formed between two QPSJ devices is similar to an island [41].

Using the SPICE model developed for a QPSJ, an operation mode of the device feasible for logic implementation is demonstrated in the simulations. The device is based on the quantized-charge and is a dual to flux-based logic in SFQ circuits.

Charge-Based Superconducting Logic Using QPSJ

A QPSJ can be designed and operated in an appropriate configuration to produce quantized-area current pulses demonstrating tunneling of a Cooper pair at an instant. This is similar to a Josephson junction producing a constant area voltage pulse indicating movement of flux quanta across them. This can be achieved by over-damping the plasma oscillations of the junction. The QPSJ can be treated as a series RLC oscillator and a damping parameter $\beta_L$ is given by Eqn. (4). The junction is under-damped if $\beta_L \gg 1$ and over-damped if $\beta_L \ll 1$. In order to produce quantized-area current pulses, the SPICE model and simulation of QPSJ must be modified to recognize plasma oscillations of the junction. Therefore, the time-step in the device model must be limited to below the time corresponding to the plasma frequency. The QPSJ model in WRSPICE is therefore modified to limit the time step given by Eqn. (5).

A QPSJ may be designed to be either in under-damped or over-damped mode using Eqn. 1 and by appropriate choice of material properties and dimensions. Analogous to an SFQ circuit, the island circuit is biased with a DC voltage source $V_b$ as shown in FIG. 11(c). The DC voltage biases both the junctions to 70% of their critical voltages and therefore has a value of 140% of $V_C$. An input square voltage pulse is provided as $V_{in}$, with sufficient magnitude, i.e., greater than 150%, to switch the junction.

When the junction is under-damped, the switching event causes the junction to switch and latch to a normal state. A result from simulation of the island circuit with both junctions under-damped is shown in FIG. 10(b), where the area under the curve is greater than 2e. A quantized charge pulse, with area under the curve 2e can be produced by using over-damped junctions. This is achieved by adding a series resistor to each of the junctions, thereby increasing the value of R in Eqn. (1). The simulation result of an over-damped junction is shown in FIG. 10(a), where the area is quantized to 2e.

In certain aspect, the invention relate to a quantum logic family that is based on current pulses with the quantized area of 2e as that of the charge of a Cooper pair in a superconductor, using devices known as a QPSJ. These logic circuits are demonstrated using a SPICE model developed for a QPSJ. The mode of operation of a QPSJ is established, based on a range of device parameters of the device and its SPICE model. The operation of the charge-based logic family is then demonstrated using SPICE simulations.

In certain embodiments, charge-based logic is realized, similar to flux-based logic [5], using an island made of two QPSJs and a capacitor. The circuit description of both the SFQ loop and its dual, the island formed by QPSJs are shown in FIG. 11. This island configuration (b) and (c) forms the basic logic element of the single quantized charge based logic. By arranging these islands in various configurations as shown in the following sections, the current pulses can be manipulated, transmitted, split and merged, and various basic logic elements can be formed. All the circuit configurations are obtained from flux-charge duality of both the devices, by replacing a loop with an island, current sources with voltage sources and inductors with capacitors.

The QPSJ behavior can be compared to a parallel LCR (inductor-capacitor-resistor) oscillator for simplicity, although certain elements of the junction show non-linear behavior. When oscillations are triggered by a voltage pulse, each oscillation corresponds to tunneling of a Cooper pair, or two electrons across the insulating barrier setup by a phase-slip. When appropriately damped, it is possible to limit the oscillations to one at a time. A damping parameter is given by Eqn. (4), which aids the operation in over-damped region where quantized oscillations are possible.

The primary logic element for the charge-based logic family, which can generate and trap a Cooper pair, or two electrons, is an island developed using QPSJs shown in FIGS. 11(b) and 11(c). Each of the junctions, acting as insulating barriers due to the phase-slip, separates node 1 from rest of the circuit, creating a charge island.

When the over-damped first QPSJ is triggered by an input voltage pulse $V_{in}$, while being DC biased by $V_b$, a Cooper pair tunnels across the first QPSJ on to the island at node 1. This can be observed in simulation as a short current pulse, the area of which is equal to charge of two electrons, the simulation of which is shown in FIG. 10(a), which is simulation of quantized charge tunneling characterized by constant-area current pulse through the island. Note that the bias voltage $V_b$, must be about 70-80% of the critical voltage $V_C$ and the input voltage pulse magnitude $V_{in}$ must be at least about 150% of the critical voltage $V_C$ for the quantized charge tunneling.

This pulse is the logic bit '1' in the charge-based logic family, while the absence of it is the bit '0', that occurs when the input pulse cannot trigger the quantized charge tunneling. Note that, due to the quantum behavior of the QPSJ, there can only be existence or absence of this pulse, and not partial pulses when inappropriately triggered. Also, the shape of the pulse can vary depending on input and design conditions, but the area under the curve remains constant.

When these islands are connected in series, a single input trigger pulse can cause the electron pair to hop from an island to its next island creating a transmission line for transfer of bits. By suitably tuning the capacitance C in FIG. 11(c), along with the junction parameters, charge can either be trapped on an island, or forced to hop to its next island. Using these design techniques, several logic gates are designed, including, but are not limited to, an AND gate, an OR gate, an XOR gate, an RS flip-flop, a D flip-flop, a T flip-flop, and so on, which also lead to complicated circuits such as a shift register, a ring oscillator, an adder, and so on. Design methodology is adequately developed to confirm operations of sufficient number of logic circuits that together make universal logic operations possible. To illustrate this logic family, a few of exemplary circuits and simulations are shown below.

QPSJ Transmission Line

In one embodiment, a basic operation of QPSJ circuits is demonstrated by simulating a QPSJ transmission line which propagates quantized charge of 2e along the islands similar to that of Josephson transmission lines [8-10]. In one embodiment, a QPSJ transmission line have a plurality of QPSJs formed of a series of islands with a voltage bias and input voltage signal. One embodiment of the QPSJ transmission line circuit is shown in FIG. 12, where Q1-Q4 are denated first to fourth QPSJs, respectively.

Figure 13:
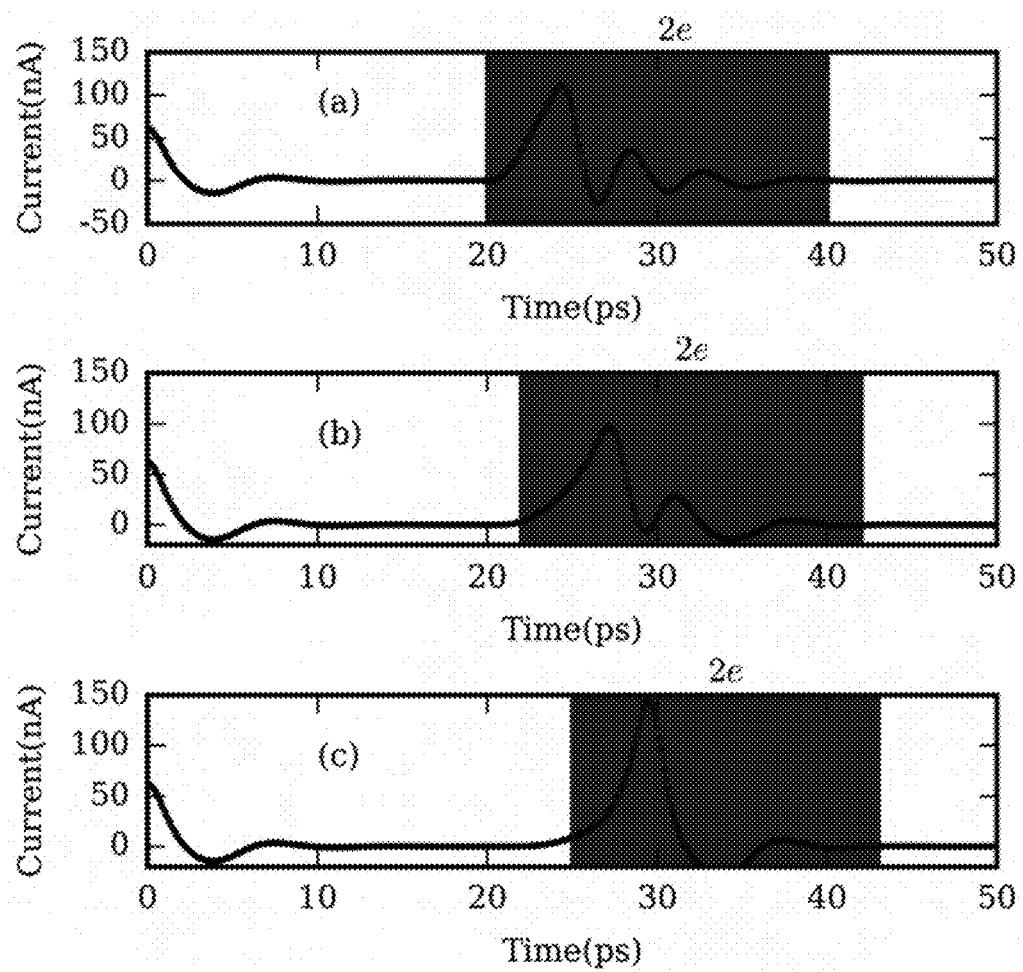
FIG. 13 shows simulation results of the QPSJ transmission line illustrating charge 2e traveling across islands according to one embodiment of the present invention: (a) current at node 1, (b) current at node 2, and (c) current at node 3. The QPSJ transmission line is shown in FIG. 12.
Figure 14:
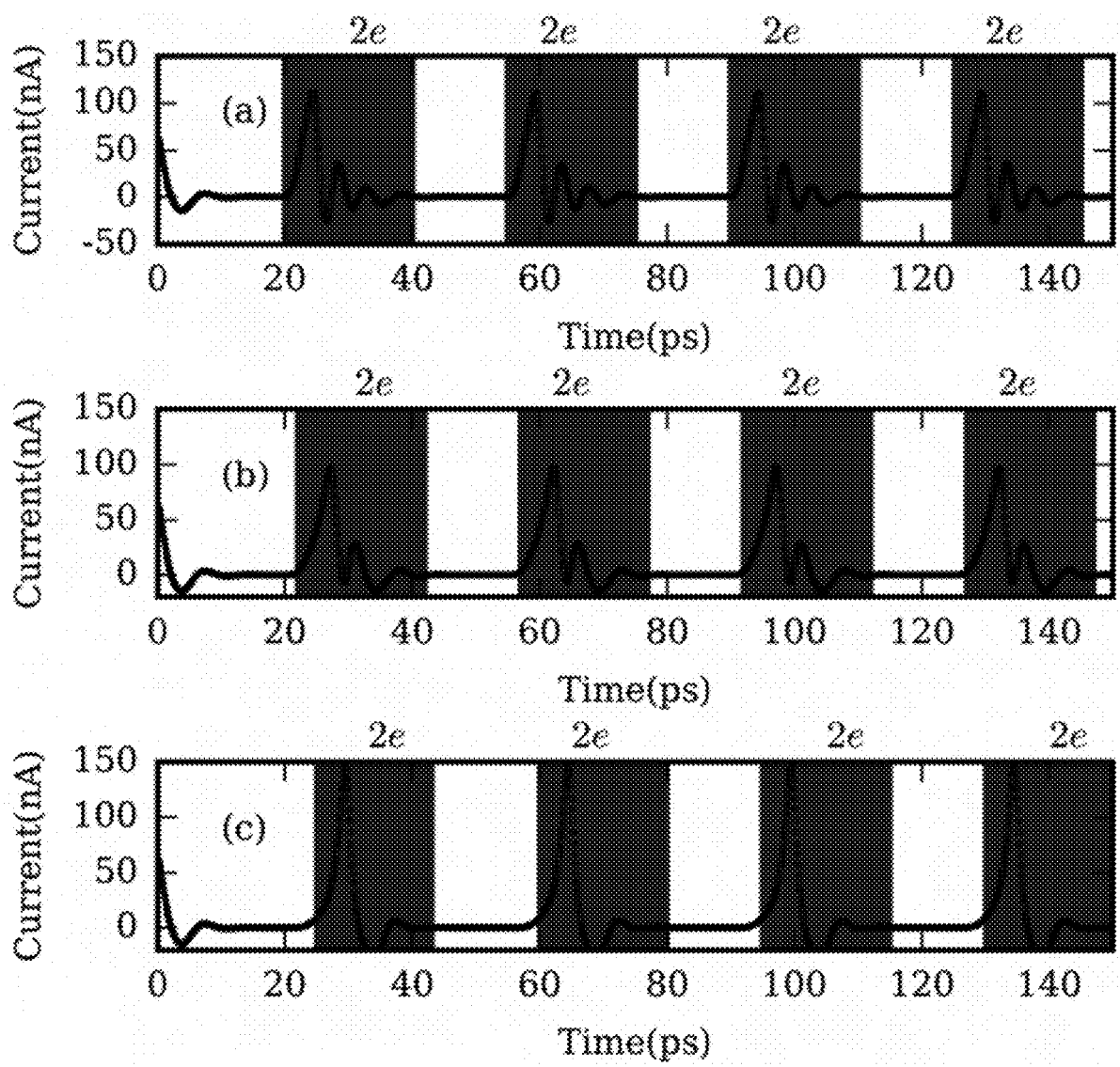
FIG. 14 shows simulation results of the QPSJ transmission line with multiple pulses according to one embodiment of the present invention: (a) current at node 1, (b) current at node 2, and (c) current at node 3. The QPSJ transmission line is shown in FIG. 12.

In the circuit, all the QPSJs have an equal critical voltage of $V_C$. A DC voltage bias is used at node 5, the value of which is equal to $4 \times 0.7 V_C$ to be able to bias all four QPSJs in series. Since each QPSJ cannot conduct any current until the applied voltage is above its critical voltage, the charge in the islands is zero at this instant. When the input pulse signal is applied, the first QPSJ (Q1) switches as the voltage across it goes above the critical voltage of the QPSJ. If the first QPSJ is over-damped, a charge of 2e is generated, which is stored on the first island, i.e., node 2 of FIG. 12. This charge in turn generates a voltage across the second QPSJ (Q2) causing it to overcome its critical voltage. Thus, the charge of 2e, or the current pulse with the quantized area of 2e travels along the transmission line. The simulation results of this circuit with the input voltage and current at each node are shown in FIG. 13. The simulation results with multiple current pulses along the transmission line are shown in FIG. 14. In some embodiments, amplification or attenuation of the current pulse amplitude is obtained by using QPSJs of different critical voltage and different capacitor values.

QPSJ Pulse Splitter

Figure 16:
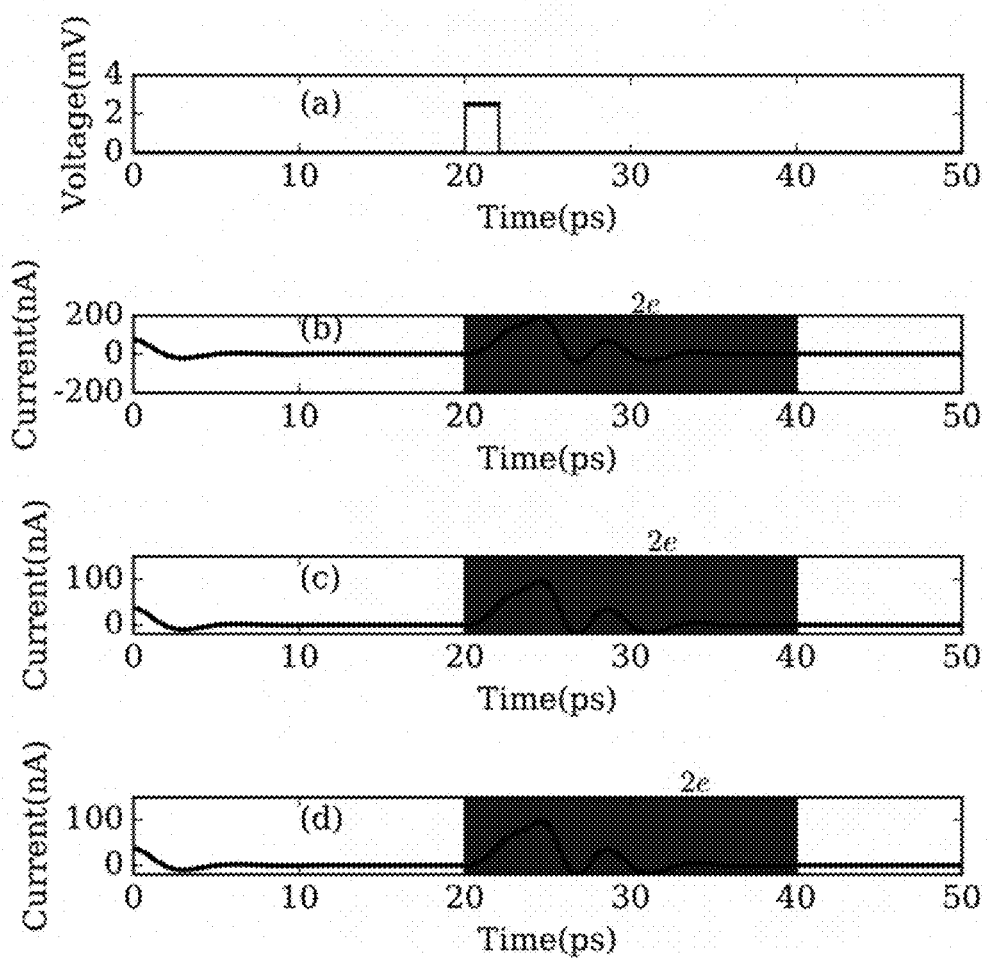
FIG. 16 shows simulation result of the pulse splitter circuit shown in FIG. 15 according to one embodiment of the present invention: (a) total input voltage signal at node 1, (b) current at node 1, (c) current at node 3, and (d) current at node 4.

Fan-out is generally required for implementation of useful digital logic. In one embodiment, the current pulses is split for fan out with the help of a pulse splitter circuit shown in FIG. 15, which employs charge propagation in islands similar to a QPSJ transmission line, employing different sized junctions. In this circuit, the first QPSJ Q1 has a critical voltage of $0.7 V_C$, where $V_C$ is the critical voltage of Q2 and Q3. Both the bias voltages are equal to $1.7_C$. Without decrease in the amplitude of the current pulse, the input pulse is split into two output pulses. The simulation results for this circuit are shown in FIG. 16.

QPSJ Buffer

Figure 18:
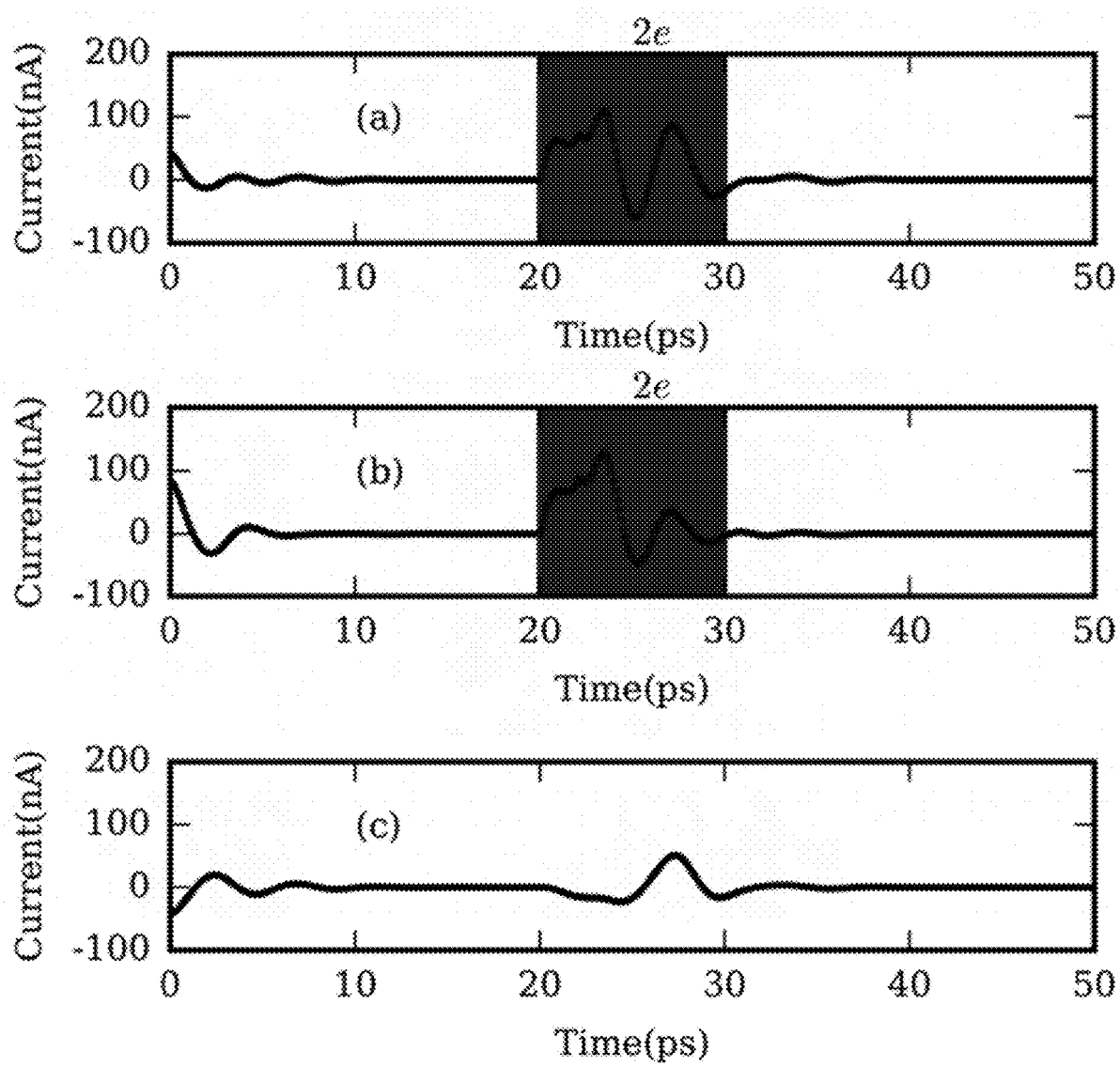
FIG. 18 shows simulation results of the buffer circuit shown in FIG. 17(a) according to one embodiment of the present invention: (a) signal at node 1, (b) signal through Q3, and (c) signal at node 4.
Figure 19:
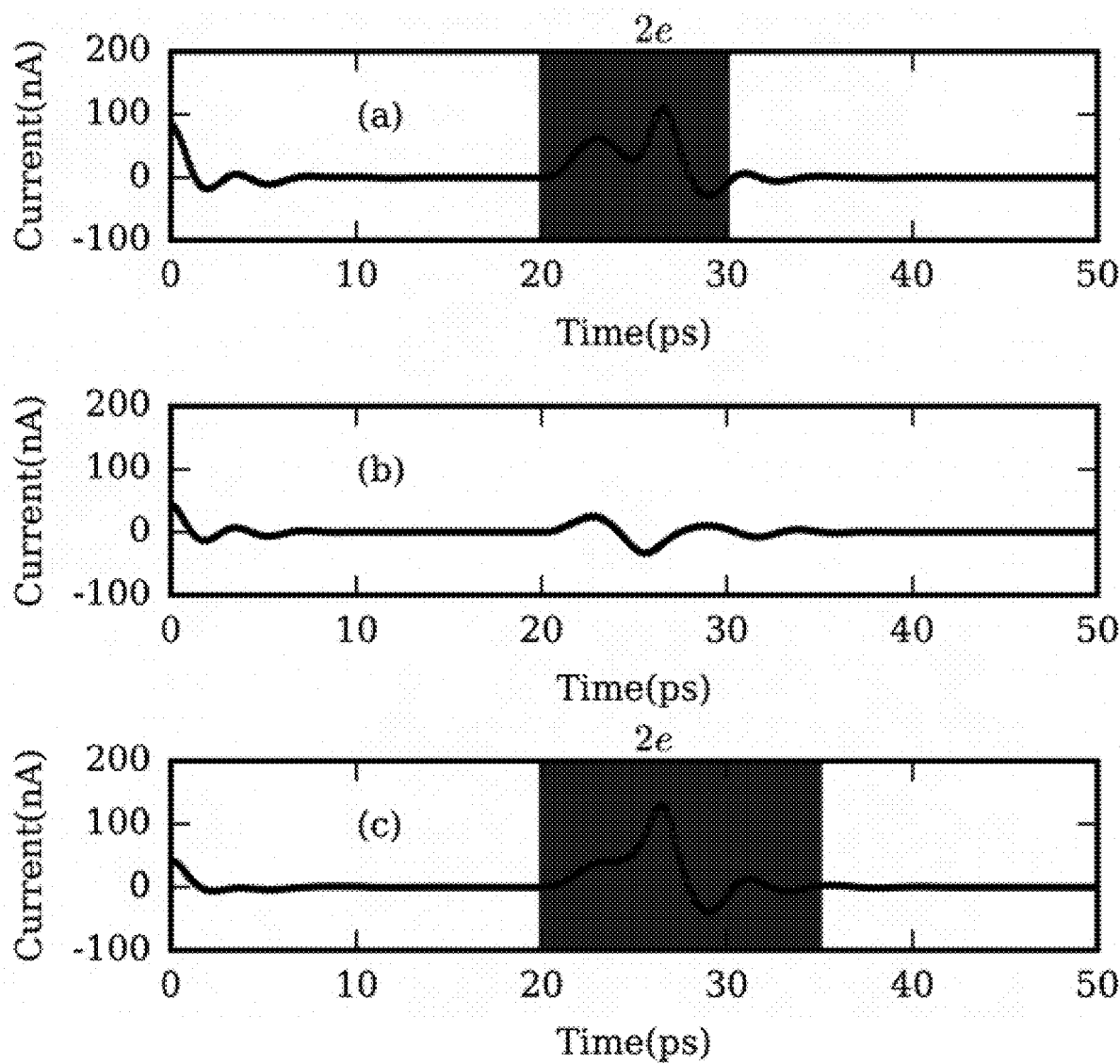
FIG. 19 shows simulation results of the buffer circuit shown in FIG. 17(b) according to one embodiment of the present invention: (a) signal at node 1, (b) signal through Q3, and (c) signal at node 4.

In both the circuits shown above so far, the input and output pulses are reciprocal, i.e., the current, and hence the quantized charge 2e can flow in both directions. In one embodiment, a QPSJ buffer is designed, as shown in FIG. 17, and can prevent this reciprocity when introduced in the transmission lines or in logic circuits. In the circuit, the critical voltage of the QPSJ Q1 is $0.7 V_C$, the critical voltage of the QPSJ Q2 is $V_C$ and the critical voltage of the QPSJ Q3 is $1.4 V_C$. Therefore, the current pulse from Q1 switches Q3, before it switches Q2 and prevents signal flow in the direction from node 1 to node 4. Whereas, when current arrives from the opposite direction, as shown in FIG. 18, the QPSJ Q1 switches before Q3, allowing the signal through. The bias voltage at node 4 is equal to $1.5 V_C$ to bias both Q1 and Q2. Q3 is biased using a different voltage source, the value of which is equal to $0.7 V_C$. The simulation results for both situations are shown in FIGS. 18 and 19, respectively.

QPSJ Confluence Buffer

Figure 21:
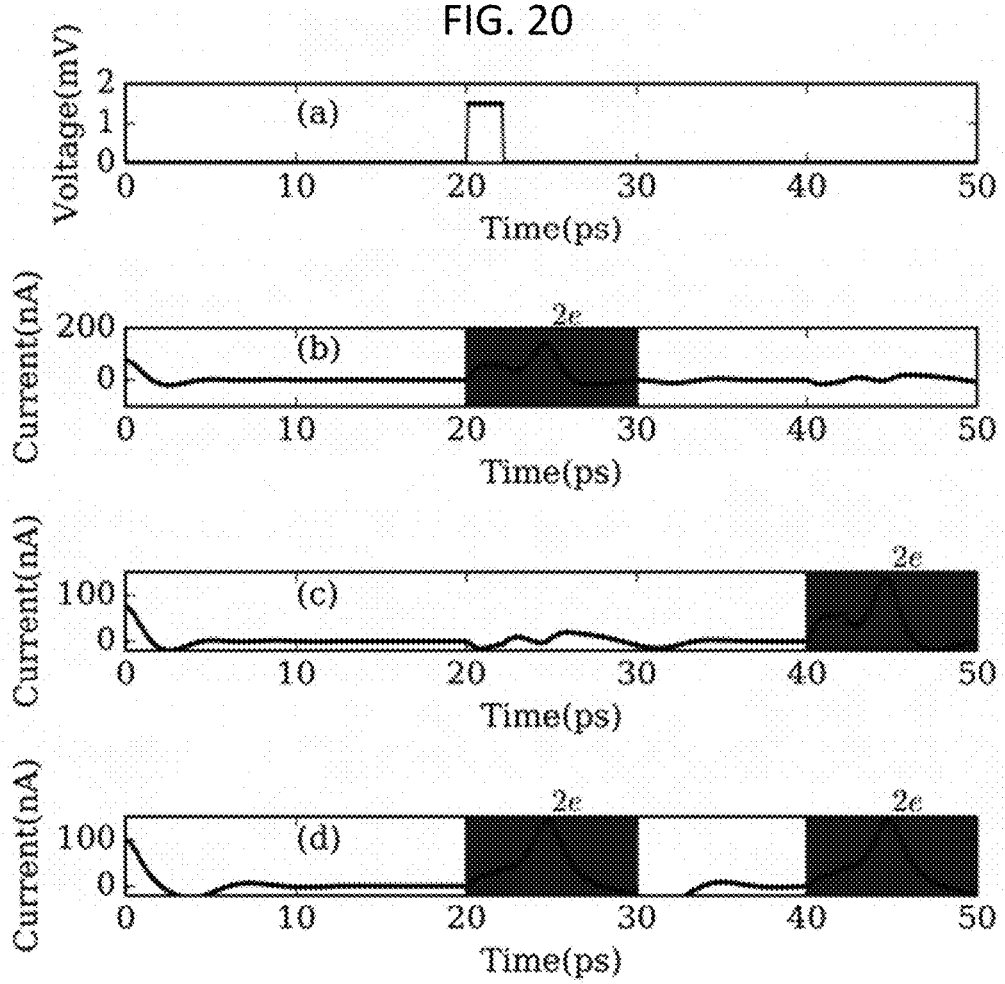
FIG. 21 shows simulation results of the QPSJ merger shown in FIG. 20 according to one embodiment of the present invention: (a) total input voltage signal at node 1, (b) current pulse at node 3, (c) current pulse at node 6, and (d) output signal at node 8.

In one embodiment, a confluence buffer circuit is an extension of the buffer circuit with two inputs and an output. This circuit can be used to merge two signals and generate a corresponding output pulse without current pulses from one input going to another input. This circuit is shown in FIG. 20. Here, Q1 and Q2 have the critical voltages of 1.4V_C, the critical voltage of Q3 is $V_C$ and the critical voltage of Q4 is $0.7V_C$. The simulation result of this circuit is shown in FIG. 21.

The circuits discussed so far can be used to manipulate the current pulses, control direction, fan-in and fan-out of signals. In the next sections, basic flip-flops and other logic circuits is presented and discussed.

RS Flip-Flop/D Flip-Flop

Figure 23:
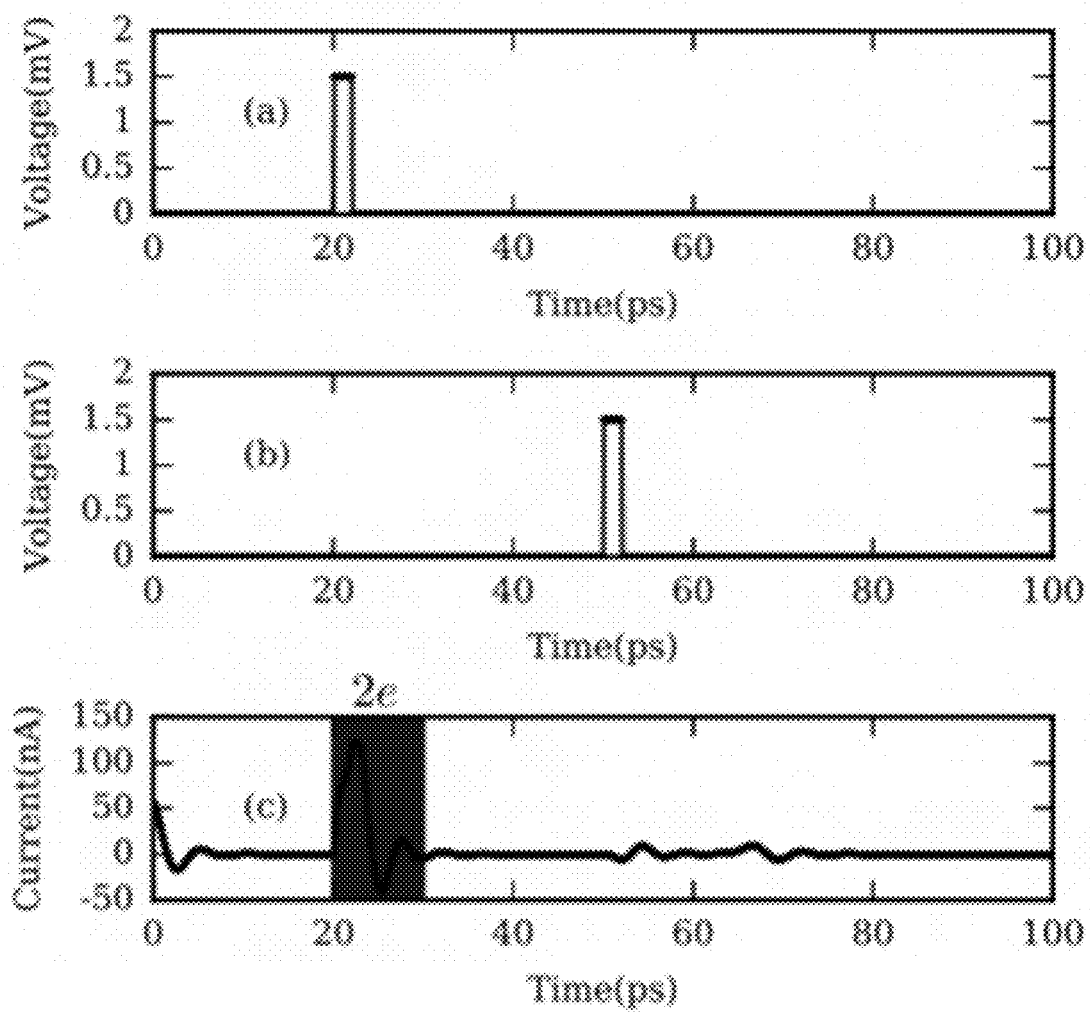
FIG. 23 shows simulation results for RS flip-flop circuit shown in FIG. 22 according to one embodiment of the present invention: (a) input voltage pulse at SET, i.e., node 1, (b) input voltage pulse at RESET, i.e., node 4, and (c) output current pulse at node 4.

An RS flip-flop or the DC squid of the SFQ logic family is a key component which can be used in other higher level logic circuits. The corresponding configuration in charge-based logic has been implemented in a simplest possible circuit using QPSJs, which is an island formed between two QPSJs. In one embodiment, the circuit shown in FIG. 22 includes two QPSJs forming an island with a capacitor along with voltage biases and signals at its two terminals corresponding to RESET and SET. Both the junctions Q1 and Q2 have the critical voltages of $V_C$. The capacitor between node 3 and ground has a value of $1.5V_C/2e$, enabling it to store a charge corresponding to a single Cooper pair at the island, when SET signal is applied. A DC voltage source biases both the junctions. The input signal at SET, which is $V_{pulse}$ at node 1, induces a charge of 2e to the island, and the input signal at RESET, which is $V_{pulse}$ at node 4, induces charge opposite to SET and therefore resets the charge on the island. The simulation results illustrating the function of this circuit are shown in FIG. 23.

In one embodiment, a D flip-flop can be implemented using a similar circuit. The input at RESET is replaced by a clock signal. Therefore, the input signal switches the first junction and induces a charge 2e on the island. With the next clock pulse, the charge flows through the OUT terminal in the circuit performing the function of a D flip-flop.

T Flip-Flop

Figure 25:
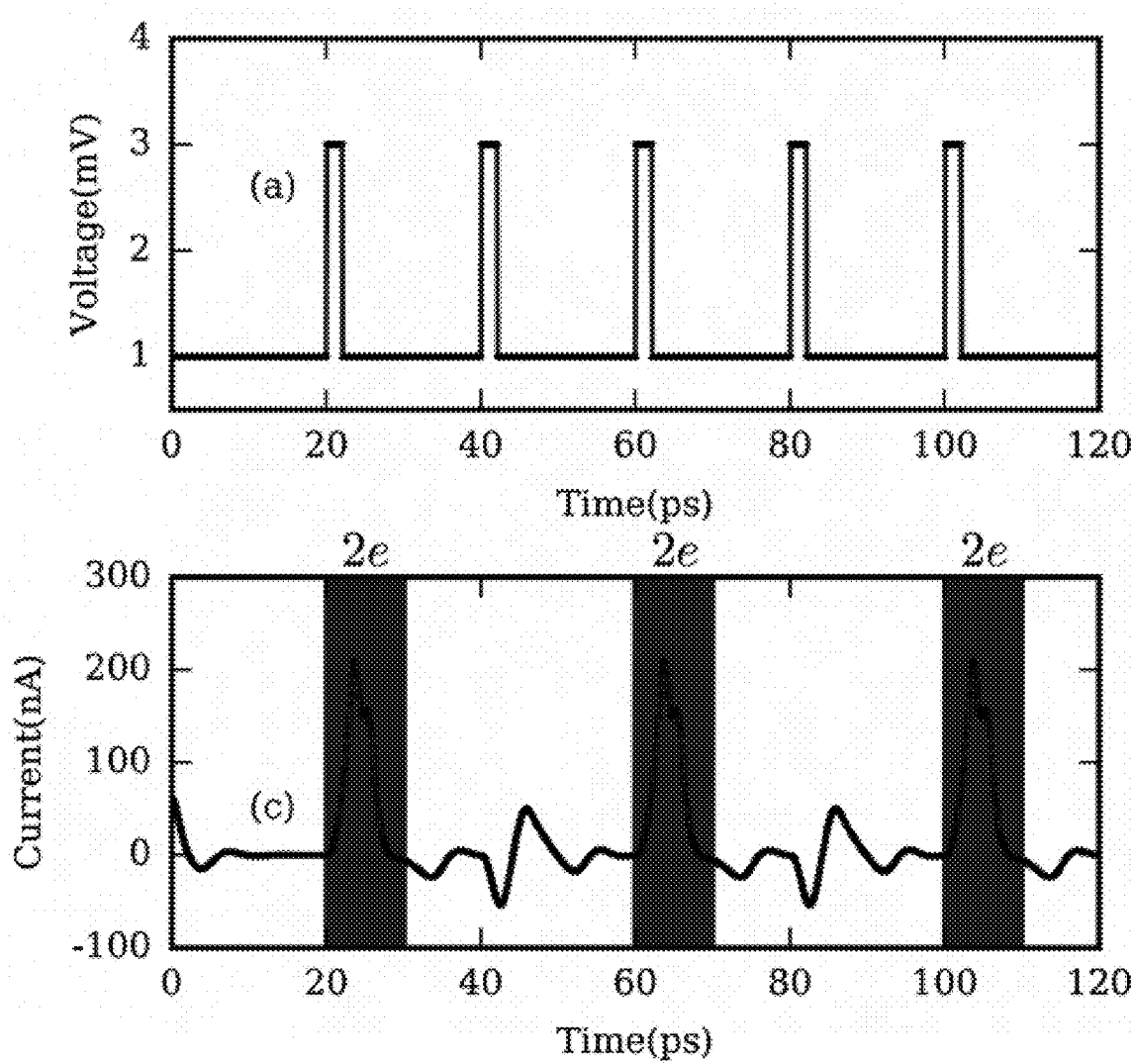
FIG. 25 shows simulation results for the T flip-flop shown in FIG. 24 according to one embodiment of the present invention: (a) clock signal input at node 1, and (b) output current signal coming out of node 2.

In one embodiment, a T flip-flop is also implemented using a very similar circuit to RS flip-flop. Both the RESET and SET inputs are connected to a single clock signal, with the bias voltage connected as shown in the circuit shown in FIG. 24. At each clock pulse, the current pulse toggles from ON to OFF and vice-versa indicating the presence and absence of charge on the island with each clock pulse. The simulation results of the circuit are shown in FIG. 25. The output current pulse is very similar to the output pulse of RS flip-flop circuit simulation.

QPSJ Based OR Gate

According to embodiments od the invention, any logic operation can be performed by combining two or more basic elements discussed so far. An OR gate can be formed by cascading a confluence buffer and an island formed by QPSJs similar to an RS flip-flop in series. The junctions with the same critical voltages as that of RS flip-flop and confluence buffer. This implementation is identical to the RSFQ based OR gate. The circuit diagram is given in FIG. 26. This is a timed OR gate, and hence has a clock input.

Figure 27:
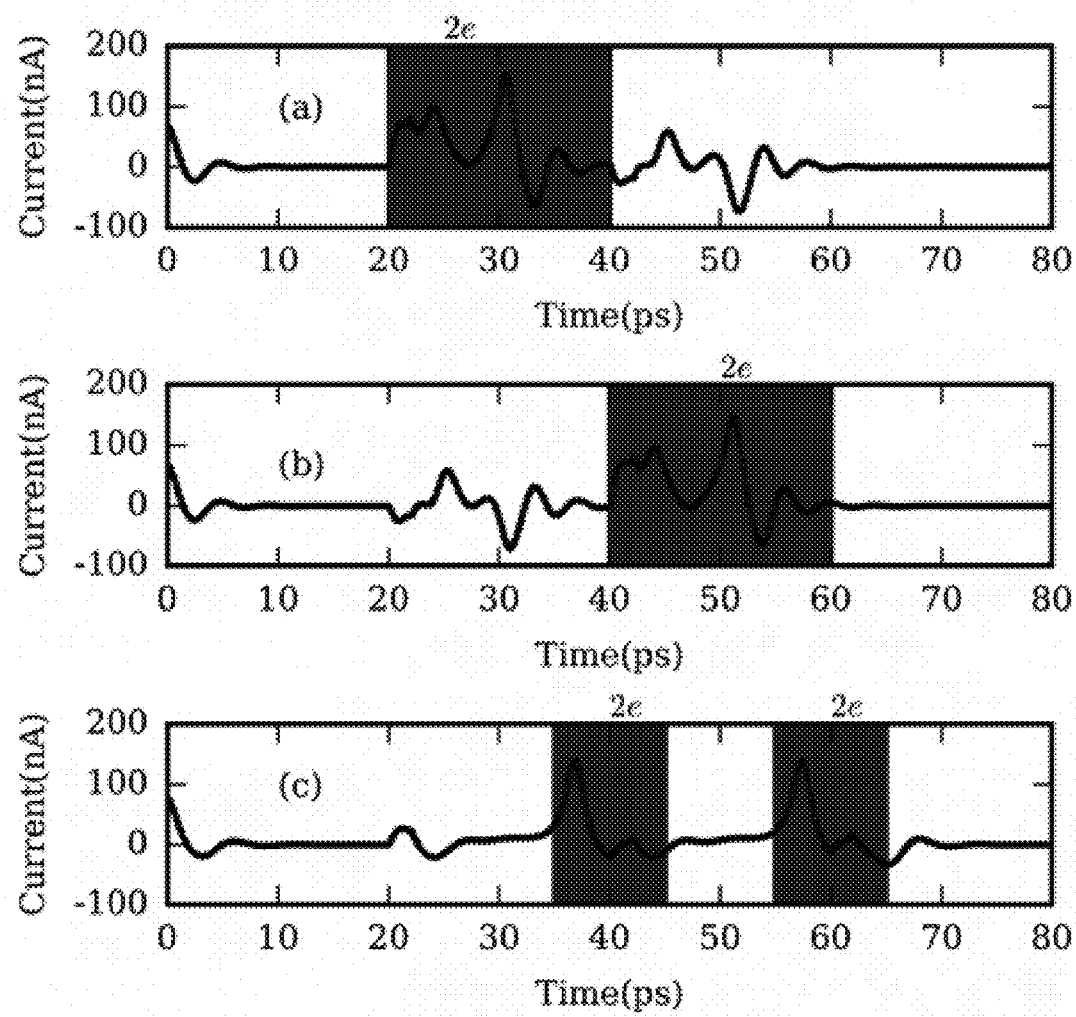
FIG. 27 shows simulation results of the OR gate implemented using QPSJs shown in FIG. 26 according to one embodiment of the present invention: (a) input current pulse at node 1, (b) input current pulse at node 2, and (c) output current pulse at node 9.

When one or both the inputs are high, the confluence buffer produces a current pulse corresponding to a charge of 2e at the island, which is the input to the RS flip-flop. With the next clock pulse, the charge stored on the island can be seen in the current pulse at the output. When both the inputs are low, there is no charge flow through the output. The simulation result of this circuit is shown in FIG. 27.

QPSJ Based AND Gate

Figure 29:
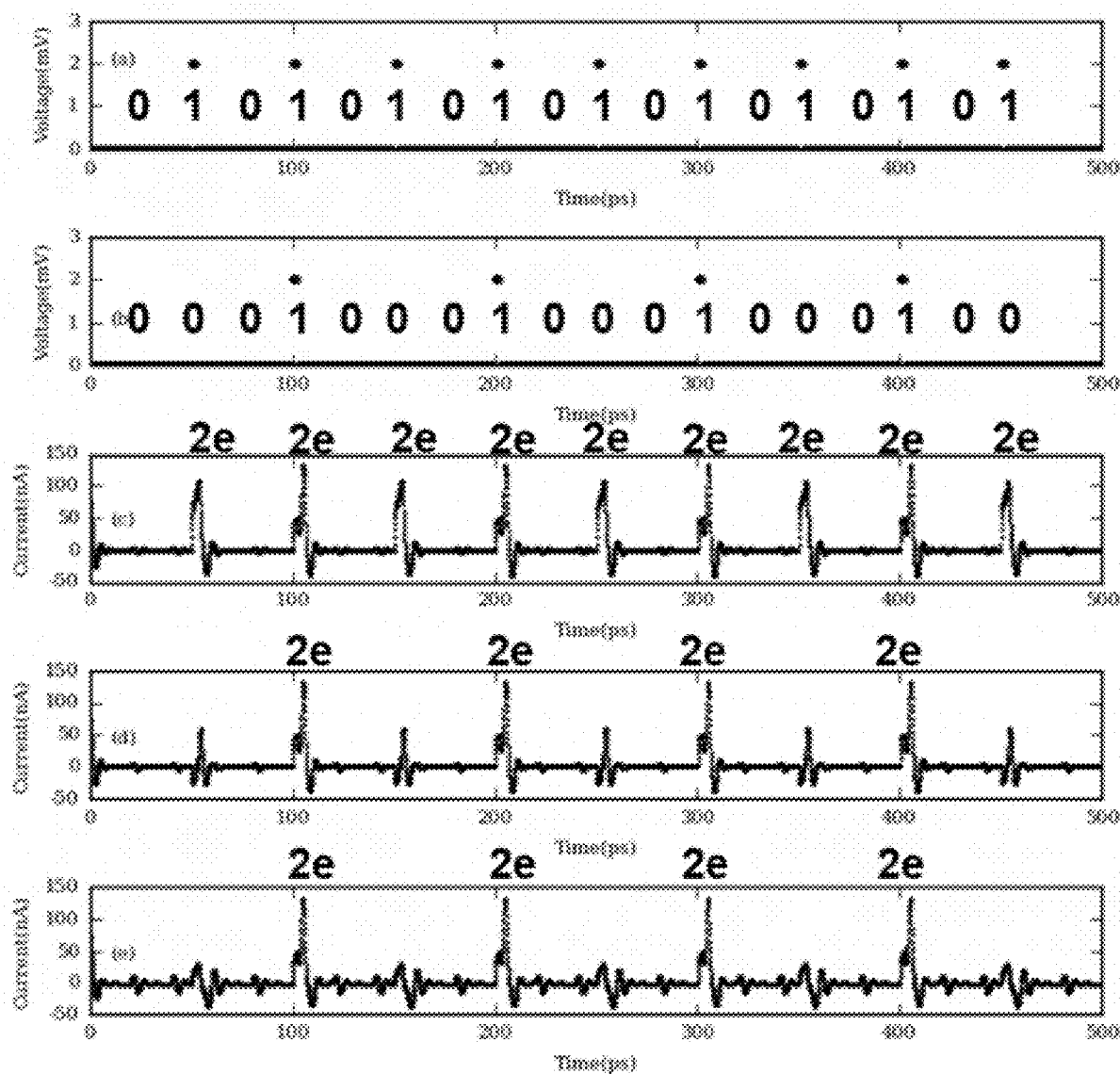
FIG. 29 shows simulation results of the AND gate implemented using QPSJs shown in FIG. 28 according to one embodiment of the present invention: (a) input current pulse at node 1, (b) input current pulse at node 2, and (c) output current pulse at node 8.

In one embodiment, an AND operation in charge-based logic is obtained by slightly modifying the OR gate. The confluence buffer part of the circuit is still used here to have a buffered two-input gate, but the island part of the circuit which operates as an RS flip-flop has been replaced with a buffer circuit from FIG. 17. At the output node, a clock has been added in series with the DC bias which makes this circuit a synchronized AND gate. The clock is necessary for the operation of this gate and a version without clocked gates has not been designed yet. It is possible to extend these gate to more than two inputs by adjusting the parameters of the junctions accordingly. The circuit is shown in FIG. 28 and the simulation results are shown in FIG. 29.

When either one of the inputs is high, the junction in the buffer circuit Q5 switches therefore ensuring the output to be low. When both the inputs are high during the same clock period, only one of the junctions are negated by the buffer circuit and the output is still high.

QPSJ Based XOR Gate

Figure 31:
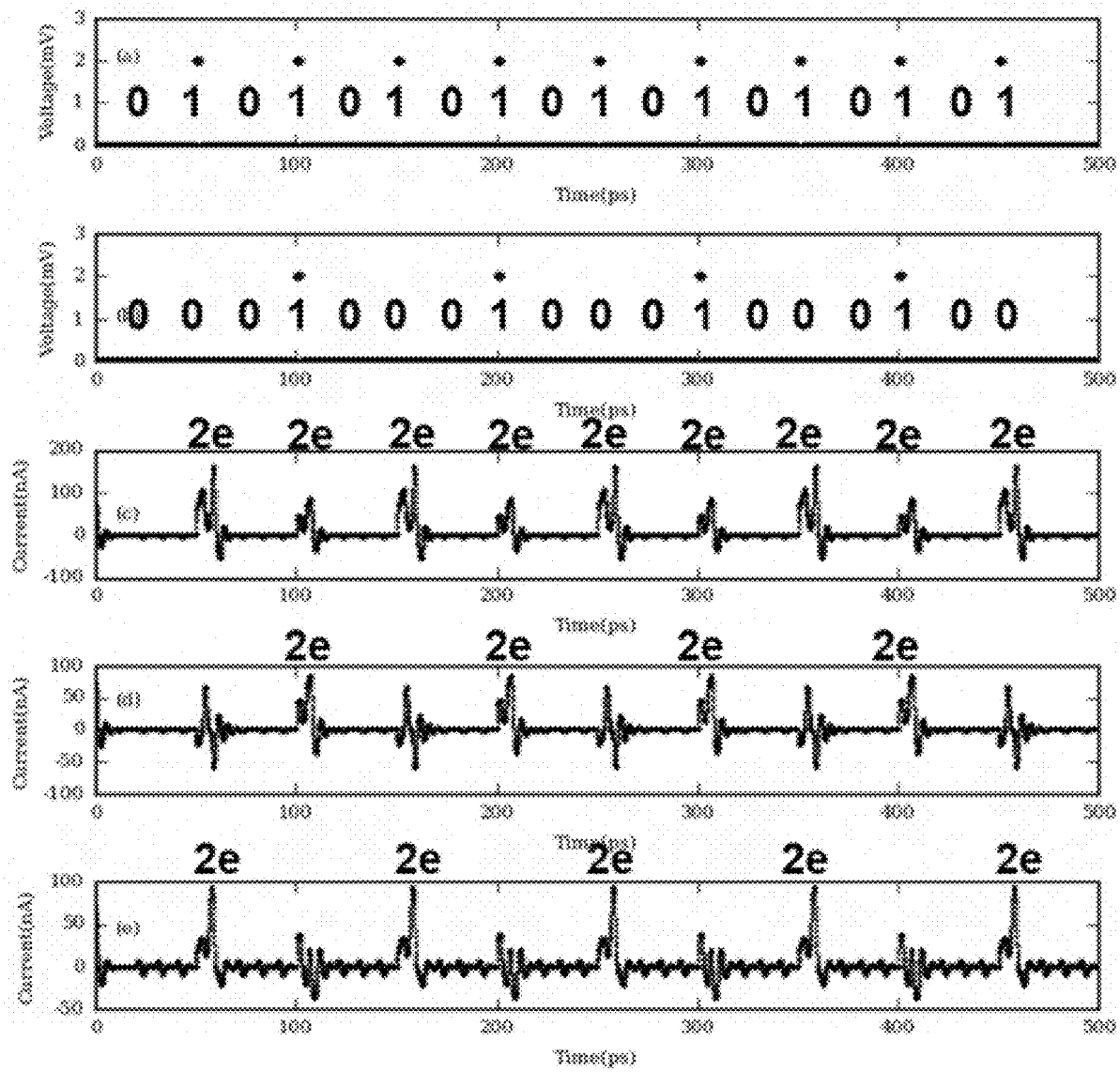
FIG. 31 shows simulation results of XOR gate implemented using QPSJs shown in FIG. 30 according to one embodiment of the present invention: (a) input current pulse at node 1, (b) input current pulse at node 2, and (c) output current pulse at node 8.

In one embodiment, a two input XOR operation using charge-based logic is implemented in a way very similar to the OR gate and the AND gate discussed above. A confluence buffer is used for the two input pulses and the additional buffer gate that has been included for AND operation has been removed. This ensures two identical inputs cancel each other out, but only a single pulse at either of the gates will not be affected by a buffer circuit. The circuit is shown in FIG. 30 and the simulation results are shown in FIG. 31.

QPSJ Based Half-Adder

Figure 33:
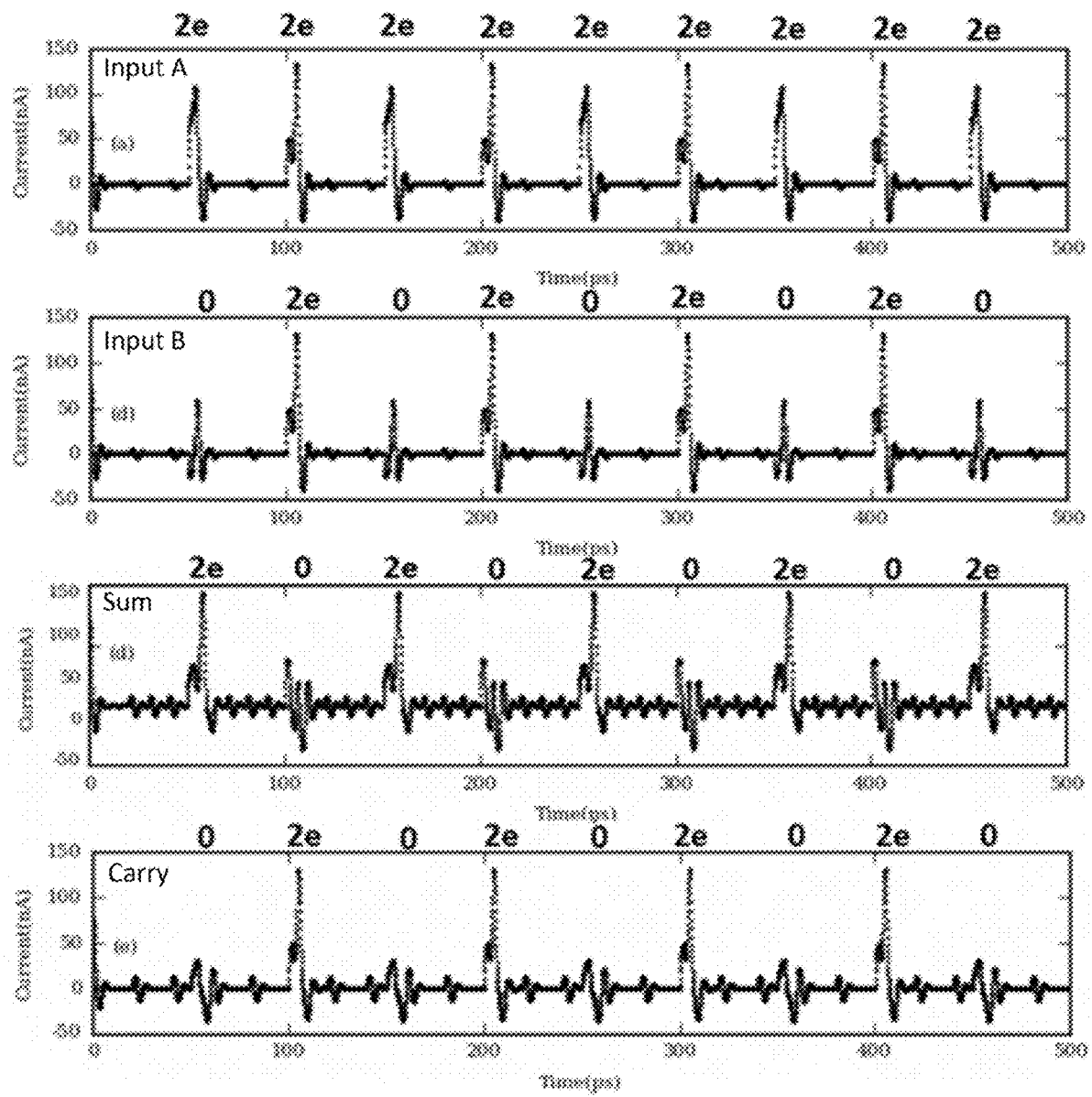
FIG. 33 shows simulation results of the half-adder using the XOR and AND gates shown in FIG. 32 according to one embodiment of the present invention, (a) input A, (b) input B, (c) sum (node S), and (d) carry (node C).

In one embodiment, in order to demonstrate that these individual gate designs shown so far can be used to perform more complicated logic operations, a half adder is demonstrated by combining the AND and XOR gates along with splitters to split the input pulses to both XOR and AND gates. FIG. 32 illustrates the schematic of the half-adder circuit. FIG. 33 shows the simulation results of the two-input half-adder circuit.

QPSJ Based Shift Register

Figure 35:
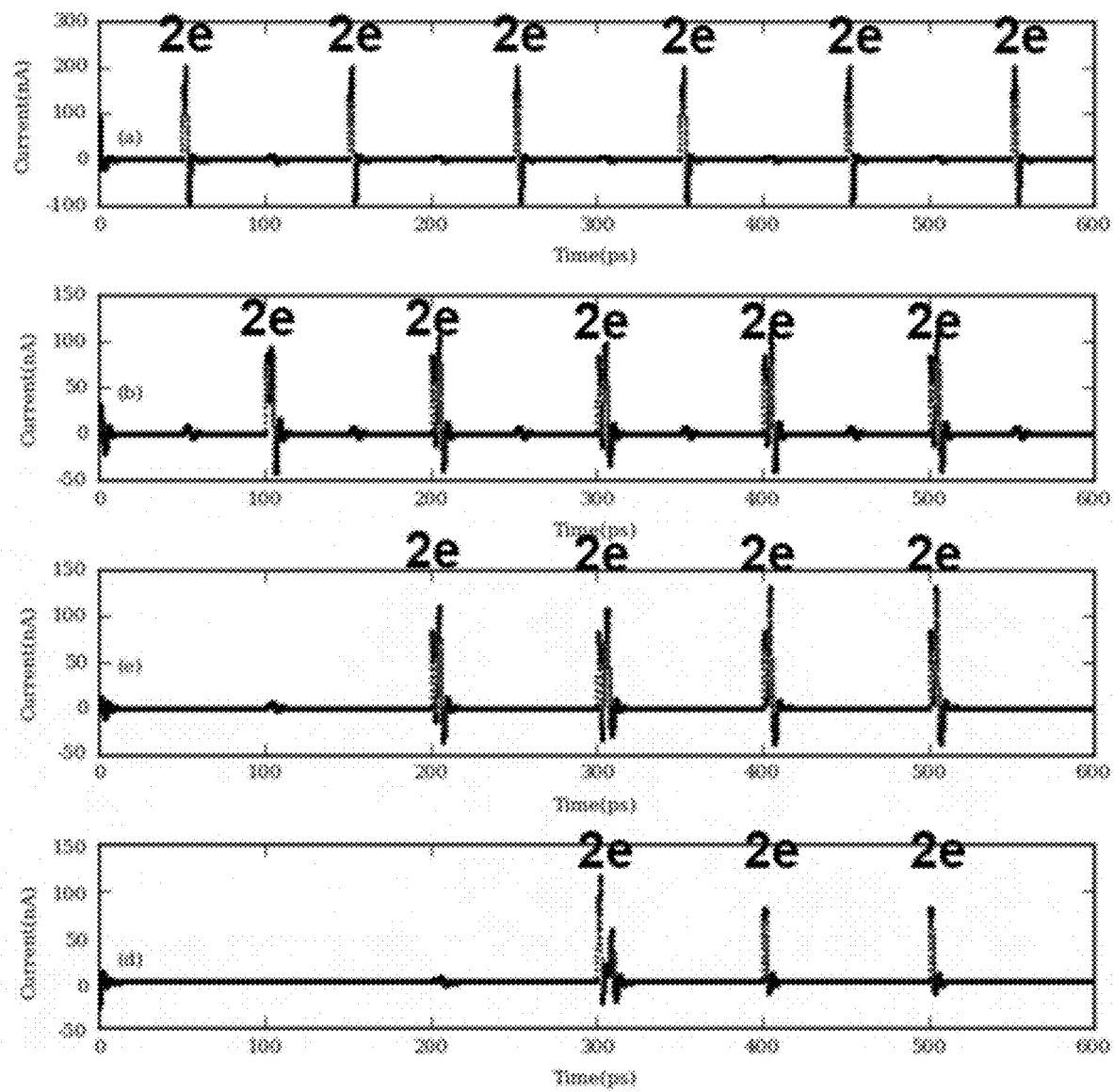
FIG. 35 shows simulation results of shift register shown in FIG. 34 according to one embodiment of the present invention: (a) input data pulses, (b) output after stage 1, (c) output after stage 2, and (d) output after stage 3.

In one embodiment, a D flip-flop demonstrated in the previous section is used to construct a shift register with identical clocks at each stage. A block diagram demonstrating the entire circuit is shown in FIG. 34. The circuit has four shift stages with each stage using a different but identical clock input. The simulation results of the shift register are shown in FIG. 35.

QPSJ Based Ring Counter

Figure 37:
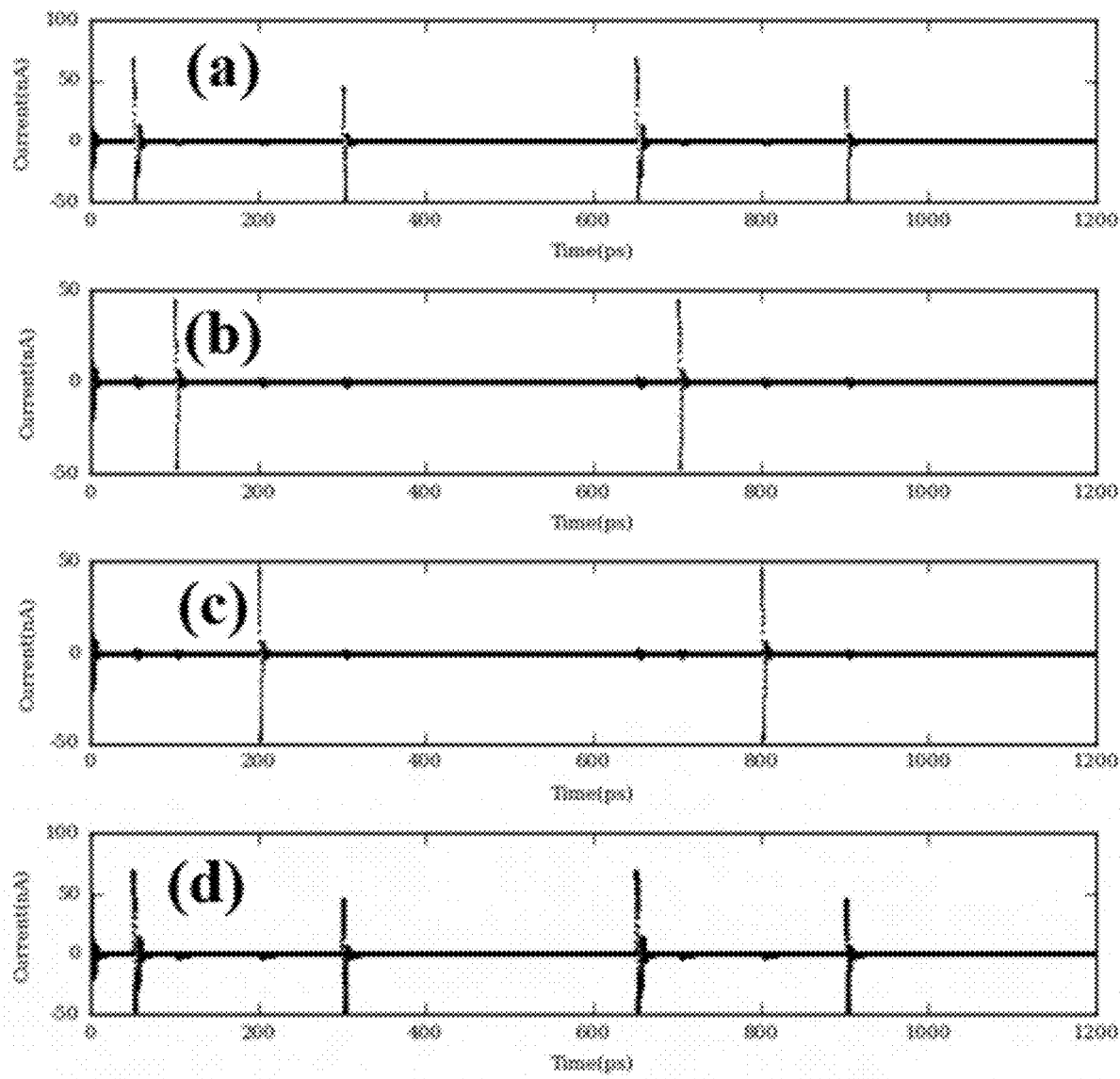
FIG. 37 shows simulation results of the ring counter shown in FIG. 36 according to one embodiment of the present invention: (a) output after stage 1, (b) output after stage 2, (c) output after stage 3, and (d) output after stage 4.

In one embodiment, a ring counter is constructed using the D flip-flops in a very similar way as a shift register. A single input pulse is needed to trigger the circuit. An identical clock triggers each stage and a counter operation is observed in the simulation results shown in FIG. 37. FIG. 36 shows the block diagram of the circuit being simulated.

QPSJ Based OR-AND Circuit

Figure 39:
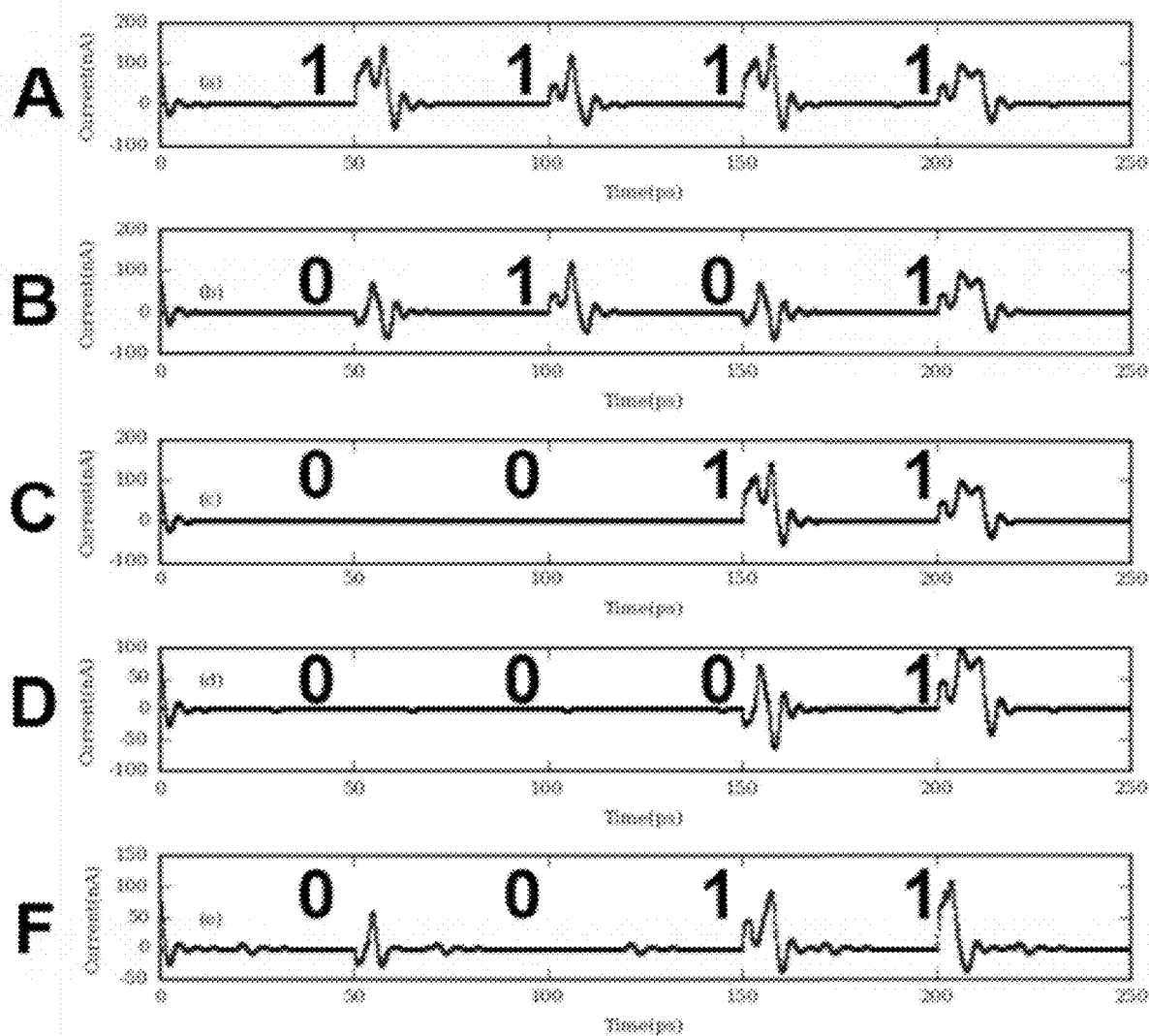
FIG. 39 shows simulation results of the OR-AND gate shown in FIG. 38 according to one embodiment of the present invention: (a) input A, (b) input B, (c) input C, (d) input D, and (e) output F.

In one embodiment, an OR-AND circuit shown in FIG. 38 is implemented. The gates used in this circuits are all synchronized and therefore use an identical clock. This illustrates that any other higher-level logic circuits for complicated operation can be implemented using charge-based logic. The simulation results of this circuit are shown in FIG. 39.

QPSJ Based Ring Oscillator

Figure 41:
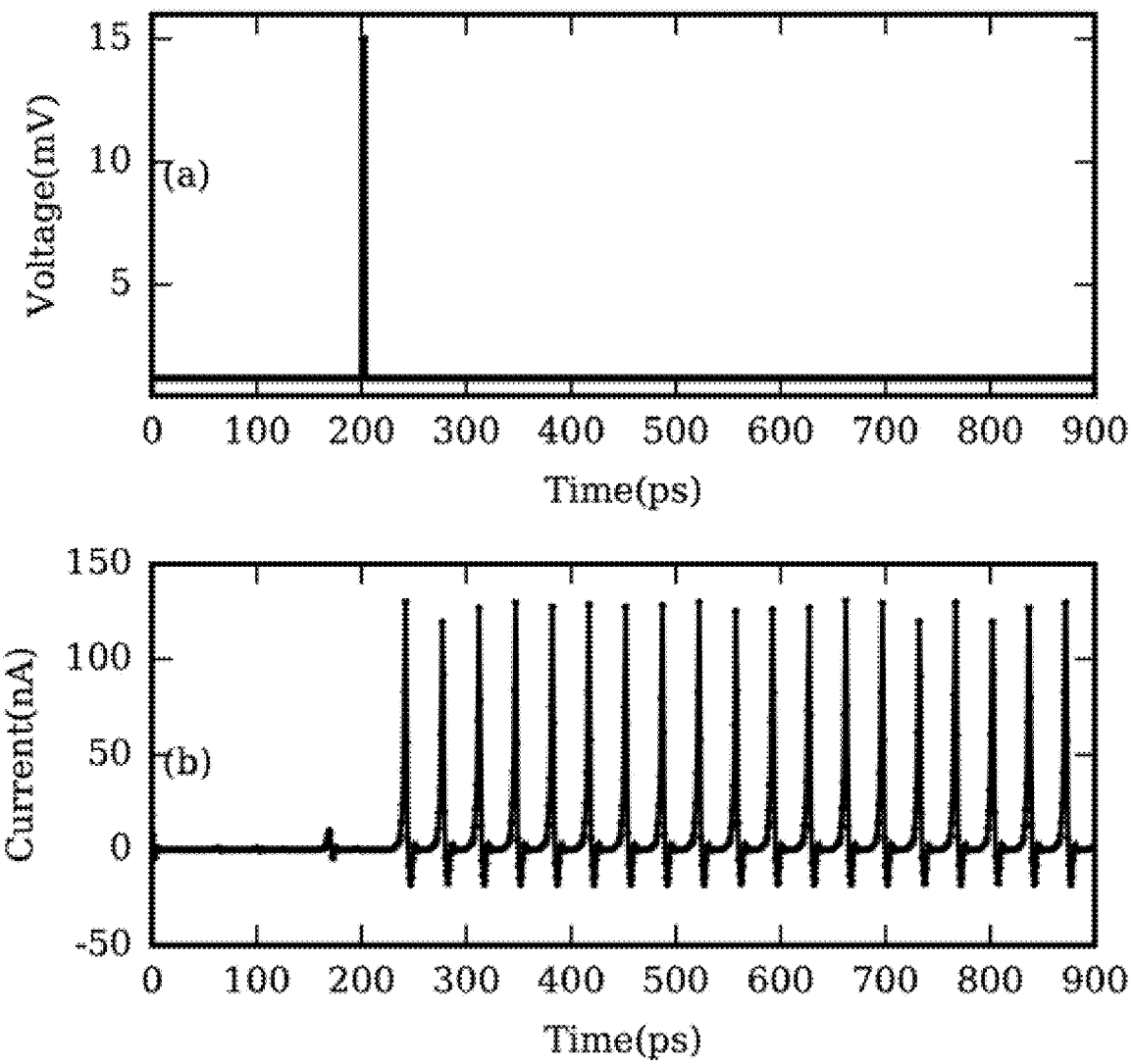
FIG. 41 shows simulation results of the ring oscillator shown in FIG. 40 according to one embodiment of the present invention.

In one embodiment, the logic blocks discussed in the previous section is treated as the fundamental building blocks for the logic family being discussed. The elements of these blocks can be combined to form more complicated circuits. To illustrate this, an example of ring oscillator is implemented. FIG. 40 shows the block diagram for the ring oscillator. This is based on Josephson junction based ring oscillator [31]. The corresponding simulation result with a single voltage pulse input triggering the oscillations in the ring is shown in FIG. 41.

Low-Power High-Speed Superconducting Logic Device Using QSPJ

As discussed above, in certain embodiments, quantized-charge logic elements for digital logic circuits based on a superconducting island formed using superconducting nanowires, which are operated to exhibit quantum phase-slip phenomena are disclosed. These logic elements are shown in simulations to implement a quantized charge-based logic family alternative to single-flux quantum logic family. By means of a SPICE model developed for quantum phase-slip junctions, switching of the island to produce quantized-charge pulses is demonstrated. The prospect of lower power dissipation and faster switching compared to single-flux quantum logic, along with advantage of essentially zero static power dissipation, in a practically implemented circuit, is highlighted.

In this exemplary embodiment, a low-power high-speed superconducting switch having a superconducting island circuit as shown in FIG. 10(c) is demonstrated using simulations in WRSPICE using a previously-developed SPICE model of a quantum phase-slip junction.

Figure 42:
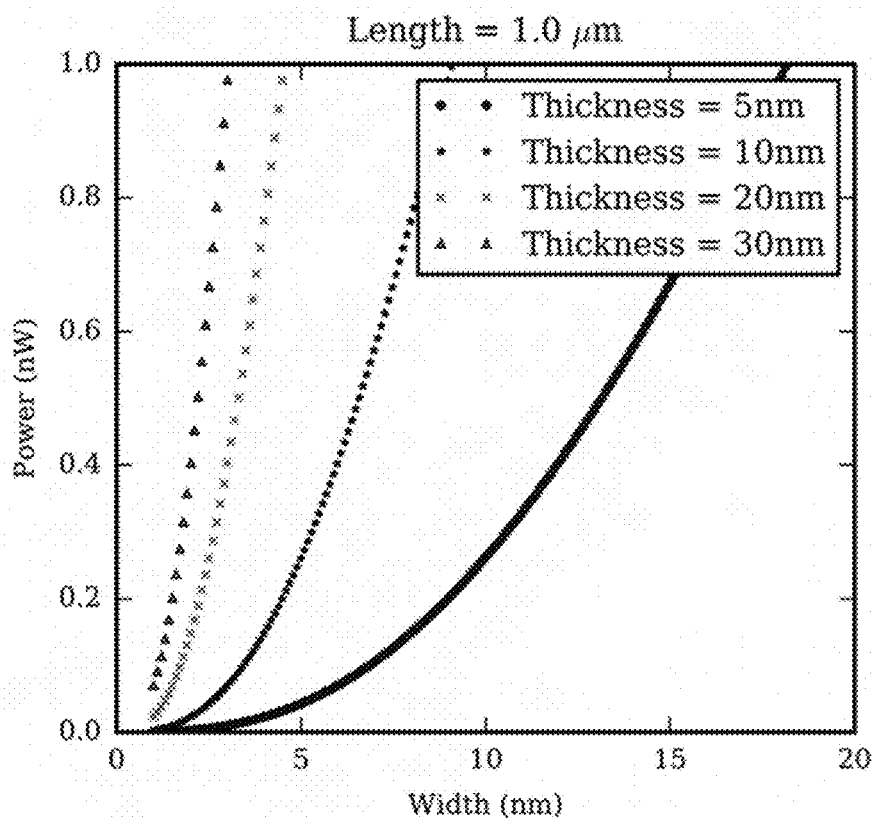
FIG. 42 shows power dissipated per switching event in an InOx QPSJ for a nano-wire of length 1 μm according to one embodiment of the present invention.
Figure 43:
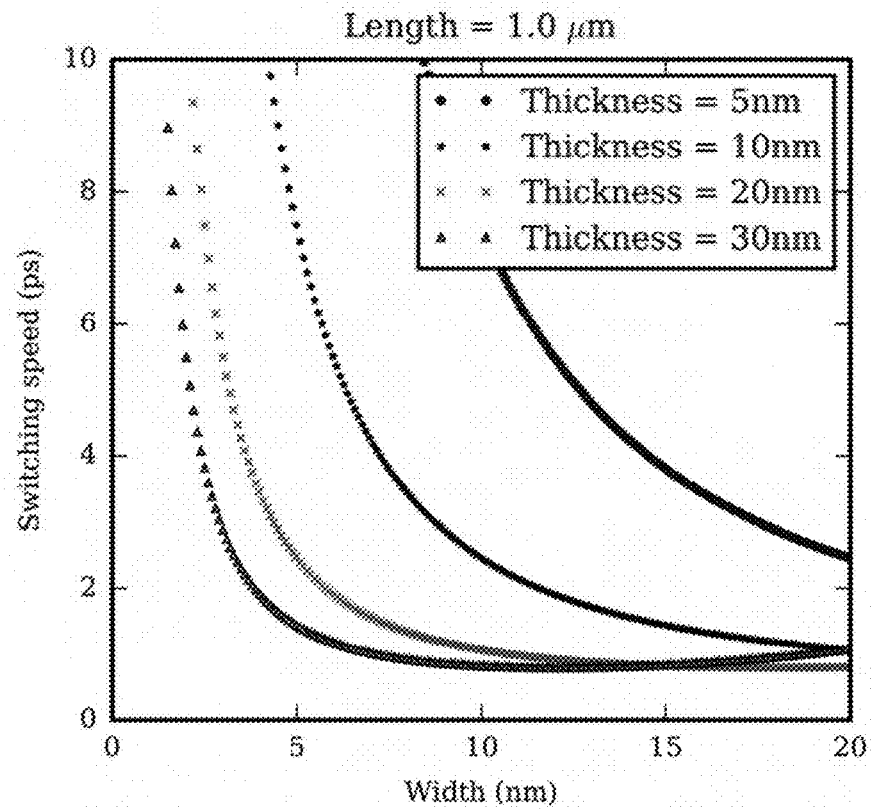
FIG. 43 shows switching speed in an InOx QPSJ for a nano-wire of length 1 μm according to one embodiment of the present invention.
Figure 44:
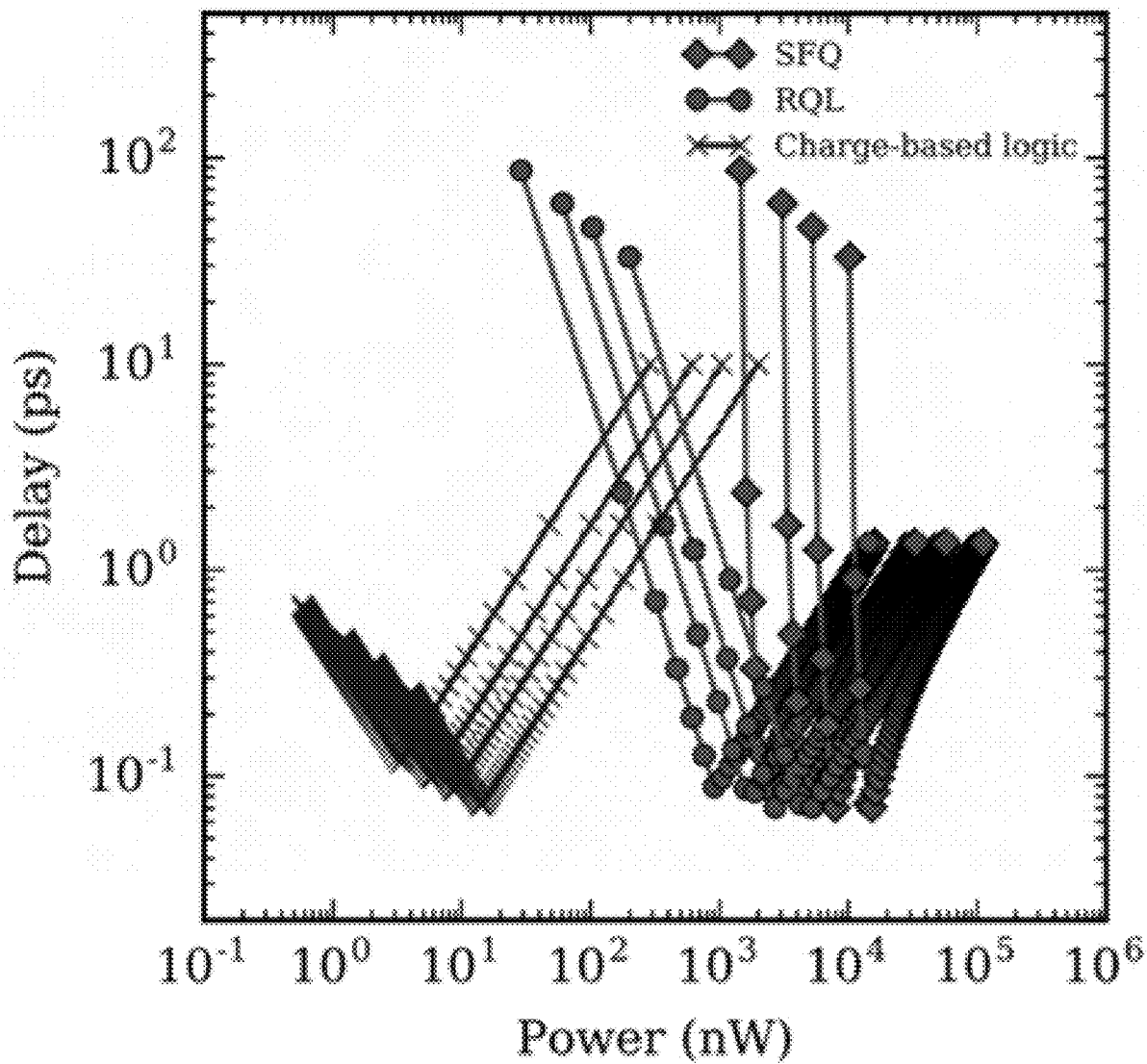
FIG. 44 shows power and switching delay comparison between QPSJ, single flux quantum and reciprocal quantum logic circuits according to one embodiment of the present invention.

In one embodiment, a superconducting switch having a superconducting island circuit as shown in FIG. 11(c) can be designed to consume less power per switching event and with similar switching speed compared to Josephson junction based logic circuits. The additional advantage of these circuits is essentially zero static power dissipation as the junctions is in a coulomb blockade condition when they are biased below the critical voltage. For a practical junction using InOx material, the power per switching event and switching speed for given dimensions of a nano-wire can be calculated using the phase-slip energy model developed by Mooij et al. [47]. Results from this analysis are shown in FIGS. 42 and 43. A plot of power and delay of QPSJ based logic compared with that for SFQ logic and reciprocal quantum logic (RQL) families is provided in FIG. 44, showing that QPSJ-based logic may exhibit competitive power-delay properties.

In certain embodiments, a logic element using QPSJs is introduced to form a superconducting island, which is a dual to a loop in SFQ circuits, to perform quantized charge based logic. It is also shown, through simulation, that it is possible to design and control the switching configuration of the devices, which can enable the design of basic logic circuits. Potential advantages of using this logic family include reduced power consumption and fast switching speed, along with essentially zero static power dissipation. Estimates of power dissipation and switching speed for a circuit that can be practically implemented are provided.

Parameter Margin Analysis of Charge-Based Logic Circuits

Quantum phase-slip junctions, because of their extremely small junction dimensions and parameters values like critical voltage, kinetic capacitance and voltage bias required for each island, can pose a challenge in circuit design if the parameter margins are small. Hence, worst case analysis of parameters of an island and a series of islands as that of a QPSJ transmission line has been performed to determine the feasibility of practical implementation charge-based logic circuits that are presented here. The margins are found to be up to 30% on parameters like normal resistance of the junction, kinetic capacitance and the series damping resistance, but only 10% on inductance and bias voltage. In several cases, adjusting the bias voltage is sufficient to make the circuit function as expected. The parameter margins depend on the circuit design and can vary, but in principle, the charge-based logic circuits can be designed have similar parameter margins as RSFQ based circuits. All the circuits that are presented here have junction sizes and switching parameters in common, and therefore are therefore expected to have parameter margins of up to 30% on all their parameters except bias voltage and inductance of nano-wire.

Advantages of Charge-Based Logic Over RSFQ

As disclosed in the logic circuits discussed so far, QPSJ based logic is very similar to RSFQ logic, with the relation coming from flux-charge duality. This logic is implemented using voltage bias in place of current biases as in RSFQ, therefore eliminating the need to supply bias currents and thus significantly reducing the circuit complexity. This may also reduce static power consumption as current bias is eliminated. Furthermore, this logic family is compatible with RSFQ logic giving possibilities to combine both charge-based and flux-based operation in a single circuit. Further advantages of the QPSJ based logic include, but are not limited to, essentially zero static power dissipation, simplicity of fabrication (e.g., nano-wire of a single layer), possible to design circuits dissipating lower energy compared to superconducting flux quantum based circuits without compromising on speed of operation.

QPSJs, the dual devices to JJs, are established as the basic logic devices to implement single-quantized charge-based logic family. A SPICE model and other essential tools are developed to demonstrate basic logic elements. Most of the building block elements are designed with the basis of charge on an island formed by QPSJs, and discussed using SPICE simulations. These existing blocks can be combined and the idea can be further extended to form other complicated logic blocks to completely establish superconducting charge-based logic.

The example simulations shown using a resistive and inductive series junction (RLSJ) based lumped element SPICE model of a quantum phase-slip junction in representative circuits verify the implementation and basic functionality of the model. This allows us to explore possible applications of superconducting electronic circuits based on QPSJs. Furthermore, this model and simulation capability opens avenues to explore hybrid circuits with both JJs and QPSJs and may also be used to explore possible methods to experimentally test quantum phase-slip junctions.

Complementary Quantum Logic (CQL)

Complementary quantum logic involves combination of JJ-based single-flux-quantum and QPSJ-based charge-based logic families. Therefore, the basic logic elements include the charge-island and a current loop producing quantized flux developed using JJs, as shown in FIG. 11. The logic operations in this family are performed by manipulation of both quantized flux and charge characterized by constant-area voltage pulse and constant-area current pulse respectively. In addition to individual logic operations, the use of these logic elements as bridges between single-flux-quantum logic family and charge-based logic family are also disclosed according to embodiments of the invention.

Figure 46:
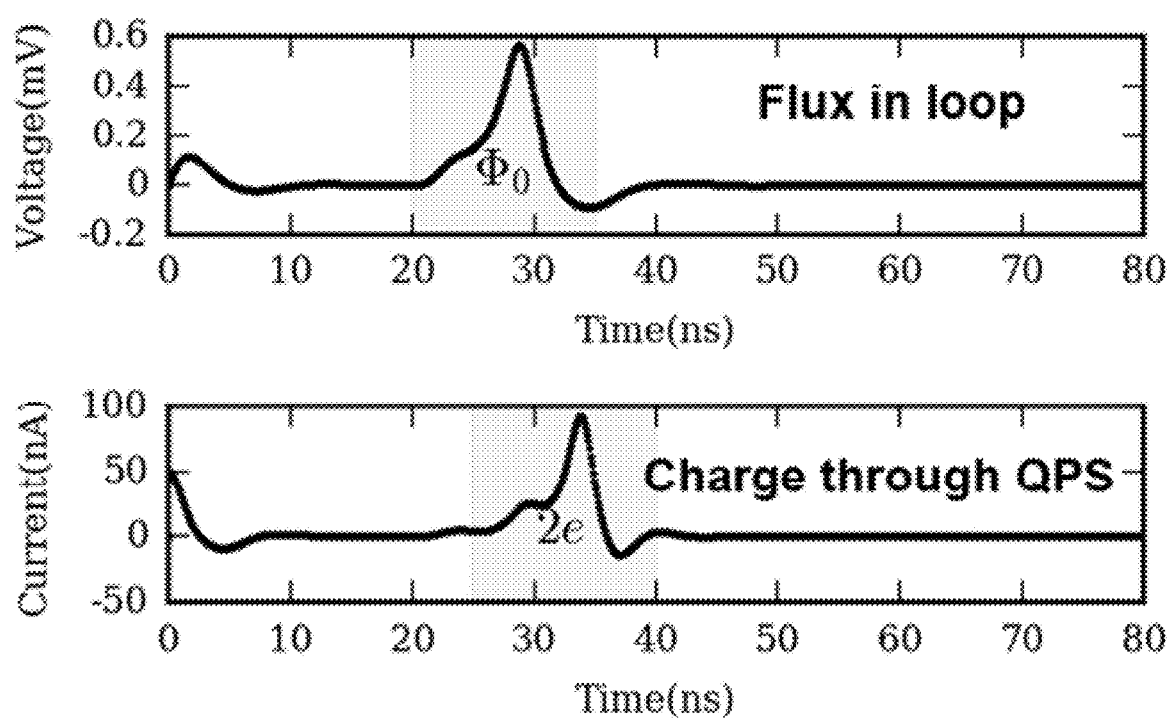
FIG. 46 shows simulation of the circuit shown in FIG. 45 demonstrating flux-charge conversion according to one embodiment of the present invention.

In certain embodiments, the logic circuit including the JJ-loop and QPSJ-island is shown in FIG. 45, which demonstrates the bridge operation between flux and charge. The simulation showing flux to charge conversion is shown in FIG. 46.

Figure 48:
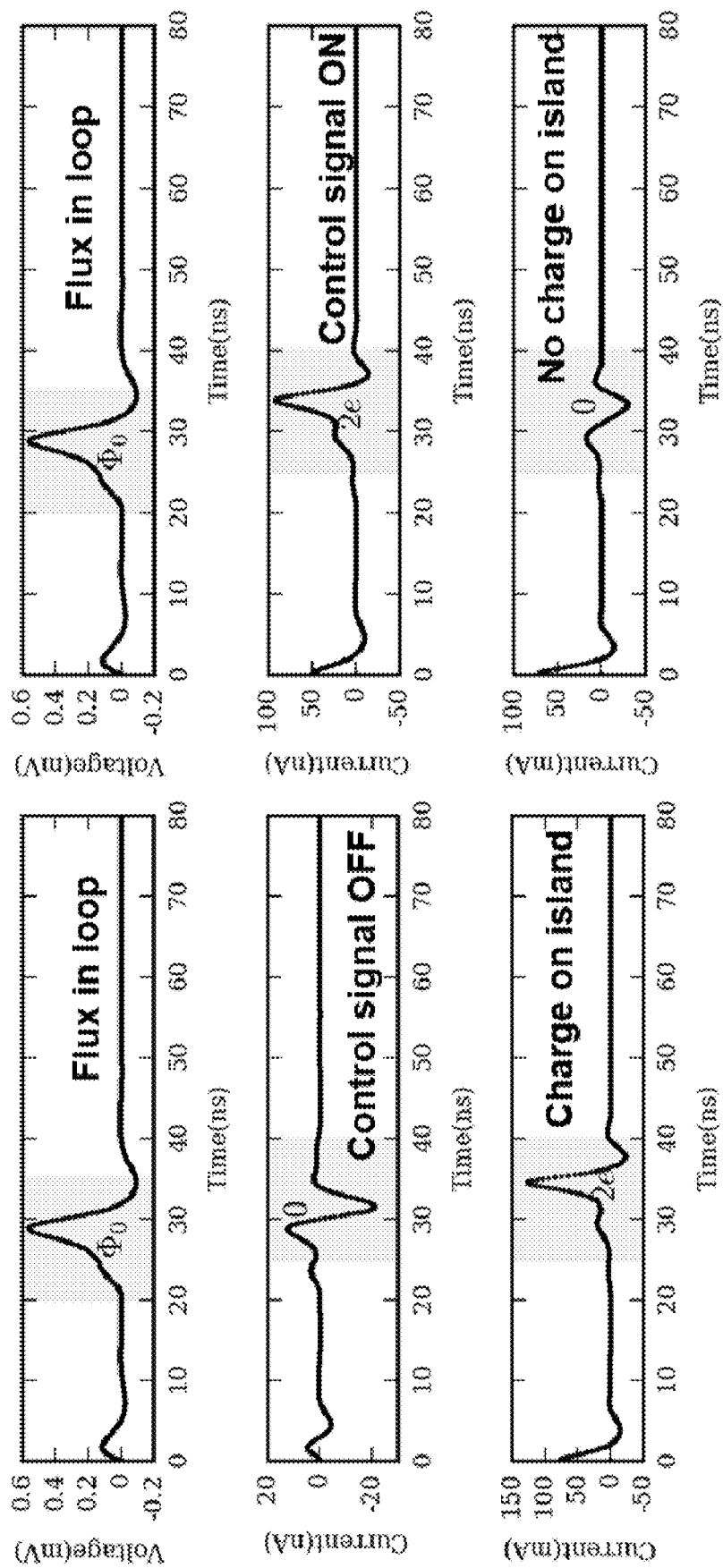
FIG. 48 shows output signal generation enabled by control signal at the control/buffer circuit shown in FIG. 47 according to one embodiment of the present invention.

In certain embodiments, the logic operation is implemented with the addition of a control/buffer element made of QPSJ to the flux-charge conversion circuit shown in FIG. 45. A voltage pulse is induced through this control element that enables or disables the output pulse, i.e., the voltage pulse (flux) at the input JJ loop gets converted to charge island at the output, contingent up on the control signal at the second QPSJ essentially behaving as a switch. This operation requires proper tuning of QPSJ parameters and capacitance values in the circuits. The control/buffer circuit is shown in FIG. 47. The simulation results are shown in FIG. 48.

The logic implementation schemes according to embodiments of the invention have significant advantages compared to JJ-based single-flux-quantum logic (SFQ) and reciprocal quantum logic (RQL). One of the main advantages includes use of voltage bias as opposed to current bias in JJ-based circuits. This makes considerably less complex circuit design and integration possible. In addition to this, since QPSJ acts as an insulator, due to phase-slip, there is no current when there are no logic pulses leading to zero-static power dissipation. The dynamic power dissipation is orders of magnitude smaller compared to JJ-based logic. The power-delay comparison for charge-based logic, single-flux-quantum logic (SFQ) and reciprocal quantum logic (RQL) is shown in compared in the FIG. 44. These calculations are based on practically implementable junctions and circuits. For QPSJ, the junction parameters are calculated for well-designed junctions based on a theoretical model recently reported for phase-slip energy calculation. For Hs, popular JJ/SFQ fabrication technology parameters are considered for this calculation. As shown in FIG. 44, the power consumption can be two orders of magnitude lower with comparable switching speeds. No comparison to CMOS based logic is made as the CMOS logic will have several orders of magnitude higher power consumption along with orders of magnitude slower switching speeds.

Using the same theoretical model of phase-slip energies used for above calculation, predictions are made to facilitate practical implementation of QPSJ and charge-based logic, along with CQL, of material and design parameters of the nano-wire. An example calculation is shown in FIG. 5, but several materials and design parameters (physical dimensions of the nano-wire) are considered and several calculations are made. 'InOx' is predicted to the suitable material for higher probability of phase-slips with shaded region in the FIG. 5 indicating region for highest probability of phase-slip events, where physical dimensions of nano-wire versus a parameter with shaded region indicating highest probability of phase-slips for InOx material.

The foregoing description of the exemplary embodiments of the present invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

LISTING OF REFERENCES

[1] John M Rowell, Cryogenic supercurrent tunneling devices, Oct. 25, 1966, U.S. Pat. No. 3,281,609.

[2] J Matisoo, Subnanosecond pair-tunneling to single-particle tunneling transitions in josephson junctions, *Applied Physics Letters*, 9(4): 167-168, 1966.

[3] Wilhelm Anacker, Potential of superconductive josephson tunneling technology for ultrahigh performance memories and processors, *IEEE Transactions on Magnetics*, 5(4):968-975, 1969.

[4] H Zappe, Josephson quantum interference computer devices, *IEEE Transactions on Magnetics*, 13(1):41-47, 1977.

[5] Konstantin K Likharev and Vasilii K Semenov, Rsfq logic/memory family: A new josephson-junction technology for sub-terahertz-clock-frequency digital systems, *Applied Superconductivity, IEEE Transactions on*, 1(1): 3-28, 1991.

[6] Shinya Hasuo and Takeshi Imamura, Digital logic circuits, *Proceedings of the IEEE*, 77(8):1177-1193, 1989.

[7] Willem J Perold, Mark Jeffery, Zuoqin Wang, and T Van Duzer, Complementary output switching logic-a new superconducting voltage-state logic family, *IEEE transactions on applied superconductivity*, 6(3):125-131, 1996.

[8] K K Likharev, O A Mukhanov, and V K Semenov, Resistive single flux quantum logic for the josephson-junction digital technology, *SQUID '85*, pages 1103-1108, 1985.

[9] V Koshelets, K Likharev, V Migulin, O Mukhanov, G Ovsyannikov, V Semenov, I Serpuchenko, and A Vystavkin, Experimental realization of a resistive single flux quantum logic circuit, *IEEE Transactions on Magnetics*, 23(2):755-758, 1987.

[10] O Mukhanov, V Semenov, and K Likharev, Ultimate performance of the rsfq logic circuits, *IEEE Transactions on Magnetics*, 23(2):759-762, 1987.

[11] V K Kaplunenko, M I Khabipov, V P Koshelets, K K Likharev, O A Mukhanov, V K Semenov, I L Serpuchenko, and A N Vystavkin, Experimental study of the rsfq logic elements, *IEEE Transactions on Magnetics*, 25(2):861-864, 1989.

[12] S V Polonsky, V K Semenov, P I Bunyk, A F Kirichenko, A Yu Kidiyarov-Shevchenko, O A Mukhanov, P N Shevchenko, D F Schneider, D Yu Zinoviev, and K K Likharev, New rsfq circuits (josephson junction digital devices), *IEEE transactions on applied superconductivity*, 3(1):2566-2577, 1993.

[13] W Chen, A V Rylyakov, Vijay Patel, J E Lukens, and K K Likharev, Rapid single flux quantum t-flip flop operating up to 770 ghz, *IEEE Transactions on Applied Superconductivity*, 9(2):3212-3215, 1999.

[14] W Chen, A V Rylyakov, Vijay Patel, J E Lukens, and K K Likharev, Superconductor digital frequency divider operating up to 750 ghz, *Applied physics letters*, 73(19): 2817-2819, 1998.

[15] Oleg A Mukhanov, Energy-efficient single flux quantum technology, *IEEE Transactions on Applied Superconductivity*, 21(3):760-769, 2011.

[16] Mark Hans Volkmann, Anubhav Sahu, Coenrad Johan Fourie, and Oleg A Mukhanov, Implementation of energy efficient single flux quantum digital circuits with sub-aj/bit operation, *Superconductor Science and Technology*, 26(1):015002, 2012.

[17] Masamitsu Tanaka, Masato Ito, Atsushi Kitayama, Tomohito Kouketsu, and Akira Fujimaki, 18-ghz, 4.0-aj/bit operation of ultra-low-energy rapid single-flux-quantum shift registers, *Japanese Journal of Applied Physics*, 51(5R):053102, 2012.

[18] Masamitsu Tanaka, Atsushi Kitayama, Tomohito Koketsu, Masato Ito, and Akira Fujimaki, Low-energy

[18] ...consumption rsfq circuits driven by low voltages, *IEEE Transactions on Applied Superconductivity*, 23(3):1701104-1701104, 2013.

[19] D E Kirichenko, Saad Sarwana, and A F Kirichenko, Zero static power dissipation biasing of rsfq circuits, *IEEE Transactions on Applied Superconductivity*, 21(3):776-779, 2011.

[20] Quentin P Herr, Anna Y Herr, Oliver T Oberg, and Alexander G Ioannidis, Ultra-low-power superconductor logic, *Journal of applied physics*, 109(10):103903, 2011.

[21] Oliver Timothy Oberg, Superconducting logic circuits operating with reciprocal magnetic flux quanta, 2011.

[22] Naoki Takeuchi, Dan Ozawa, Yuki Yamanashi, and Nobuyuki Yoshikawa, An adiabatic quantum flux parametron as an ultra-low-power logic device, *Superconductor Science and Technology*, 26(3):035010, 2013.

[23] Naoki Takeuchi, Yuki Yamanashi, and Nobuyuki Yoshikawa, Energy efficiency of adiabatic superconductor logic, *Superconductor Science and Technology*, 28(1):015003, 2014.

[24] Andrew J Kerman, Flux-charge duality and topological quantum phase fluctuations in quasi-one-dimensional superconductors, *New Journal of Physics*, 15(10):105017, 2013.

[25] J E Mooij and Yu V Nazarov, Superconducting nanowires as quantum phase-slip junctions, *Nature Physics*, 2(3):169-172, 2006.

[26] A M Hriscu and Yu V Nazarov, Coulomb blockade due to quantum phase slips illustrated with devices, *Physical Review B*, 83(17):174511, 2011.

[27] N Giordano, Evidence for macroscopic quantum tunneling in one-dimensional superconductors, *Physical review letters*, 61(18):2137, 1988.

[28] A Bezryadin, C N Lau, and M Tinkham, Quantum suppression of superconductivity in ultrathin nanowires, *Nature*, 404(6781):971-974, 2000.

[29] Konstantin Yu Arutyunov, Terhi T Hongisto, Janne S Lehtinen, Leena I Leino, and Alexander L Vasiliev, Quantum phase slip phenomenon in ultra-narrow superconducting nanorings, *Scientific reports*, 2, 2012.

[30] Uday S Goteti and Michael C Hamilton, Spice model implementation of quantum phase-slip junctions, *Electronics Letters*, 51(13):979-981, 2015.

[31] Alwyn C Scott, Flora Y F Chu, and Stanley A Reible, Magnetic-flux propagation on a josephson transmission line, *Journal of Applied Physics*, 47(7):3272-3286, 1976.

[32] V K Kaplunenko, Fluxon interaction in an overdamped josephson transmission line, *Applied physics letters*, 66(24):3365-3367, 1995.

[33] Azusa Matsuda and T Kawakami, Fluxon propagation on a josephson transmission line, *Physical Review Letters*, 51(8):694, 1983.

[34] S V Polonsky, V K Semenov, and D F Schneider, Transmission of single-flux-quantum pulses along superconducting microstrip lines, *IEEE transactions on applied superconductivity*, 3(1):2598-2600, 1993.

[35] K K Likharev, N S Bakhvalov, G S Kazacha, and S I Serdyukova, Single-electron tunnel junction array: an electrostatic analog of the josephson transmission line, *IEEE Transactions on Magnetics*, 25(2):1436-1439, 1989.

[36] Hideo Suzuki, Shuichi Nagasawa, Haruhiro Hasegawa, Tatsunori Hashimoto, Kazunori Miyahara, and Youichi Enomoto, High frequency operation of jtl ring oscillator with a passive transmission line, *IEEE transactions on applied superconductivity*, 11(1):1082-1085, 2001.

[37] Bezryadin, Alexey. "Quantum suppression of superconductivity in nanowires." *Journal of Physics: Condensed Matter* 20.4 (2008): 043202.

[38] Lau, Chun Ning, et al. "Quantum phase slips in superconducting nanowires." *Physical review letters* 87.21 (2001): 217003.

[39] Brenner, Matthew W., et al. "Dynamics of superconducting nanowires shunted with an external resistor." *Physical Review B* 85.22 (2012): 224507.

[40] Lehtinen, J. S., et al. "Evidence of quantum phase slip effect in titanium nanowires." *Physical Review B* 85.9 (2012): 094508.

[41] Hongisto, T. T., and A. B. Zorin. "Single-charge transistor based on the charge-phase duality of a superconducting nanowire circuit." *Physical review letters* 108.9 (2012): 097001.

[42] Astafiev, O. V., et al. "Coherent quantum phase slip." *Nature* 484.7394 (2012): 355-358.

[43] Mooij, J. E., and C. J. P. M. Harmans. "Phase-slip flux qubits." *New Journal of Physics* 7.1 (2005): 219.

[44] Webster, C. H., et al. "NbSi nanowire quantum phase-slip circuits: dc supercurrent blockade, microwave measurements, and thermal analysis." *Physical Review B* 87.14 (2013): 144510.

[45] K. Y. Arutyunov, D. S. Golubev, and A. D. Zaikin. Superconductivity in one dimension. *Physics Reports*, 464(1):1-70, 2008.

[46] Chung-Wen Ho, Albert E Ruehli, and Pierce A Brennan. The modified nodal approach to network analysis. *Circuits and Systems, IEEE Transactions on*, 22(6):504-509, 1975.

[47] J E Mooij, Gerd Schön, Alexander Shnirman, Tomoko Fuse, C J P M Harmans, H Rotzinger, and A H Verbruggen. Superconductor-insulator transition in nanowires and nanowire arrays. *New Journal of Physics*, 17(3):033006, 2015.

[48] J T Peltonen, O V Astafiev, Yu P Korneeva, B M Voronov, A A Korneev, I M Charaev, A V Semenov, G N Golt'sman, L B Ioffe, T M Klapwijk, et al. Coherent flux tunneling through nbn nanowires. *Physical Review B*, 88(22):220506, 2013.

What is claimed is:

1. A superconducting logic cell, comprising one or more Josephson junctions (JJs) and one or more quantum phase slip junctions (QPSJs) coupled to each other to define a circuit that operably performs one or more logic operations, wherein one or more of the one or more QPSJs have an input voltage above its critical voltage.

2. The superconducting logic cell of claim 1, wherein the one or more QPSJs forms a QPSJ transmission line, wherein the one or more QPSJs comprise a plurality of QPSJs connected to one another in series, wherein each node connecting two adjacent QPSJs and a capacitor defines a charge island.

3. The superconducting logic cell of claim 2, wherein the quantized charge of the Cooper electron pair is stored in a charge island or forced to hop to its immediately next charge island, by design of or tuning a capacitance of the charge island, along with the junction parameters, thereby transferring the quantized charge of the Cooper electron pair along the QPSJ transmission line.

4. The superconducting logic cell of claim 2, wherein amplification or attenuation of the current pulse amplitude is obtained by using the QPSJs of different critical voltages and different capacitor values.

5. The superconducting logic cell of claim 1, wherein the one or more QPSJs forms a QPSJ pulse splitter, wherein the one or more QPSJs comprise three QPSJs, wherein
   the first QPSJ has a first terminal connected to an input voltage source defining an input node, and a second terminal connected to a first capacitor;
   the second QPSJ has a first terminal connected to the second terminal of the first QPSJ, and a second terminal connected to a second capacitor and a first bias voltage source defining a first output node; and
   the third QPSJ has a first terminal connected to the second terminal of the first QPSJ, and a second terminal connected to a third capacitor and a second bias voltage source defining a second output node,
   wherein in operation, an input pulse at the input node is split into two pulses output from the first and second output nodes respectively.

6. The superconducting logic cell of claim 1, wherein the one or more QPSJs forms a QPSJ buffer, wherein the one or more QPSJs comprise three QPSJs, wherein
   the first QPSJ has a first terminal connected to an input voltage source or a first bias voltage source defining a first node, and a second terminal connected to a first capacitor defining a second node;
   the second QPSJ has a first terminal connected to the second terminal of the first QPSJ defining a third node, and a second terminal connected to a second capacitor and the first bias voltage source or the input voltage source defining a fourth node; and
   the third QPSJ has a first terminal connected to the third node, and a second terminal connected to a second bias voltage source,
   wherein in operation, an input pulse from the first node through the first QPSJ switches to the third QPSJ, before it switches to the second QPSJ so as to prevent a signal flow in a direction from the first node to the fourth node, or when current arrives from an opposite direction, the first QPSJ switches before the third QPSJ, allowing the signal through.

7. The superconducting logic cell of claim 1, wherein the one or more QPSJs forms a QPSJ confluence buffer, wherein the one or more QPSJs comprise four QPSJs, wherein
   the first QPSJ has a first terminal connected to a first input voltage source, and a second terminal connected to a first capacitor defining a first node;
   the second QPSJ has a first terminal connected to a second input voltage source, and a second terminal connected to a second capacitor defining a second node, wherein both the first and second nodes are connected to a third node;
   the third QPSJ has a first terminal connected to the third node, and a second terminal connected to a first bias voltage source; and
   the fourth QPSJ has a first terminal connected to the third node, and a second terminal connected to a third capacitor and the second bias voltage source at a fourth node,
   wherein in operation, input pulses from either the first or second input voltage sources result in an output pulse from the fourth node, but do not result in output from the other input.

8. The superconducting logic cell of claim 7, wherein the one or more QPSJs forms a QPSJ based OR gate, wherein the one or more QPSJs comprise six QPSJs, wherein the first to fourth QPSJs define the confluence buffer and the fifth and sixth QPSJs define an island, wherein the confluence buffer is connected to the island in series such that a first terminal of the fifth QPSJ is connected to the output terminal of the confluence buffer and a second terminal of the sixth QPSJ is connected to a clock signal of a third input voltage source that is connected to a second bias voltage source.

9. The superconducting logic cell of claim 7, wherein the one or more QPSJs forms a QPSJ based AND gate, wherein the one or more QPSJs comprise five QPSJs, wherein the first to fourth QPSJs define the confluence buffer and the fifth QPSJ has a first terminal connected to the output terminal of the confluence buffer and a second terminal connected to a second bias voltage source, and the output terminal of the confluence buffer is connected to a clock signal of a third input voltage source that is connected to a second bias voltage source.

10. The superconducting logic cell of claim 7, wherein the one or more QPSJs forms a QPSJ based XOR gate, wherein the one or more QPSJs comprise four QPSJs, wherein the first to fourth QPSJs define the confluence buffer and the output terminal of the confluence buffer is connected to a clock signal of a third input voltage source that is connected to a second bias voltage source.

11. The superconducting logic cell of claim 1, wherein the one or more QPSJs forms an RS flip-flop or a D flip-flop, wherein the one or more QPSJs comprise two QPSJs, wherein
   the first QPSJ has a first terminal connected to a bias voltage source at a first node that in turn is connected to a first input voltage source connected to a second node, a second terminal connected a third node 3 that in turn is connected to a capacitor; and
   the second QPSJ has a first terminal connected to the third node, and a second terminal connected to a fourth node that is in turn connected to the second input voltage source.

12. The superconducting logic cell of claim 11, wherein the one or more QPSJs forms the RS flip-flop, wherein in operation, a SET input signal at the second node induces a quantized charge of the Cooper electron pair to the island of the third node, and a RESET input signal at the fourth node induces a current pulse opposite to that induced by the SET input signal so as to reset the charge on the island.

13. The superconducting logic cell of claim 11, wherein the one or more QPSJs forms the D flip-flop, wherein in operation, a SET input signal at the second node induces a quantized charge of the Cooper electron pair to the island of the third node, and a RESET input signal at the fourth node is a clock signal that switches the first QPSJ and induces a quantized charge of the Cooper electron pair on the island, and with the next clock pulse, the charge flows through an output terminal to perform a function of the D flip-flop.

14. The superconducting logic cell of claim 1, wherein the one or more QPSJs forms a T flip-flop, wherein the one or more QPSJs comprise two QPSJs, wherein
   the first QPSJ has a first terminal connected to a bias voltage source at a first node that in turn is connected to an input voltage source at a second node, the input voltage source connected to a third node, a second terminal connected node 4 that in turn is connected to a capacitor; and
   the second QPSJ has a first terminal connected to a fourth node, and a second terminal connected to the second node,
   wherein in operation, a single clock signal of the input voltage source is input at the third, and at each clock pulse, the current pulse toggles from ON to OFF and vice versa, indicating the presence and absence of a quantized charge of the Cooper electron pair on the island with each clock pulse.

15. The superconducting logic cell of claim 1, wherein the one or more QPSJs comprise two QPSJs defining a QPSJ island with a capacitor, and the one or more JJs comprises two JJs defining a JJ loop with a inductor, and the QPSJ island and the JJ loop is connected in series to perform a bridge operation between flux and charge.

16. The superconducting logic cell of claim 1, wherein the one or more QPSJs further comprises a third QPSJ having a first terminal connected to a node between the QPSJ island and the JJ loop, and a second terminal connected to a bias voltage source, wherein in operation, a voltage pulse is induced through the third QPSJ that enables or disables the output pulse.

17. The superconducting logic cell of claim 1, further comprising:
at least one complementary quantum logic (CQL) cell, each CQL cell comprising at least one QPSJ, and at least one JJ coupled with the at least one QPSJ to perform one or more logic operations.

18. The superconducting logic cell of claim 17, wherein the CQL cell comprises two QPSJs defining a QPSJ island with a capacitor, and two JJs defining a JJ loop with a inductor, and the QPSJ island and the JJ loop is connected in series to perform a bridge operation between flux and charge.

19. The superconducting logic cell of claim 18, wherein the CQL cell further comprises a third QPSJ having a first terminal connected to a node between the QPSJ island and the JJ loop, and a second terminal connected to a bias voltage source, wherein in operation, a voltage pulse is induced through the third QPSJ that enables or disables the output pulse.

20. A superconducting logic cell, comprising one or more Josephson junctions (JJs) and one or more quantum phase slip junctions (QPSJs) coupled to each other to define a circuit that operably performs one or more logic operations, wherein the one or more logic operations are performed by manipulation of both quantized flux and charge.

21. The superconducting logic cell of claim 20, wherein the quantized flux and charge are characterized by constant-area voltage pulse and constant-area current pulse, respectively.

22. The superconducting logic cell of claim 20, wherein the one or more QPSJs comprise two QPSJs defining a QPSJ island with a capacitor, and the one or more JJs comprises two JJs defining a JJ loop with a inductor, and the QPSJ island and the JJ loop is connected in series to perform a bridge operation between flux and charge.

23. The superconducting logic cell of claim 20, wherein the one or more QPSJs further comprises a third QPSJ having a first terminal connected to a node between the QPSJ island and the JJ loop, and a second terminal connected to a bias voltage source, wherein in operation, a voltage pulse is induced through the third QPSJ that enables or disables the output pulse.

24. The superconducting logic cell of claim 20, further comprising:
at least one complementary quantum logic (CQL) cell, each CQL cell comprising at least one QPSJ, and at least one JJ coupled with the at least one QPSJ to perform one or more logic operations.

25. A superconducting logic cell, comprising one or more Josephson junctions (JJs) and one or more quantum phase slip junctions (QPSJs) coupled to each other to define a circuit that operably performs one or more logic operations, wherein the one or more JJs and the one or more QPSJs are used as bridges between single-flux-quantum logic and charge-based logic.

26. The superconducting logic cell of claim 25, wherein the one or more JJs and one or more QPSJs perform a bridge operation between flux and charge, wherein the bridge operation is flux-charge conversion.

* * * * *